United States Patent
Kim et al.

(10) Patent No.: US 11,547,002 B2
(45) Date of Patent: Jan. 3, 2023

(54) DISPLAY DEVICE

(71) Applicant: LG ELECTRONICS INC., Seoul (KR)

(72) Inventors: Hoyoung Kim, Seoul (KR); Kyeongdong Kim, Seoul (KR); Jaeyong Kim, Seoul (KR); Jonggil Pyo, Seoul (KR); Changwan Noh, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 130 days.

(21) Appl. No.: 16/872,197

(22) Filed: May 11, 2020

(65) Prior Publication Data

US 2021/0352809 A1 Nov. 11, 2021
US 2022/0386480 A9 Dec. 1, 2022

Related U.S. Application Data

(63) Continuation of application No. 16/042,991, filed on Jul. 23, 2018, now Pat. No. 10,687,428.

(30) Foreign Application Priority Data

Nov. 13, 2017 (KR) ........................ 10-2017-0150661

(51) Int. Cl.
*H05K 5/00* (2006.01)
*H05K 5/02* (2006.01)
(Continued)

(52) U.S. Cl.
CPC ......... *H05K 5/0017* (2013.01); *G06F 1/1652* (2013.01); *H01L 27/3244* (2013.01);
(Continued)

(58) Field of Classification Search
CPC  H05K 5/0017; H05K 5/0217; H01L 27/3244; H01L 51/0097; H01L 51/5237; H01L 2251/5338; H02K 7/06; F16H 25/20
See application file for complete search history.

(56) References Cited

U.S. PATENT DOCUMENTS 1,915,944 A   6/1933  Hugo
5,887,959 A   3/1999  Yuri
(Continued)

FOREIGN PATENT DOCUMENTS

CN   102272815   12/2011
CN   103423564   12/2013
(Continued)

OTHER PUBLICATIONS

The State Intellectual Property Office of the People's Republic of China Application Serial No. 201880072897.5, Office Action dated Jun. 16, 2021, 10 pages.

(Continued)

*Primary Examiner* — Abhishek M Rathod
(74) *Attorney, Agent, or Firm* — Lee, Hong, Degerman, Kang & Waimey PC

(57) ABSTRACT

A display device is disclosed. The display device includes a housing, a roller installed inside the housing, a first bar positioned on an upper side of the roller to be opposite to the roller, a link connected to the first bar and the housing and lifting the first bar, a second bar positioned opposite the first bar and fastened to the first bar, a plate including a first part wound or unwound from the roller and a second part extended rearward from the first part and fixed between the first bar and the second bar, and a display panel provided in the first part of the plate.

18 Claims, 60 Drawing Sheets

(51) Int. Cl.
    *G06F 1/16*     (2006.01)
    *H01L 27/32*     (2006.01)
    *H01L 51/00*     (2006.01)
    *H02K 7/06*     (2006.01)
    *H01L 51/52*     (2006.01)
    *F16H 25/20*     (2006.01)

(52) U.S. Cl.
    CPC ...... *H01L 51/0097* (2013.01); *H01L 51/5237* (2013.01); *H02K 7/06* (2013.01); *H05K 5/0217* (2013.01); *F16H 25/20* (2013.01); *H01L 2251/5338* (2013.01)

(56) References Cited

U.S. PATENT DOCUMENTS

| | | | |
|---|---|---|---|
| 9,098,241 B1 | 8/2015 | Cho et al. | |
| 9,123,290 B1 | 9/2015 | Cho et al. | |
| 9,335,620 B1 | 5/2016 | Lu | |
| 2007/0153379 A1 | 7/2007 | Mikkelsen et al. | |
| 2012/0162760 A1 | 6/2012 | Chen | |
| 2012/0314284 A1 | 12/2012 | Howes et al. | |
| 2014/0126227 A1 | 5/2014 | Yoon et al. | |
| 2014/0197727 A1 | 7/2014 | Qin | |
| 2014/0240906 A1 | 8/2014 | Seo et al. | |
| 2015/0002398 A1 | 1/2015 | Nakhimov | |
| 2015/0373857 A1 | 12/2015 | Chikazawa | |
| 2016/0066440 A1 | 3/2016 | Choi et al. | |
| 2016/0374228 A1 | 12/2016 | Park et al. | |
| 2017/0010499 A1* | 1/2017 | Kang | G09F 9/00 |
| 2017/0013726 A1 | 1/2017 | Han et al. | |
| 2017/0023978 A1 | 1/2017 | Cho et al. | |
| 2017/0156219 A1* | 6/2017 | Heo | H01L 51/0097 |
| 2017/0156220 A1 | 6/2017 | Heo et al. | |
| 2017/0161868 A1 | 6/2017 | Kim et al. | |
| 2017/0318689 A1 | 11/2017 | Kim et al. | |
| 2017/0325343 A1 | 11/2017 | Seo et al. | |
| 2017/0347466 A1 | 11/2017 | Kang et al. | |
| 2019/0150300 A1 | 5/2019 | Kim et al. | |

FOREIGN PATENT DOCUMENTS

| | | |
|---|---|---|
| CN | 205881905 | 1/2017 |
| CN | 106601129 | 4/2017 |
| CN | 106816094 | 6/2017 |
| CN | 107221254 | 9/2017 |
| JP | H0651403 | 2/1994 |
| JP | 2004205913 | 7/2004 |
| JP | 2008157996 | 7/2008 |
| KR | 20150065415 | 6/2015 |
| KR | 20160047651 | 5/2016 |
| KR | 20170123382 | 11/2017 |

OTHER PUBLICATIONS

European Patent Office Application Serial No. 18876544.0, Search Report dated Jul. 23, 2021, 7 pages.
PCT International Application No. PCT/KR2018/009266, International Search Report dated Dec. 11, 2018, 3 pages.
United States Patent and Trademark Office U.S. Appl. No. 16/042,991, Office Action dated Oct. 9, 2019, 16 pages.
Korean Intellectual Property Office Application Serial No. 10-2017-0150661, Office Action dated Nov. 26, 2021, 6 pages.
Korean Intellectual Property Office Application No. 10-2017-0150661, Notice of Allowance dated Oct. 26, 2022, 2 pages.

* cited by examiner

DISPLAY DEVICE

CROSS-REFERENCE TO RELATED APPLICATIONS

This application is a continuation of U.S. patent application Ser. No. 16/042,991 filed on Jul. 23, 2018, which claims the benefit of earlier filing date and right of priority to Korean Patent Application No. 10-2017-0150661, filed on Nov. 13, 2017, the contents of which are hereby incorporated by reference herein in its entirety.

BACKGROUND OF THE INVENTION

Field of the Invention

The present disclosure relates to a display device.

Discussion of the Related Art

With the development of the information society, various demands for display devices are increasing. Various display devices, such as liquid crystal displays (LCDs), plasma display panels (PDPs), electroluminescent displays (ELDs), and vacuum fluorescent displays (VFDs), have been recently studied and used in response to the various demands for the display devices.

A display device using an organic light emitting diode (OLED) is advantageous in that it has better luminance characteristic and viewing angle characteristic than a liquid crystal display, and has a ultra-thin profile because it does not require a backlight unit unlike the liquid crystal display.

A flexible display can be bent or wound around a roller. A display device wound or unwound from the roller using the flexible display can be implemented, if necessary or desired. In this instance, it is problem to stably wind or unwind the flexible display from the roller.

SUMMARY OF THE INVENTION

In one aspect of the present disclosure, there is provided a display device comprising a housing, a roller installed inside the housing, a first bar positioned on an upper side of the roller to be opposite to the roller, a link connected to the first bar and the housing and lifting the first bar, a second bar positioned opposite the first bar and fastened to the first bar, a plate including a first part wound or unwound from the roller and a second part extended rearward from the first part and fixed between the first bar and the second bar, and a display panel provided in the first part of the plate.

The display device may further comprise a screw penetrating the first bar and the second part and fastened to the second bar.

The display device may further comprise a gasket between the first bar and the second bar.

The first bar may include a horizontal portion positioned opposite the second part, and a vertical portion extended downward from horizontal portion and supporting the first part. The vertical portion may be pivotally connected to the link.

The display device may further comprise a link bracket facing the vertical portion. The vertical portion may include a first coupling portion protruding rearward and a second coupling portion protruding rearward and spaced from the first coupling portion. The link may include a hole. The second coupling portion may be inserted into the hole. The link bracket may be fastened to the first coupling portion and the second coupling portion.

The display device may further comprise a ring bearing positioned in the hole. The second coupling portion may be inserted into the ring bearing.

The second bar may include a third part positioned on an upper side of the vertical portion to be opposite to the vertical portion, and a rear wall extended downward from a rear end of the third part and covering the second part and the horizontal portion.

The second bar may include a first front wall extended downward from a front end of the third part and covering the first part.

The second bar may include a second front wall extended downward from the first front wall. A thickness of the first front wall may be greater than a thickness of the second front wall. The second front wall may face the display panel.

The link may include a fourth part pivotally connected to the vertical portion and facing the vertical portion, and a fifth part extended from the fourth part and supporting the first part.

A thickness of the fifth part may be substantially equal to a sum of a thickness of the fourth part and a thickness of the vertical portion.

The screw may penetrate the horizontal portion and the second part and may be fastened to a third part.

The plate may further include a sixth part extended upward from the second part. The sixth part may be fixed between the first bar and the second bar.

The first bar may include a second horizontal portion opposite the second part, a second vertical portion extended upward from a rear end of the second horizontal portion, and a third vertical portion extended downward from a front end of the second horizontal portion and supporting the first part. The link may be pivotally connected to the third vertical portion. The sixth part may be fixed between the third vertical portion and the second bar.

The screw may penetrate the second vertical portion and the sixth part and may be fastened to the second bar.

The second bar may include a seventh part forming a curved surface, and an eighth part extended from a rear end of the seventh part along the first part. The second part may be extended along the seventh part and the eighth part.

The display panel may be extended along the seventh part and the eighth part.

The second bar may include a ninth part extended forward from a lower end of the eighth part, and a tenth part extended downward from a front end of the ninth part. The tenth part may face the first part of the plate. The second part may be extended along the ninth part and the tenth part. The first bar may be fastened to the tenth part. The second part may be fixed between the tenth part and the first bar.

The screw may penetrate the second part and the first bar and may be fastened to the tenth part.

The first bar may include an eleventh part fastened to the tenth part, and a twelfth part connected to the eleventh part and extended downward along the first part. The link may be pivotally connected to a front surface or a rear surface of the twelfth part.

BRIEF DESCRIPTION OF THE DRAWINGS

The accompanying drawings, that may be included to provide a further understanding of the disclosure and are incorporated in and constitute a part of this specification, illustrate embodiments of the disclosure and together with the description serve to explain various principles of the disclosure.

DETAILED DESCRIPTION OF THE EMBODIMENTS

Figure 1:
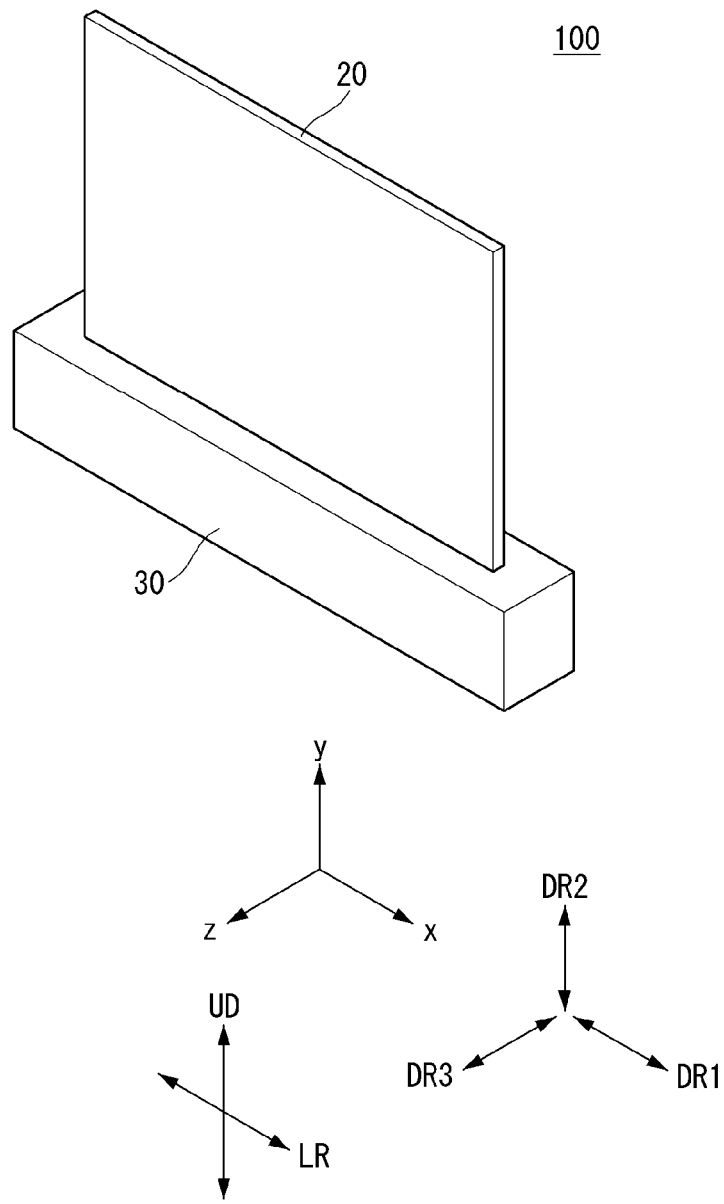
FIGS. 1 to 17 illustrate configuration of a display unit related to the present disclosure.

Reference will now be made in detail embodiments of the disclosure examples of which are illustrated in the accompanying drawings. Since the present disclosure may be modified in various ways and may have various forms, specific embodiments are illustrated in the drawings and are described in detail in the present specification. However, it should be understood that the present disclosure are not limited to specific disclosed embodiments, but include all modifications, equivalents and substitutes included within the spirit and technical scope of the present disclosure.

The terms 'first', 'second', etc. may be used to describe various components, but the components are not limited by such terms. The terms are used only for the purpose of distinguishing one component from other components. For example, a first component may be designated as a second component without departing from the scope of the present disclosure. In the same manner, the second component may be designated as the first component.

The term "and/or" encompasses both combinations of the plurality of related items disclosed and any item from among the plurality of related items disclosed.

When an arbitrary component is described as "being connected to" or "being linked to" another component, this should be understood to mean that still another component (s) may exist between them, although the arbitrary component may be directly connected to, or linked to, the second component. In contrast, when an arbitrary component is described as "being directly connected to" or "being directly linked to" another component, this should be understood to mean that no component exists between them.

The terms used in the present application are used to describe only specific embodiments or examples, and are not intended to limit the present disclosure. A singular expression can include a plural expression as long as it does not have an apparently different meaning in context.

In the present application, the terms "include" and "have" should be understood to be intended to designate that illustrated features, numbers, steps, operations, components, parts or combinations thereof exist and not to preclude the existence of one or more different features, numbers, steps, operations, components, parts or combinations thereof, or the possibility of the addition thereof.

Unless otherwise specified, all of the terms which are used herein, including the technical or scientific terms, have the same meanings as those that are generally understood by a person having ordinary knowledge in the art to which the present disclosure pertains. The terms defined in a generally used dictionary must be understood to have meanings identical to those used in the context of a related art, and are not to be construed to have ideal or excessively formal meanings unless they are obviously specified in the present application.

The following exemplary embodiments of the present disclosure are provided to those skilled in the art in order to describe the present disclosure more completely. Accordingly, shapes and sizes of elements shown in the drawings may be exaggerated for clarity.

In the following description, wherever possible, the same reference numbers will be used throughout the drawings to refer to the same or like parts, and duplicated description thereof will be omitted.

In the following description, if an embodiment is described with reference to a specific figure, reference numbers not shown in the specific figure may be mentioned, if necessary or desired. However, the reference numbers not shown in the specific figure may be mentioned only when the reference numbers are shown in other figures.

In general, a suffix such as "module" and "unit" may be used to refer to elements or components. Use of such a suffix herein is merely intended to facilitate description of the specification, and the suffix itself is not intended to give any special meaning or function.

It will be noted that a detailed description of known arts will be omitted if it is determined that the detailed description of the known arts can obscure embodiments of the disclosure.

Further, terms such as height, length, and width used in embodiments of the disclosure may be interchangeable for convenience of explanation. The terms do not have their meanings or roles that are distinguished from each other.

Referring to FIG. 1, a display device 100 may include a display unit 20 and a housing 30. The housing 30 may form an inner space. At least a portion of the display unit 20 may be positioned inside the housing 30. At least a portion of the display unit 20 may be positioned outside the housing 30. The display unit 20 may display a screen.

A direction parallel to a longitudinal direction of the housing 30 may be referred to as a first direction DR1, a +x-axis direction, a −x-axis direction, a left direction, or a right direction. A direction in which the display unit 20 displays the screen may be referred to as a +z-axis direction, a forward direction, or a front direction. An opposite direction of the direction in which the display unit 20 displays the screen may be referred to as a −z-axis direction, a rearward direction, or a rear direction. A third direction DR3 may be parallel to the +z-axis direction or the −z-axis direction. A direction parallel to a height direction of the display device 100 may be referred to as a second direction DR2, a +y-axis direction, a −y-axis direction, an upward direction, or a downward direction.

The third direction DR3 may be a direction perpendicular to the first direction DR1 and/or the second direction DR2.

The first direction DR1 and the second direction DR2 may be commonly referred to as a horizontal direction, and the third direction DR3 may be referred to as a vertical direction.

A left-to-right direction LR may be parallel to the first direction DR1, and an up-down direction UD may be parallel to the second direction DR2.

Figure 2:
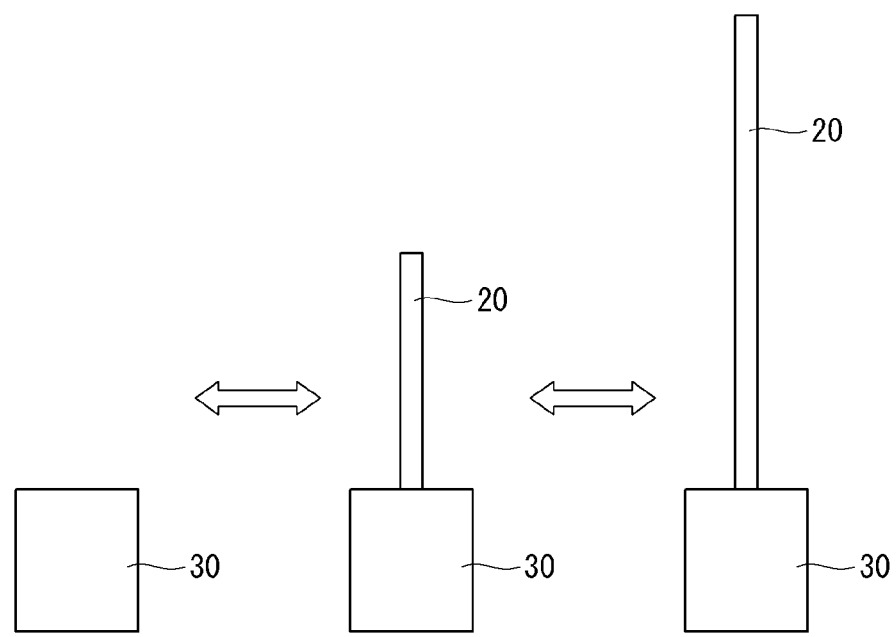

Referring to FIG. 2, an entire portion of the display unit 20 may be positioned inside the housing 30. At least a portion of the display unit 20 may be positioned outside the housing 30. A portion of the display unit 20 exposed to the outside of the housing 30 may be adjusted, if necessary.

Figure 3:
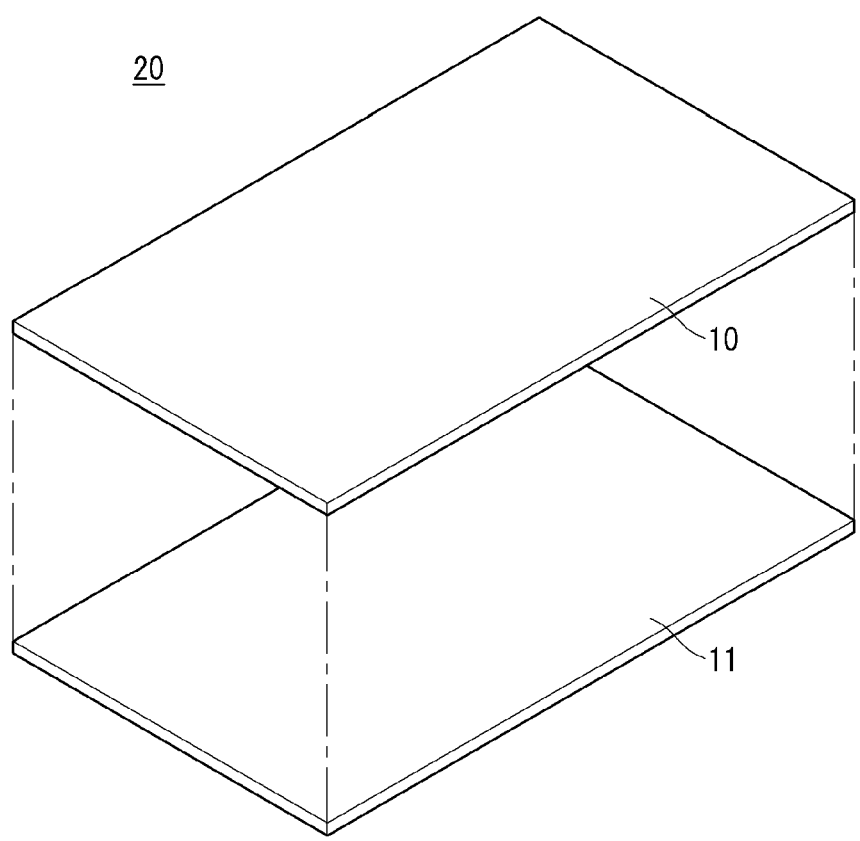
Figure 4:
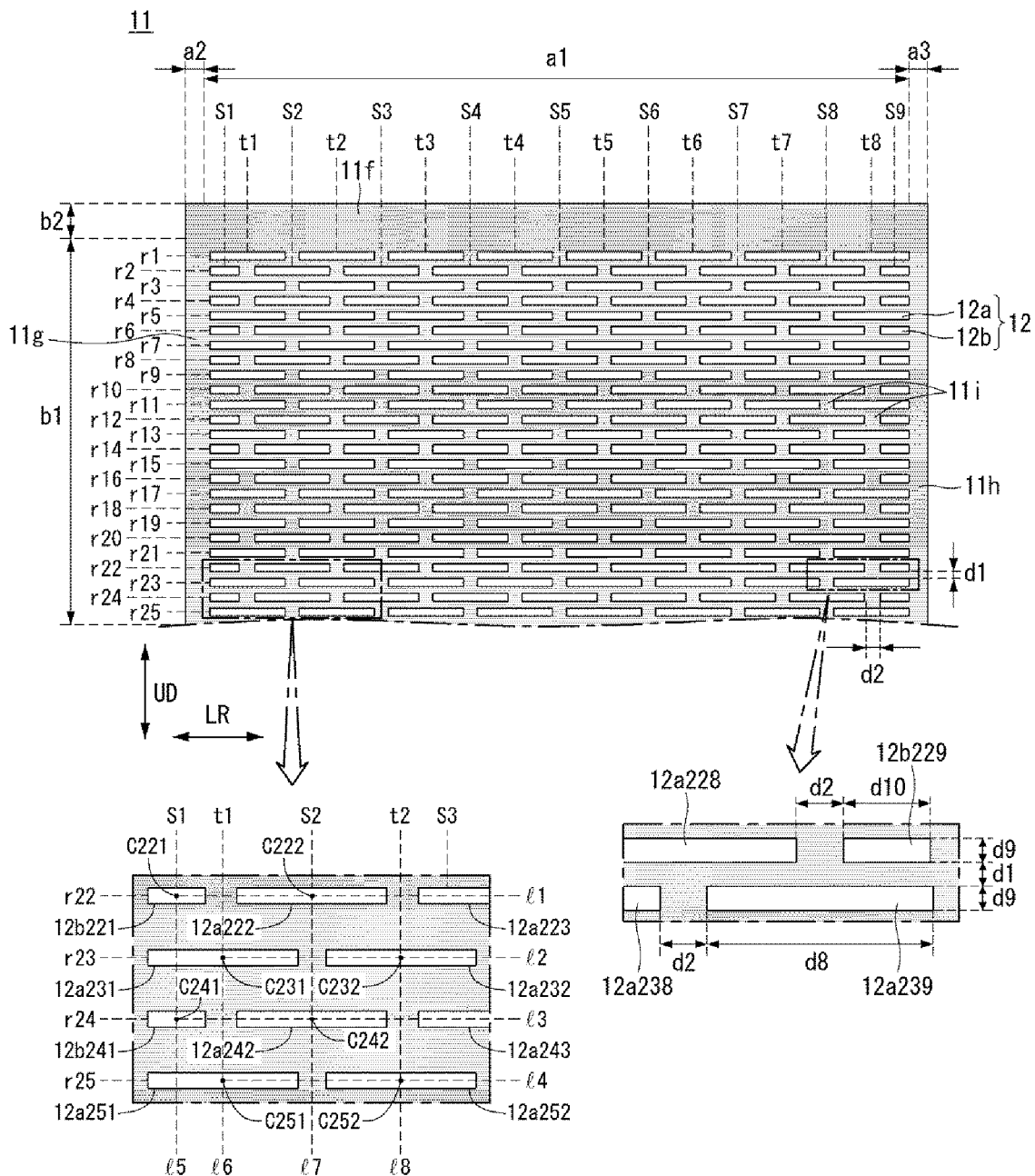
Figure 5:
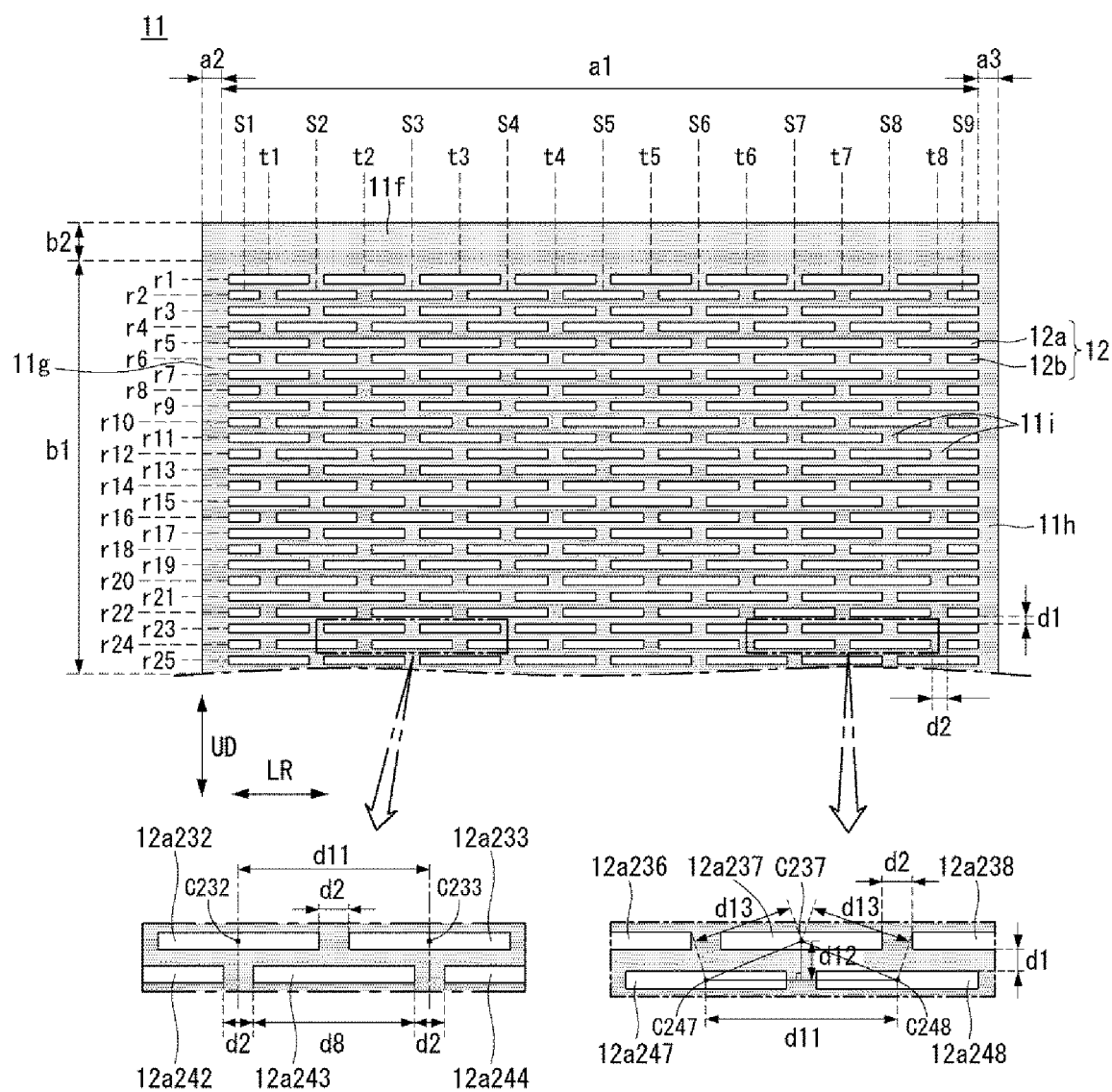
Figure 6:
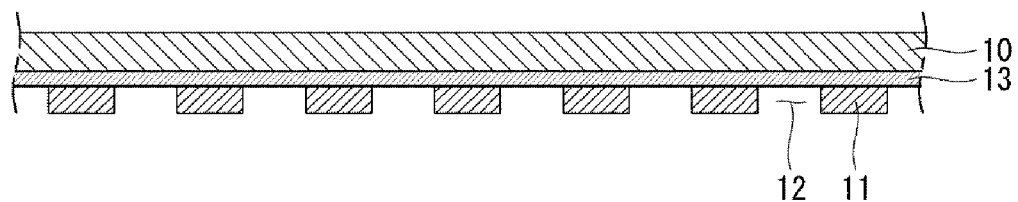
Figure 7:
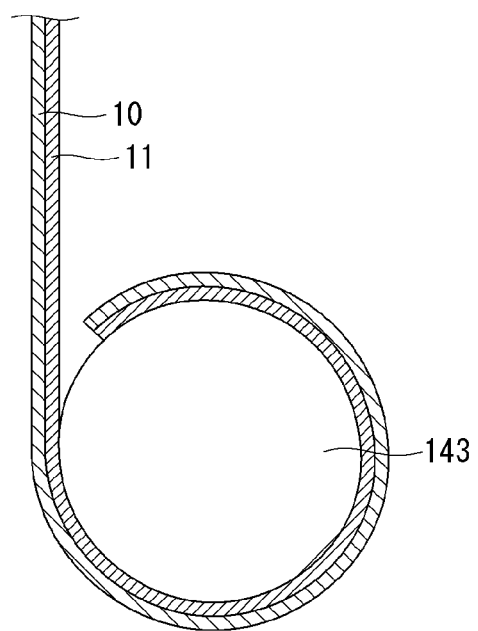

Referring to FIG. 3, the display unit 20 may include a display panel 10 and a plate 11.

The display panel 10 may be flexible. For example, the display panel 10 may be an organic light emitting diode (OLED) display panel. In the following description, embodiments of the disclosure are described using the OLED display panel as an example of the display panel 10. However, embodiments are not limited thereto. For example, a liquid crystal display (LCD) panel, a plasma display panel (PDP), and a field emission display (FED) panel may be used.

The display panel 10 may have a front surface displaying an image. The display panel 10 may have a rear surface opposite the front surface. The front surface of the display panel 10 may be covered with a light transmission material. For example, the light transmission material may include a glass, a resin, or a plastic.

The plate 11 may be coupled, fastened, or attached to the rear surface of the display panel 10. The plate 11 may include a metal material.

The plate 11 may be referred to as a module cover, a cover, a display panel cover, or a panel cover.

Referring to FIGS. 4, 5, 6 and 7, the plate 11 may include a plurality of holes 12. The plate 11 may include an area (hereinafter referred to as "hole formation area") where the holes 12 are formed and areas 11f, 11g and 11h where the hole 12 is not formed. The areas 11f, 11g and 11h where the hole 12 is not formed may surround the area where the holes 12 are formed. The areas 11f, 11g and 11h can protect edges of the display panel 10. The hole 12 may be referred to as an opening.

The first area 11g where the hole 12 is not formed, the hole formation area, and the second area 11h where the hole 12 is not formed may be sequentially disposed along the left-to-right direction LR of the plate 11. A width of the first area 11g in the left-to-right direction LR may be "a2". A width of the hole formation area in the left-to-right direction LR may be "a1". A width of the second area 11h in the left-to-right direction LR may be "a3".

The third area 11f where the hole 12 is not formed and the hole formation area may be sequentially disposed along the up-down direction UD of the plate 11. A height of the third area 11f in the up-down direction UD may be "b2". A height of the hole formation area in the up-down direction UD may be "b1".

The third area 11f may be coupled to a structure. For example, the structure may be an upper bar. The upper bar may be coupled to a link.

The holes 12 may penetrate the plate 11. The holes 12 may be formed by perforating the plate 11. The holes 12 may be slits 12a and 12b. The slits 12a and 12b may have a shape extended along the left-to-right direction LR of the plate 11. The holes 12 may include a relatively long slit 12a and a relatively short slit 12b.

The relatively long slit 12a may have a width d8 and a width d9. The relatively short slit 12b may have a width d10 and a width d9.

The slits 12a and 12b may be spaced from each other along the left-to-right direction LR of the plate 11. The adjacent slits 12a and 12b may be positioned at a predetermined distance d2.

The slits 12a and 12b may be spaced from each other along the up-down direction UD of the plate 11. The adjacent slits 12a and 12b may be positioned at a predetermined distance d1.

As the distances d1 and d2 between the slits 12a and 12b decrease, the plate 11 may be easily wound or unwound. As the distances d1 and d2 between the slits 12a and 12b increase, elasticity of the plate 11 may increase.

The display panel 10 may have a very thin thickness. The display panel 10 may be easily wrinkled due to the thin thickness. In addition, the display panel 10 may be easily damaged by an external impact due to the thin thickness.

The plate 11 is fixed to the display panel 10 and can increase rigidity of the display panel 10. The plate 11 supports the display panel 10 and can prevent the display panel 10 from being wrinkled.

The plate 11 may include a metal material having high rigidity. The plate 11 may be formed of a material having a high elastic strength. The plate 11 may be wound or unwound from a roller 143 by the slits 12a and 12b included in the plate 11. Further, even if the plate 11 is wound or unwound from the roller 143, the plate 11 may not be permanently deformed by the slits 12a and 12b included in the plate 11.

An adhesive layer 13 may be formed on the rear surface of the display panel 10. The adhesive layer 13 can fix the display panel 10 to the plate 11. The display panel 10, the adhesive layer 13, and the plate 11 may be combined into one body to form the display unit 20 and may be wound or unwound from the roller 143.

The slits 12a and 12b may be arranged in rows and columns. Odd-numbered rows r1, r3, r5, r7, r9, r11, r13, r15, r17, r19, r21, r23 and r25 may be formed by the relatively long slits 12a. The relatively long slits 12a of the odd-numbered rows r1, r3, r5, r7, r9, r11, r13, r15, r17, r19, r21, r23 and r25 may form columns t1, t2, t3, t4, t5, t6, t7 and t8.

Even-numbered rows r2, r4, r6, r8, r10, r12, r14, r16, r18, r20, r22 and r24 may be formed by the relatively short slits 12b and the relatively long slits 12a. The slits 12a and 12b of the even-numbered rows r2, r4, r6, r8, r10, r12, r14, r16, r18, r20, r22 and r24 may form columns s1, s2, s3, s4, s5, s6, s7, s8 and s9.

The relatively short slits 12b and the relatively long slits 12a may be alternatively disposed along the up-down direction UD. The relatively short slits 12b may be disposed on both sides of each of the even-numbered rows r2, r4, r6, r8, r10, r12, r14, r16, r18, r20, r22 and r24 in the left-to-right direction LR.

A straight line l1 connecting a center C221 of a first slit 12b221 of the 22th row r22 and a center C222 of a second slit 12a222 of the 22th row r22 may pass through centers of remaining slits of the 22th row r22.

A straight line l2 connecting a center C231 of a first slit 12b231 of the 23th row r23 and a center C232 of a second slit 12a232 of the 23th row r23 may pass through centers of remaining slits of the 23th row r23.

A straight line l3 connecting a center C241 of a first slit 12b241 of the 24th row r24 and a center C242 of a second slit 12a242 of the 24th row r24 may pass through centers of remaining slits of the 24th row r24.

A straight line l4 connecting a center C251 of a first slit 12b251 of the 25th row r25 and a center C252 of a second slit 12a252 of the 25th row r25 may pass through centers of remaining slits of the 25th row r25.

A straight line l5 connecting a center C221 of an 11th slit 12b221 of the first column s1 of the even-numbered rows r2, r4, r6, r8, r10, r12, r14, r16, r18, r20, r22 and r24 and a center C241 of a 12th slit 12b241 of the first column s1 may pass through centers of remaining slits of the first column s1.

A straight line l6 connecting a center C231 of a 12th slit 12a231 of the first column t1 of the odd-numbered rows r1, r3, r5, r7, r9, r11, r13, r15, r17, r19, r21, r23 and r25 and a center C251 of a 13th slit 12a251 of the first column t1 may pass through centers of remaining slits of the first column t1.

A straight line 17 connecting a center C222 of an 11th slit 12a222 of the second column s2 of the even-numbered rows r2, r4, r6, r8, r10, r12, r14, r16, r18, r20, r22 and r24 and a center C242 of a 12th slit 12a242 of the second column s2 may pass through centers of remaining slits of the second column s2.

A straight line 18 connecting a center C232 of a 12th slit 12a232 of the second column t2 of the odd-numbered rows r1, r3, r5, r7, r9, r11, r13, r15, r17, r19, r21, r23 and r25 and a center C252 of a 13th slit 12a252 of the second column t2 may pass through centers of remaining slits of the second column t2.

A center distance d11 between adjacent slits 12a232 and 12a233 on the same row r23 may be greater than a width d8 of a slit 12a243 of the row r24 adjacent to the same row r23.

Center distances d13 between slits 12a237, 12a246 and 12a247 of the adjacent rows r23 and r24 and a center distance d11 between the slits 12a246 and 12a247 of the same row r24 may form an isosceles triangle. The center distance d11 between the slits 12a246 and 12a247 of the same row r24 may be a base of the isosceles triangle. A distance d12 between the adjacent rows r23 and r24 may be a height of the isosceles triangle.

Figure 8:
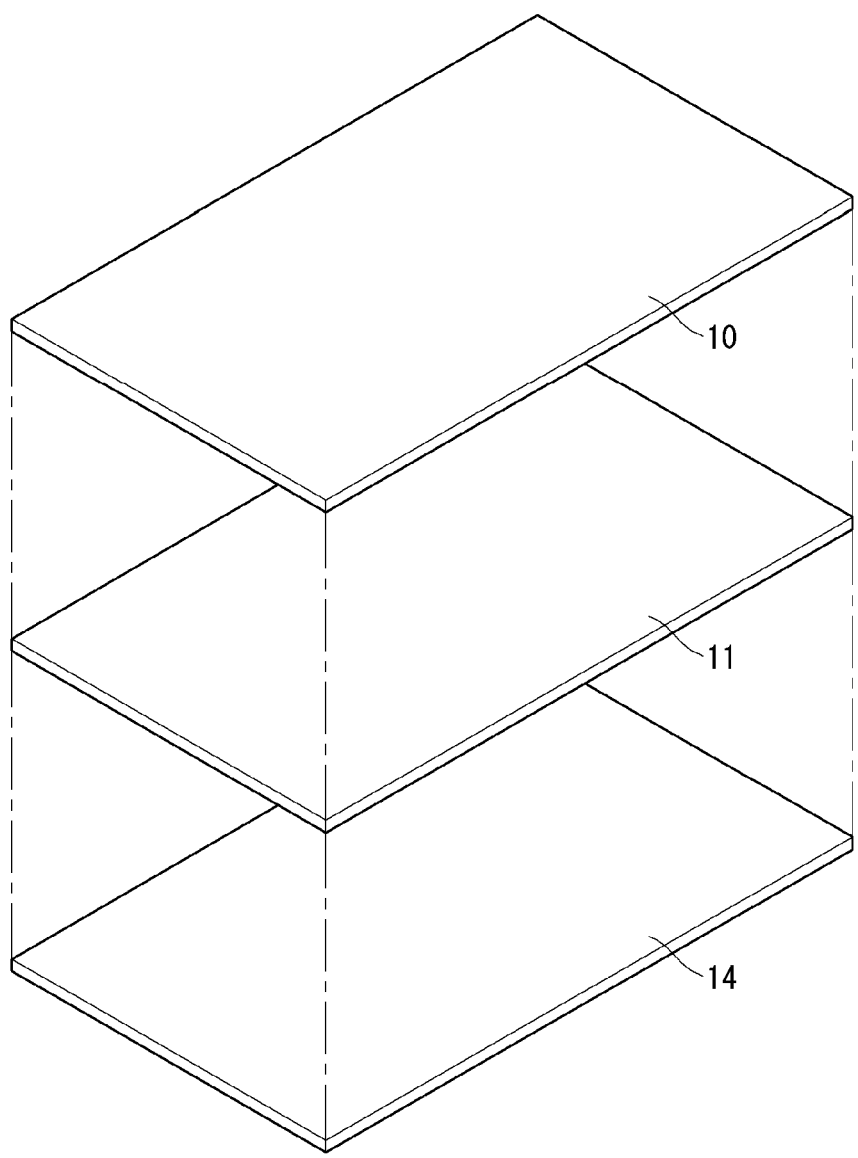

Referring to FIG. 8, the plate 11 may be coupled to the rear surface of the display panel 10. A first resin layer 14 may be coupled to a rear surface of the plate 11.

The first resin layer 14 may cover the plate 11. The first resin layer 14 may cause the plate 11 not to be exposed to the outside.

Figure 9:
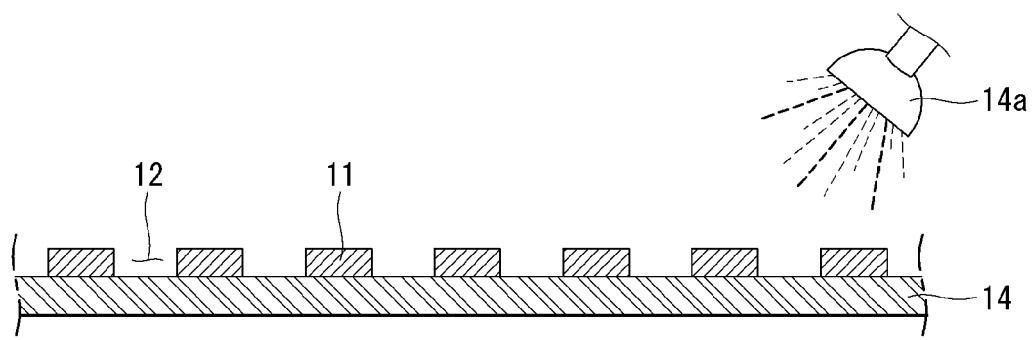
Figure 10:
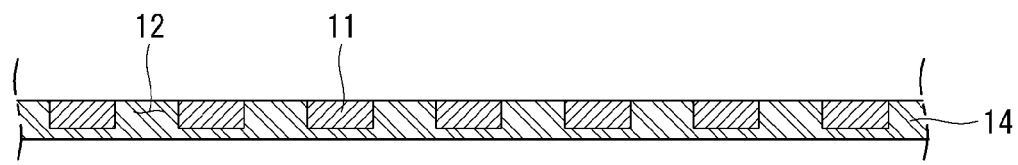

Referring to FIGS. 9 and 10, the first resin layer 14 and the plate 11 may be coupled to each other through a lamination process. The plate 11 may be placed on the first resin layer 14. The plate 11 and the first resin layer 14 may be heated by a heating device 14a. A portion of the first resin layer 14 may be melted. The melted portion of the first resin layer 14 may be attached to the plate 11. The melted portion of the first resin layer 14 may be filled in the holes 12 of the plate 11. The plate 11 may be accommodated in the first resin layer 14.

When the heated plate 11 and the heated first resin layer 14 are cooled, the plate 11 and the first resin layer 14 may be combined into one body. A front surface of a combination of the plate 11 and the first resin layer 14 may be flat.

Figure 11:
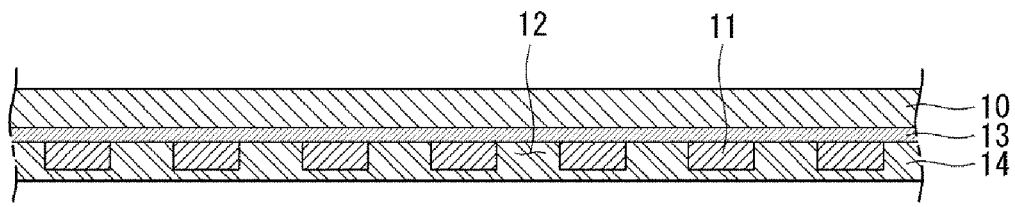
Figure 12:
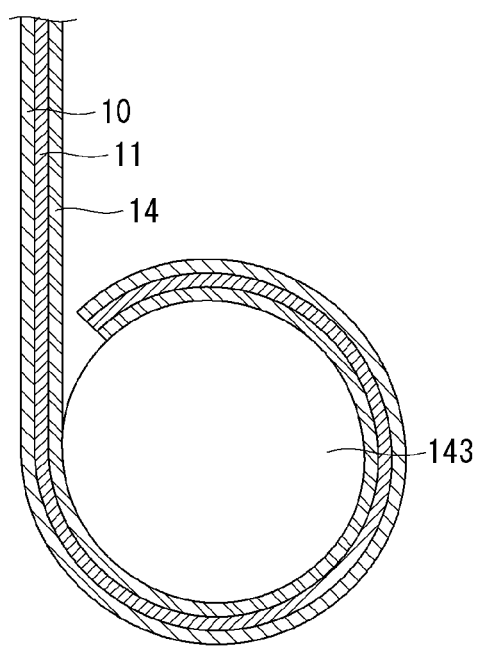

Referring to FIGS. 11 and 12, the adhesive layer 13 may be formed on the rear surface of the display panel 10. The adhesive layer 13 can fix the display panel 10 to the plate 11. Because the front surface of the combination of the plate 11 and the first resin layer 14 is flat, the adhesive layer 13 can fix the display panel 10 to the first resin layer 14.

The first resin layer 14 may be formed of a material with high flexibility. For example, the first resin layer 14 may be formed of urethane or rubber.

The display panel 10, the adhesive layer 13, the plate 11, and the first resin layer 14 can be combined into one body to form the display unit 20 and can be wound or unwound from the roller 143.

Figure 13:
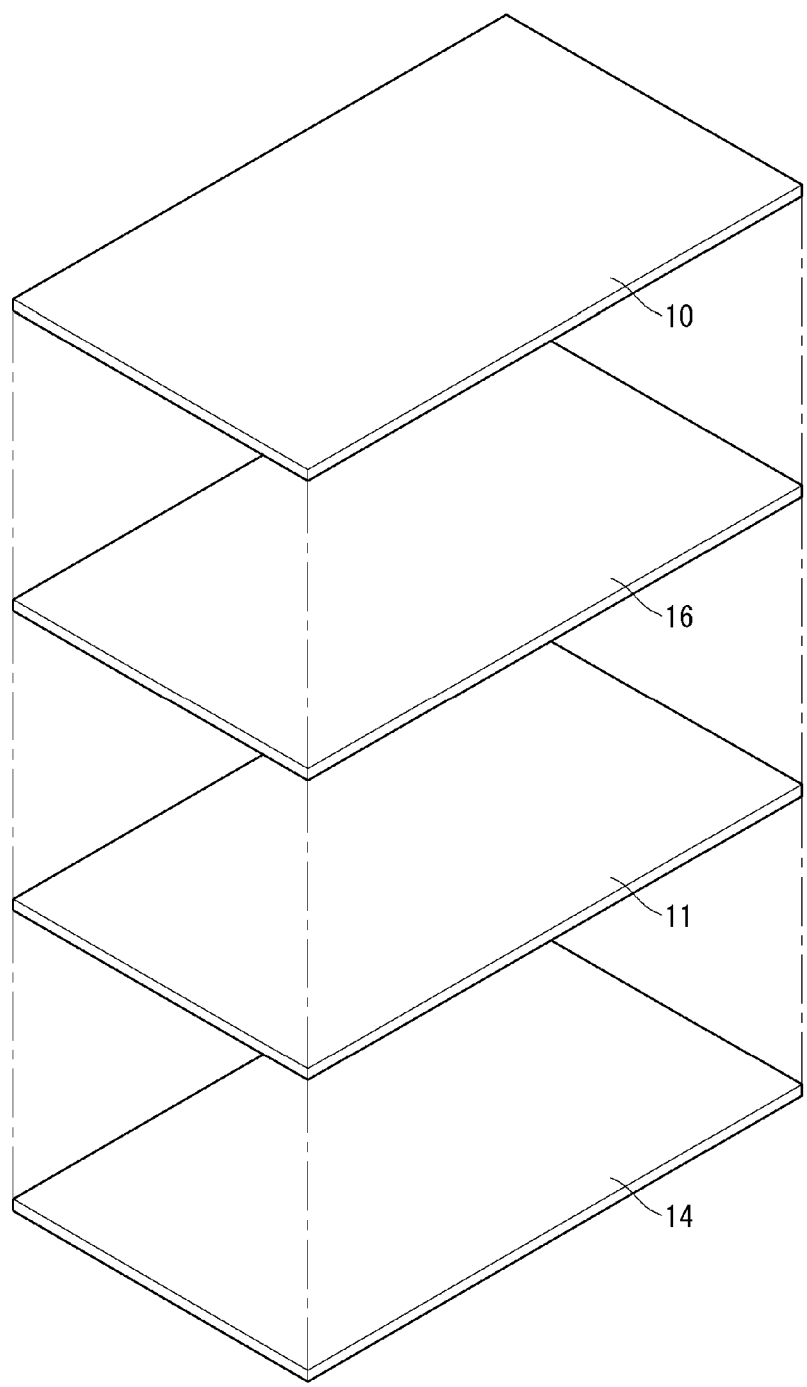

Referring to FIG. 13, a second resin layer 16 may be coupled to the rear surface of the display panel 10. The plate 11 may be coupled to a rear surface of the second resin layer 16. The first resin layer 14 may be coupled to the rear surface of the plat 11.

The first resin layer 14 may cover the plate 11. The first resin layer 14 may cause the plate 11 not to be exposed to the outside.

Figure 14:
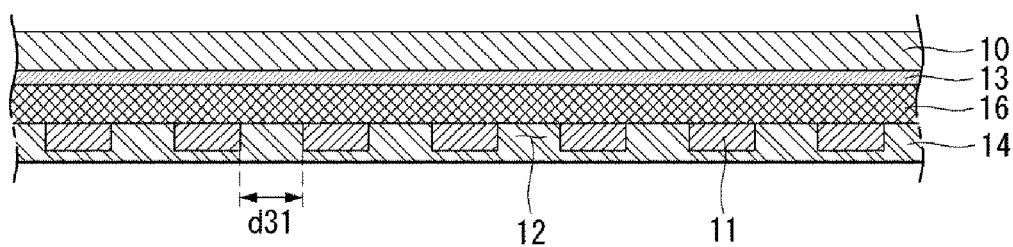
Figure 15:
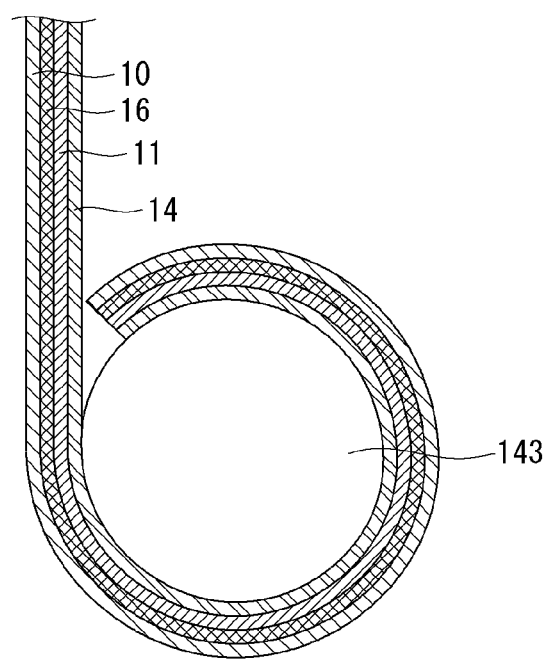

Referring to FIGS. 14 and 15, the plate 11 may be positioned between the first resin layer 14 and the second resin layer 16. The first resin layer 14, the second resin layer 16, and the plate 11 may be coupled through a lamination process. The first resin layer 14 and the second resin layer 16 may be coupled to each other to form one resin layer 17. A material of the first resin layer 14 and a material of the second resin layer 16 may be the same. A portion of the first resin layer 14 may be melted and filled in the holes 12 of the plate 11. A portion of the second resin layer 16 may be melted and filled in the holes 12 of the plate 11. A portion of the resin layer 17 may be melted and filled in the holes 12 of the plate 11. The plate 11 may be positioned inside the resin layer 17.

The plate 11, the first resin layer 14, and the second resin layer 16 may be combined into one body. The plate 11 and the resin layer 17 may be combined into one body. A front surface of the second resin layer 16 may be flat. A front surface of the resin layer 17 may be flat.

The adhesive layer 13 may be formed on the rear surface of the display panel 10. The adhesive layer 13 can fix the display panel 10 to the second resin layer 16. The adhesive layer 13 can fix the display panel 10 to the resin layer 17.

The second resin layer 16 may be formed of a material with high flexibility. For example, the second resin layer 16 may be formed of urethane or rubber.

The resin layer 17 may be formed of a material with high flexibility. For example, the resin layer 17 may be formed of urethane or rubber.

The display panel 10, the adhesive layer 13, the second resin layer 16, the plate 11, and the first resin layer 14 can be combined into one body to form the display unit 20 and can be wound or unwound from the roller 143. The display panel 10, the adhesive layer 13, the resin layer 17, and the plate 11 can be combined into one body to form the display unit 20 and can be wound or unwound from the roller 143.

As a distance d31 between the holes 12 increases, a combined area of the first resin layer 14 and the second resin layer 16 may increase. As the combined area of the first resin layer 14 and the second resin layer 16 increases, the first resin layer 14 and the second resin layer 16 can be strongly coupled.

Figure 16:
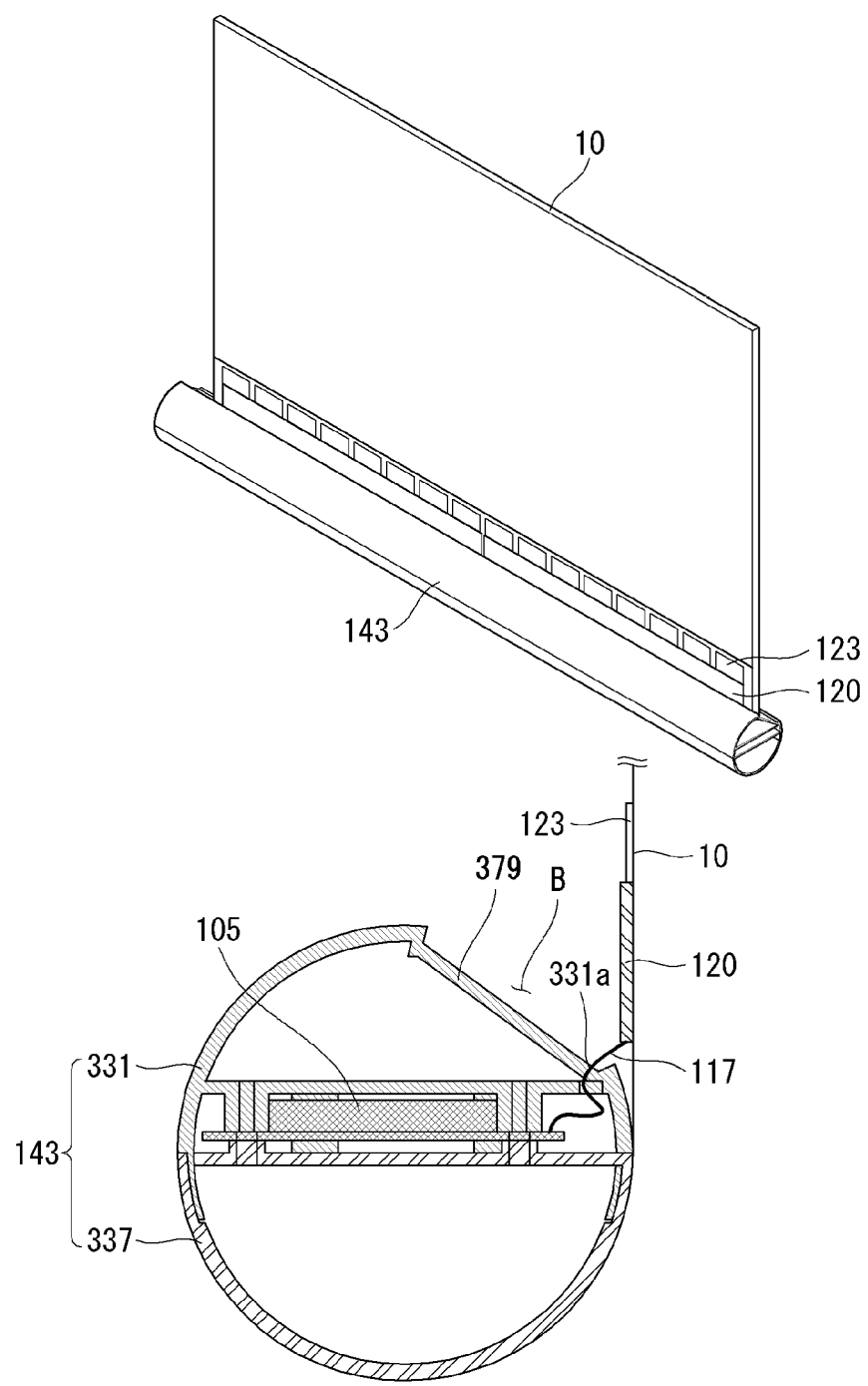

Referring to FIG. 16, a lower end of the display panel 10 may be connected to the roller 143. The display panel 10 may be wound or unwound from the roller 143.

The front surface of the display panel 10 may be coupled to a plurality of source printed circuit boards (PCBs) 120. The plurality of source PCBs 120 may be spaced from each other.

A source chip-on film (COF) 123 may connect the display panel 10 to the source PCBs 120. The source COF 123 may be positioned on the front surface of the display panel 10.

The roller 143 may include a first part 331 and a second part 337. The first part 331 and the second part 337 may be fastened by a screw. A timing controller board 105 may be mounted inside the roller 143.

The source PCBs 120 may be electrically connected to the timing controller board 105. The timing controller board 105 can transmit digital video data and timing control signals to the source PCBs 120.

Cables 117 can electrically connect the source PCBs 120 to the timing controller board 105. For example, the cable 117 may be a flexible flat cable (FFC). The cable 117 may pass through a hole 331a. The hole 331a may be formed in a seating portion 379 or the first part 331. The cable 117 may be positioned between the display panel 10 and the second part 337.

The seating portion 379 may be formed on an outer periphery of the first part 331. The seating portion 379 may be formed by stepping a portion of the outer periphery of the first part 331. The seating portion 379 may form a space B. When the display unit 20 is wound on the roller 143, the source PCBs 120 can be accommodated in the seating portion 379. Because the source PCBs 120 are accommodated in the seating portion 379 as described above, the source PCBs 120 are not bent, and durability of the source PCBs 120 can be improved.

The cables 117 can electrically connect the timing controller board 105 to the source PCBs 120.

Figure 17:
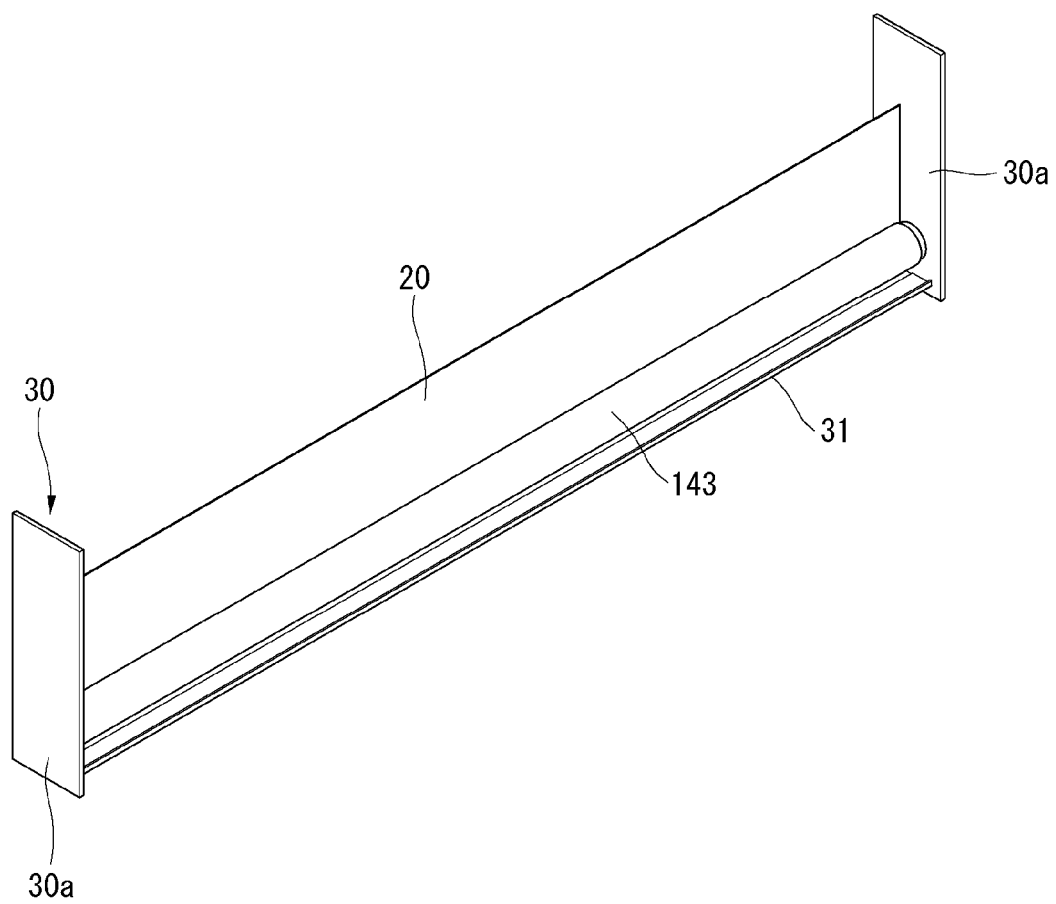

Referring to FIG. 17, the roller 143 on which the display unit 20 is wound may be mounted on a first base 31. The first base 31 may be a base of the housing 30. The roller 143 may be extended along the longitudinal direction of the housing 30. The first base 31 may be connected to a side 30a of the housing 30.

Figure 18:
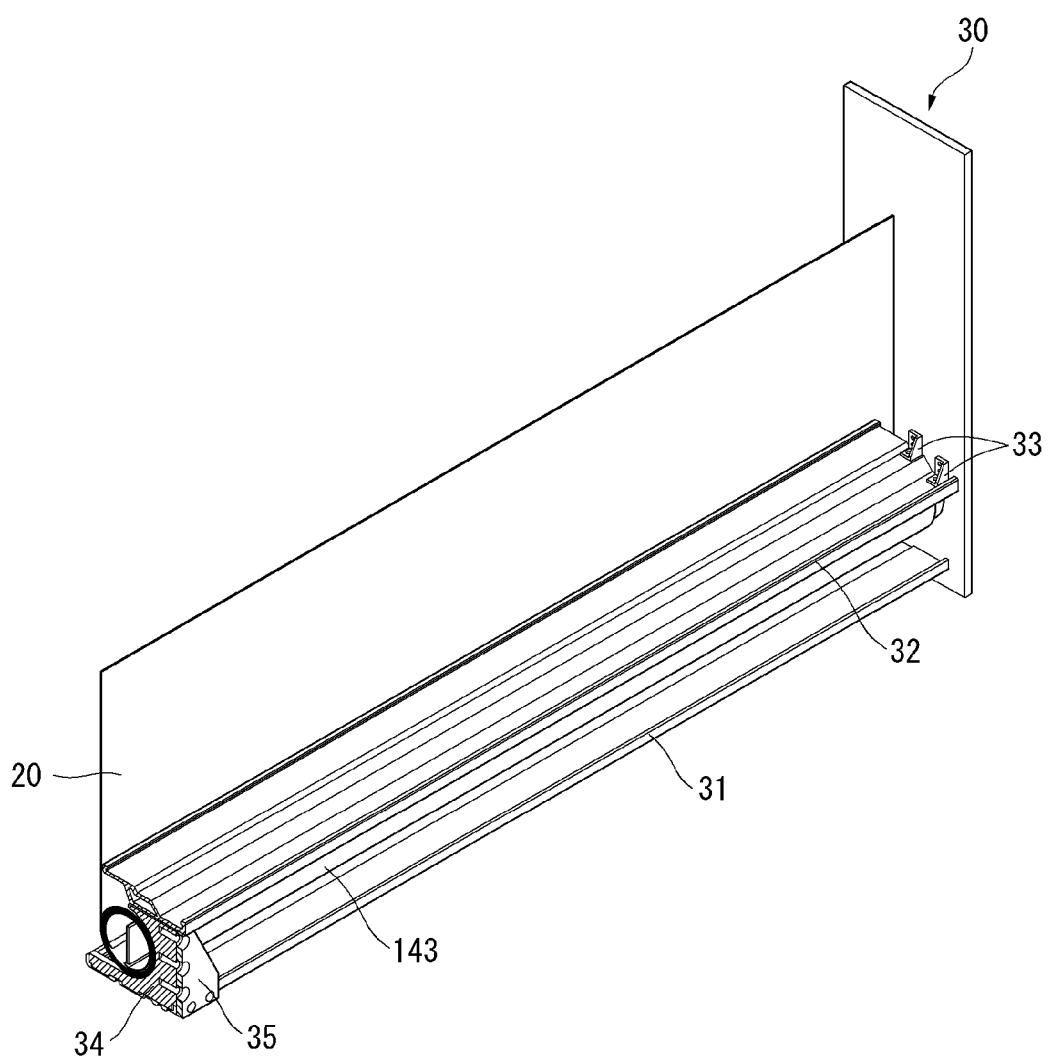
FIGS. 18 to 39 illustrate configuration of a display device related to the present disclosure.
Figure 19:
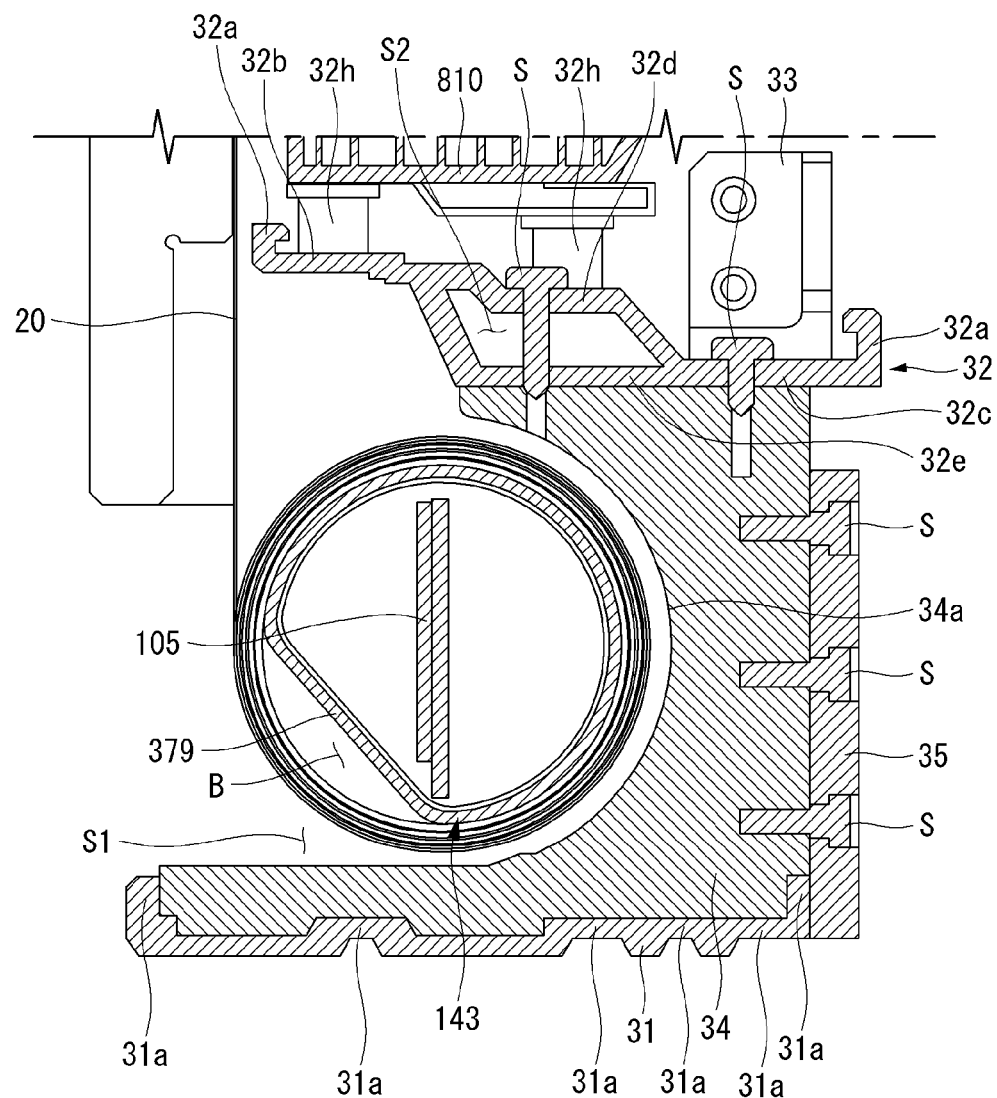

Referring to FIGS. 18 and 19, a beam 31a may be formed on the first base 31. The beam 31a can improve bending stiffness or torsional stiffness of the first base 31. A large number of components may be mounted on the first base 31, and the first base 31 may receive a large load. However, because the stiffness of the first base 31 is improved as described above, the first base 31 can be prevented from hanging down due to the load. The beam 31a may be formed through a press process.

A second base 32 may be spaced from an upper side of the first base 31. A space S1 may be formed between the first base 31 and the second base 32. The roller 143 on which the display unit 20 is wound may be accommodated in the space S1. The roller 143 may be positioned between the first base 31 and the second base 32.

The second base 32 may be connected to the side 30a of the housing 30. A bracket 33 may be fastened to an upper surface of the first base 31. The bracket 33 may be fastened to the side 30a of the housing 30.

A beam 32a may be formed on the second base 32. The beam 32a can improve bending stiffness or torsional stiffness of the second base 32. The beam 32a may be formed through a press process.

A third part 32d may be connected to a first part 32b and a second part 32c. A fourth part 32e may be connected to the first part 32b and the second part 32c. A space S2 may be formed between the third part 32d and the fourth part 32e. Hence, bending stiffness or torsional stiffness of the second base 32 can be improved. The third part 32d may be referred to as a reinforcing rib or a rib. The fourth part 32e may be referred to as a reinforcing rib or a rib.

A large number of components may be mounted on the second base 32, and the second base 32 may receive a large load. However, because the stiffness of the second base 32 is improved as described above, the second base 32 can be prevented from hanging down due to the load.

A first reinforcing plate 34 may be positioned between the first base 31 and the second base 32. The first reinforcing plate 34 and the second base 32 may be fastened to each other by a screw. The first reinforcing plate 34 can support the second base 32. The first reinforcing plate 34 can prevent the second base 32 from hanging down. The first reinforcing plate 34 may be positioned in a central portion of the first base 31 or a central portion of the second base 32. The first reinforcing plate 34 may include a curved portion 34a. The curved portion 34a may be formed along the roller 143. The curved portion 34a may not contact the roller 143 or the display unit 20 wound on the roller 143. The curved portion 34a may be spaced from the roller 143 by a predetermined distance so that it does not interfere with the rotation of the roller 143.

A second reinforcing plate 35 may be fastened to the first base 31 and the first reinforcing plate 34. The second reinforcing plate 35 can support the first reinforcing plate 34. The second reinforcing plate 35 may be positioned in the rear of the first reinforcing plate 34. The second reinforcing plate 35 may be positioned in the rear of the first base 31. The second reinforcing plate 35 may be positioned perpendicular to the first base 31. The second reinforcing plate 35 may be fastened to the beam 31a of the first base 31. The second base 32 may face the front surface or the rear surface of the housing 30.

Figure 20:
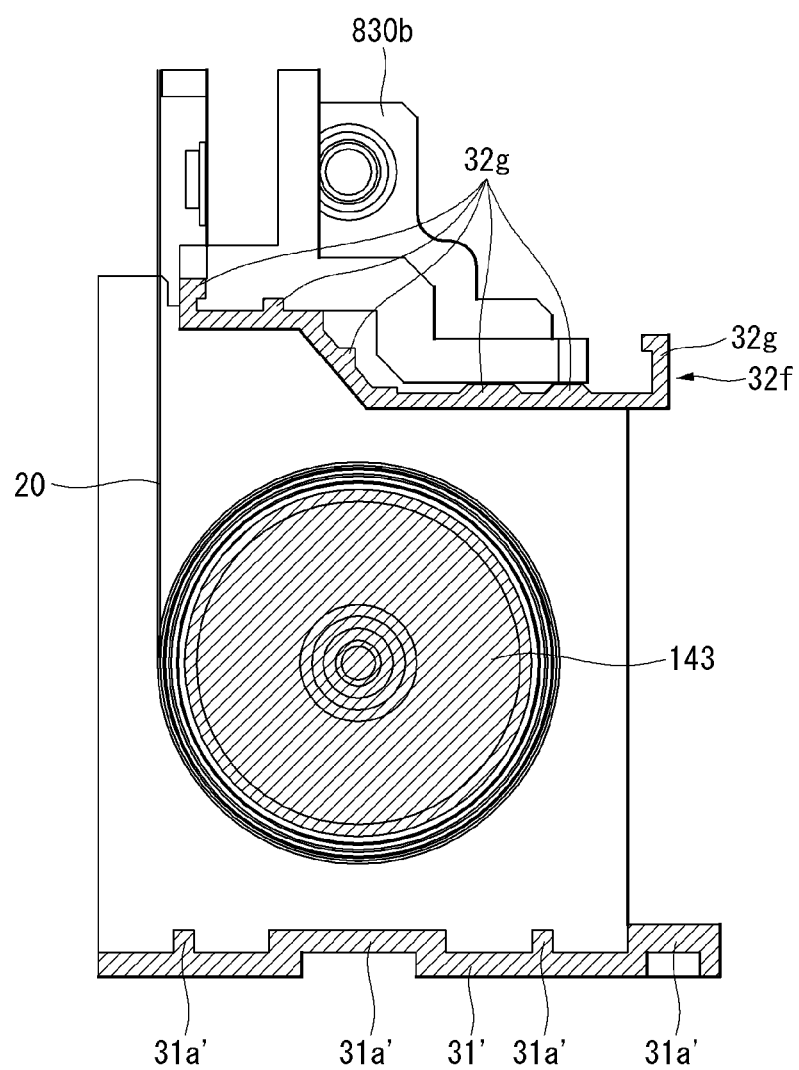

Referring to FIG. 20, a second base 32f may not form a space. When a load applied to the second base 32f is not large, the second base 32f can have sufficient stiffness due to a beam 32g included in the second base 32f. A first base 31' may include a beam 31a'.

Figure 21:
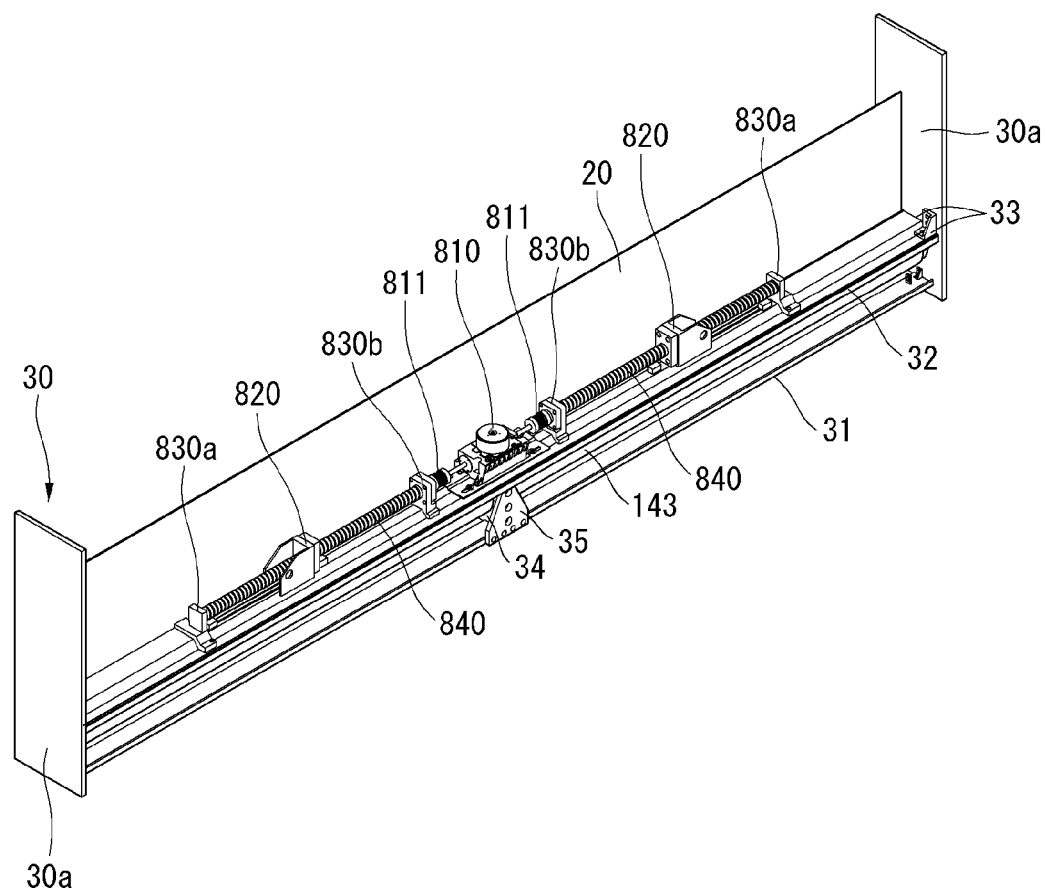
Figure 22:
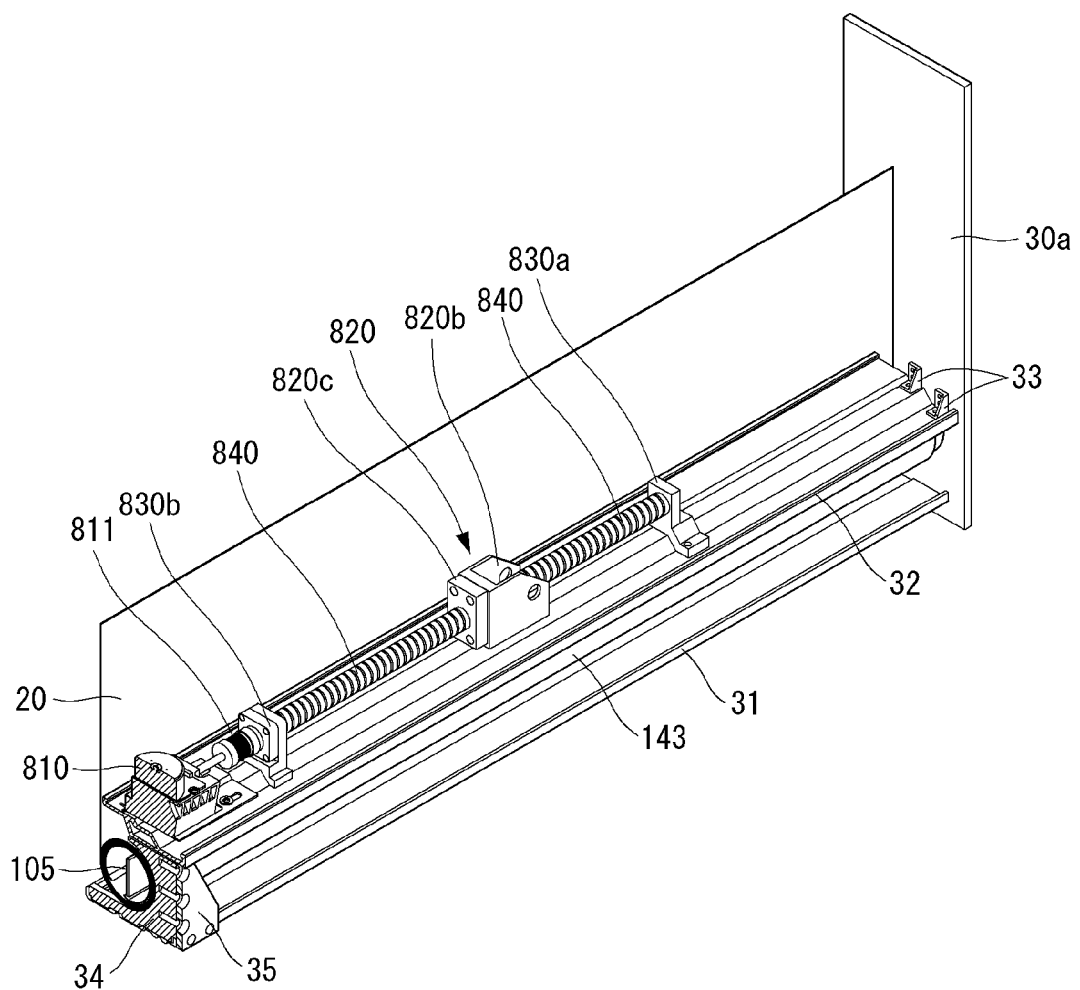

Referring to FIGS. 21 and 22, a motor assembly 810 may be mounted on the second base 32. A driving shaft of the motor assembly 810 may be formed on both sides. A right driving shaft and a left driving shaft of the motor assembly 810 may rotate in the same direction. Alternatively, the right driving shaft and the left driving shaft of the motor assembly 810 may rotate in opposite directions.

The motor assembly 810 may include a plurality of motors. The plurality of motors may be connected to one another in series. The motor assembly 810 can output high torque because the plurality of motors is connected to one another in series.

A lead screw 840 may be positioned on each of the left and right sides of the motor assembly 810. The motor assembly 810 may be connected to the lead screw 840. A coupling 811 may connect the lead screw 840 to the driving shaft of the motor assembly 810.

The lead screw 840 may be threaded along its longitudinal direction. A direction of screw threads provided on the right lead screw 840 and a direction of screw threads provided on the left lead screw 840 may be opposite to each other. Alternatively, the direction of the screw threads of the right lead screw 840 and the direction of the screw threads of the left lead screw 840 may be the same. A pitch of the left lead screw 840 and a pitch of the right lead screw 840 may be the same.

Bearings 830a and 830b may be mounted on the second base 32. The bearings 830a and 830b can support both sides of the lead screw 840. The bearings 830a and 830b may include an inner bearing 830b positioned close to the motor assembly 810 and an outer bearing 830a positioned away from the motor assembly 810. The lead screw 840 can stably rotate due to the bearings 830a and 830b.

A slide 820 may be engaged with the lead screw 840. The slide 820 can move forward and backward along the longitudinal direction of the lead screw 840 in accordance with the rotation of the lead screw 840. The slide 820 can move between the outer bearing 830a and the inner bearing 830b. The slides 820 may be positioned on the left lead screw 840 and the right lead screw 840, respectively. The left slide 820 may be engaged with the left lead screw 840, and the right slide 820 may be engaged with the right lead screw 840.

The left slide 820 and the right slide 820 may be positioned symmetrically with respect to the motor assembly 810. Due to the drive of the motor assembly 810, the left slide 820 and the right slide 820 can move away from or closer to each other by the same distance.

Figure 23:
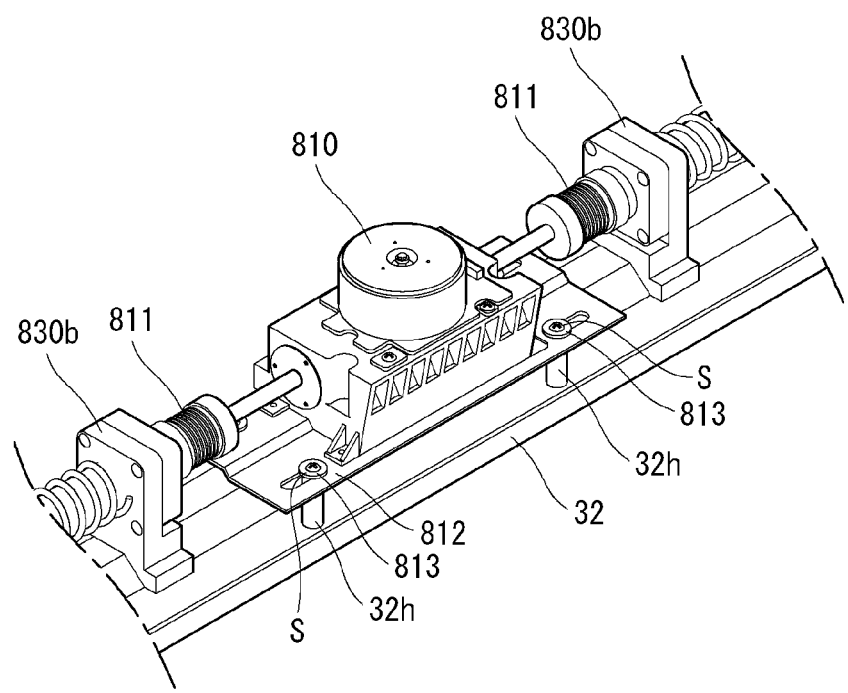

Referring to FIG. 23, the motor assembly 810 may include a plate 813. The plate 813 may be referred to as a mount plate or a motor mount plate. A coupling portion 32h may be formed on an upper surface of the second base 32.

The plate 813 may be fastened to the coupling portion 32h through a screw S. The motor assembly 810 may be spaced apart from the upper surface of the second base 32. A washer 813 may be positioned between an upper surface of the plate 813 and the screw S. The washer 813 may include a rubber material. The washer 813 can reduce a vibration generated in the motor assembly 810. The washer 813 can improve the driving stability of the display device 100.

Figure 24:
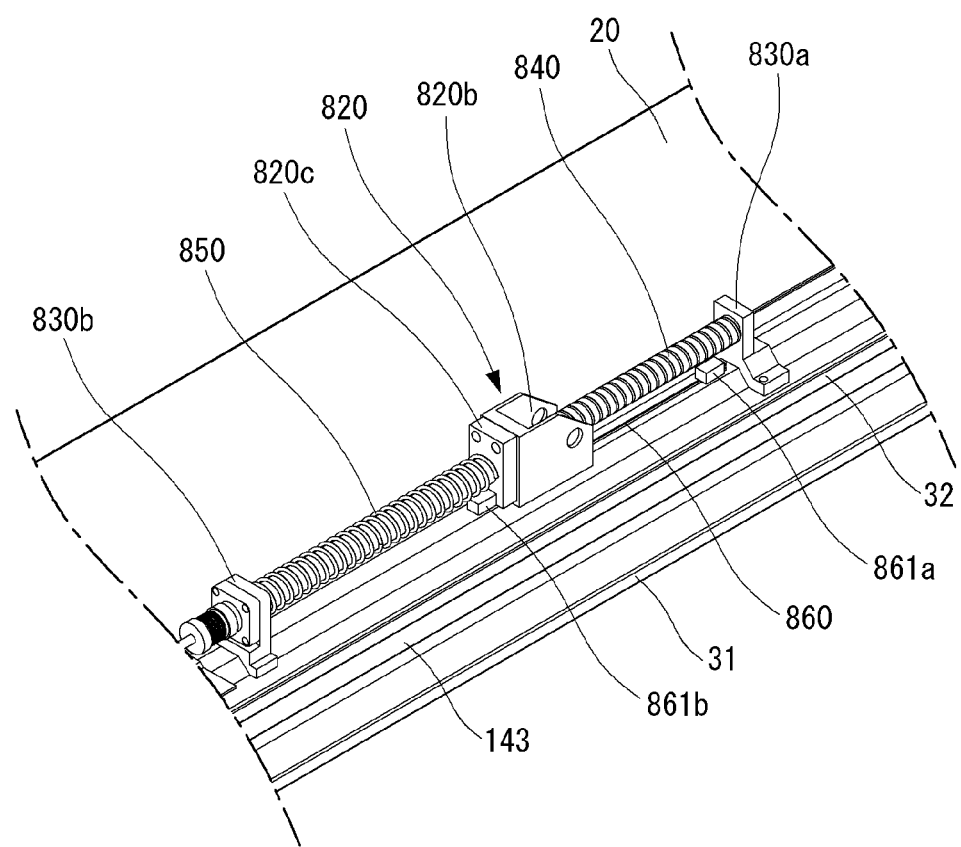

Referring to FIG. 24, a guide rail 860 may be mounted on the second base 32. The guide rail 860 may be positioned in parallel with the lead screw 840. The slide 820 may be engaged with the guide rail 860. A first stopper 861b may be positioned at one side of the guide rail 860, and a second stopper 861a may be positioned at the other side of the guide rail 860. A range in which the slide 820 can move can be limited between the first stopper 861b and the second stopper 861a.

A spring 850 may wrap the lead screw 840. The lead screw 840 may penetrate the spring 850. The spring 850 may be positioned between the inner bearing 830b and the slide 820. One side of the spring 850 may contact the inner bearing 830b, and the other side of the spring 850 may contact the slide 820. The spring 850 can provide an elastic force for the slide 820.

When the slide 820 is caught on the first stopper 861b, the spring 850 may be compressed to the maximum. When the slide 820 is caught on the first stopper 861b, a length of the spring 850 may be a minimum value. When the slide 820 is caught on the first stopper 861b, a distance between the slide 820 and the inner bearing 830b may be a minimum value.

Figure 25:
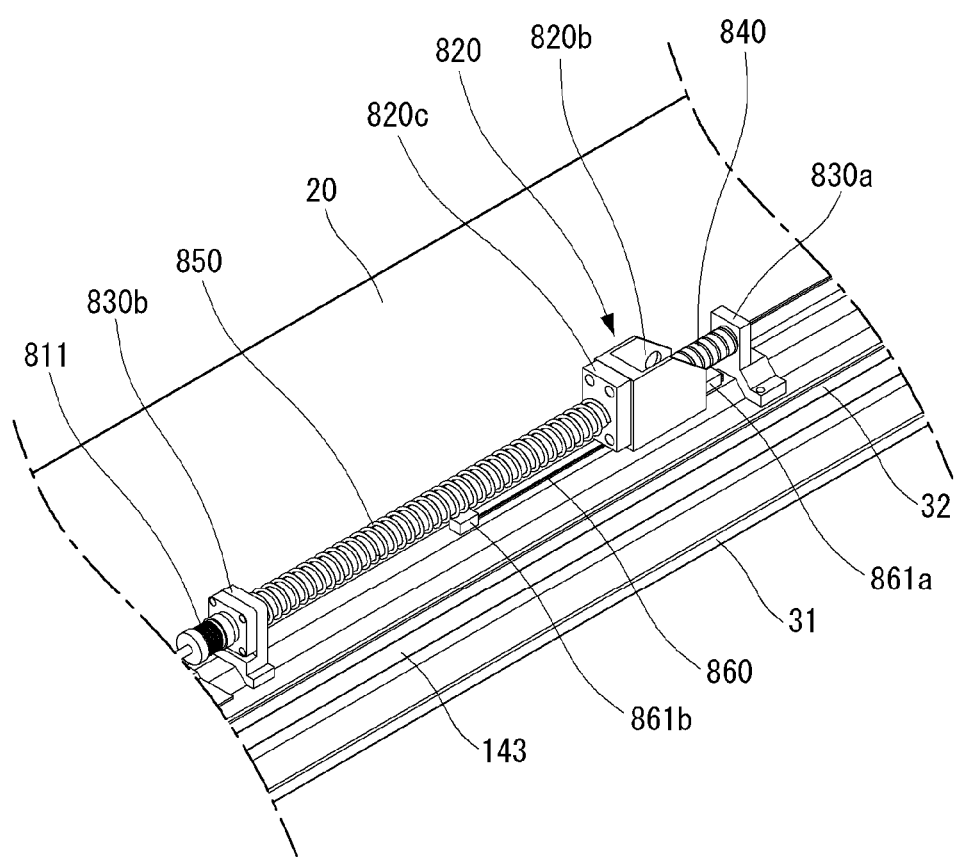

Referring to FIG. 25, when the slide 820 is caught on the second stopper 861a, the spring 850 may be extended to the maximum. When the slide 820 is caught on the second stopper 861a, a length of the spring 850 may be a maximum value. When the slide 820 is caught on the second stopper 861a, a distance between the slide 820 and the inner bearing 830b may be a maximum value.

Figure 26:
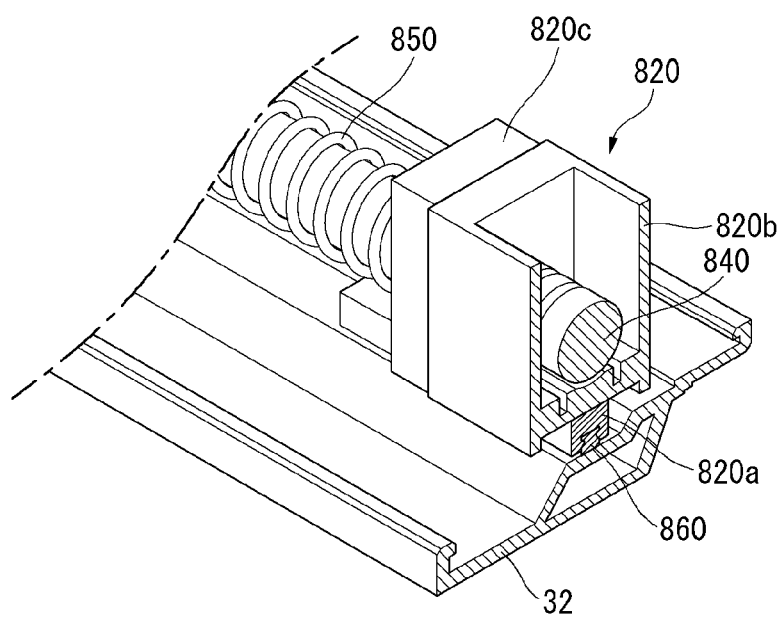

Referring to FIG. 26, a first part 820a of the slide 820 may be engaged with the guide rail 860. The first part 820a may move along the guide rail 860. The first part 820a may be constrained in a longitudinal direction of the guide rail 860. A second part 820b of the slide 820 may be positioned on an upper side of the first part 820a. The first part 820a and the second part 820b of the slide 820 may be fastened to each other through a screw. The second part 820b may be spaced from the guide rail 860. The lead screw 840 may penetrate the second part 820b. The second part 820b may include screw threads corresponding to the screw threads of the lead screw 840. Hence, even if the lead screw 840 rotates, the slide 820 can stably move forward and backward along the guide rail 860 without rotating.

A third part 820c of the slide 820 may be coupled to one side of the second part 820b. The third part 820c may be in contact with the spring 850. The spring 850 can provide an elastic force for the third part 820c.

Figure 27:
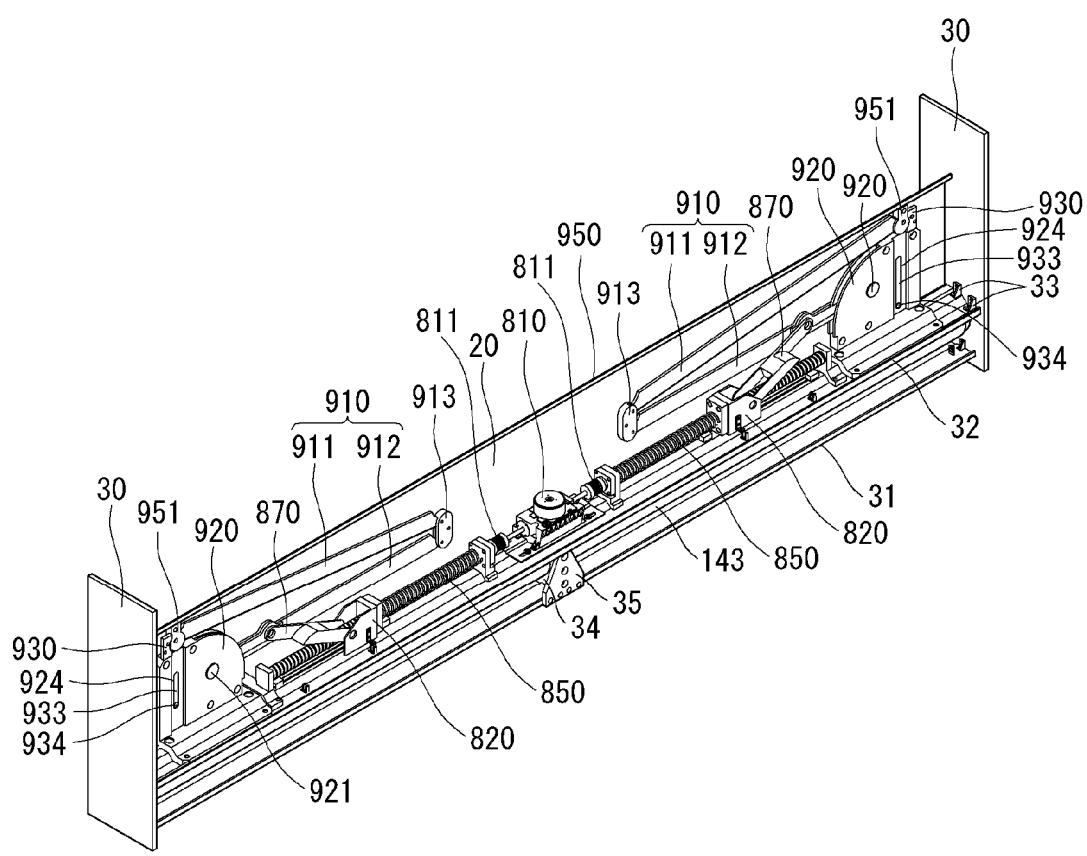
Figure 28:
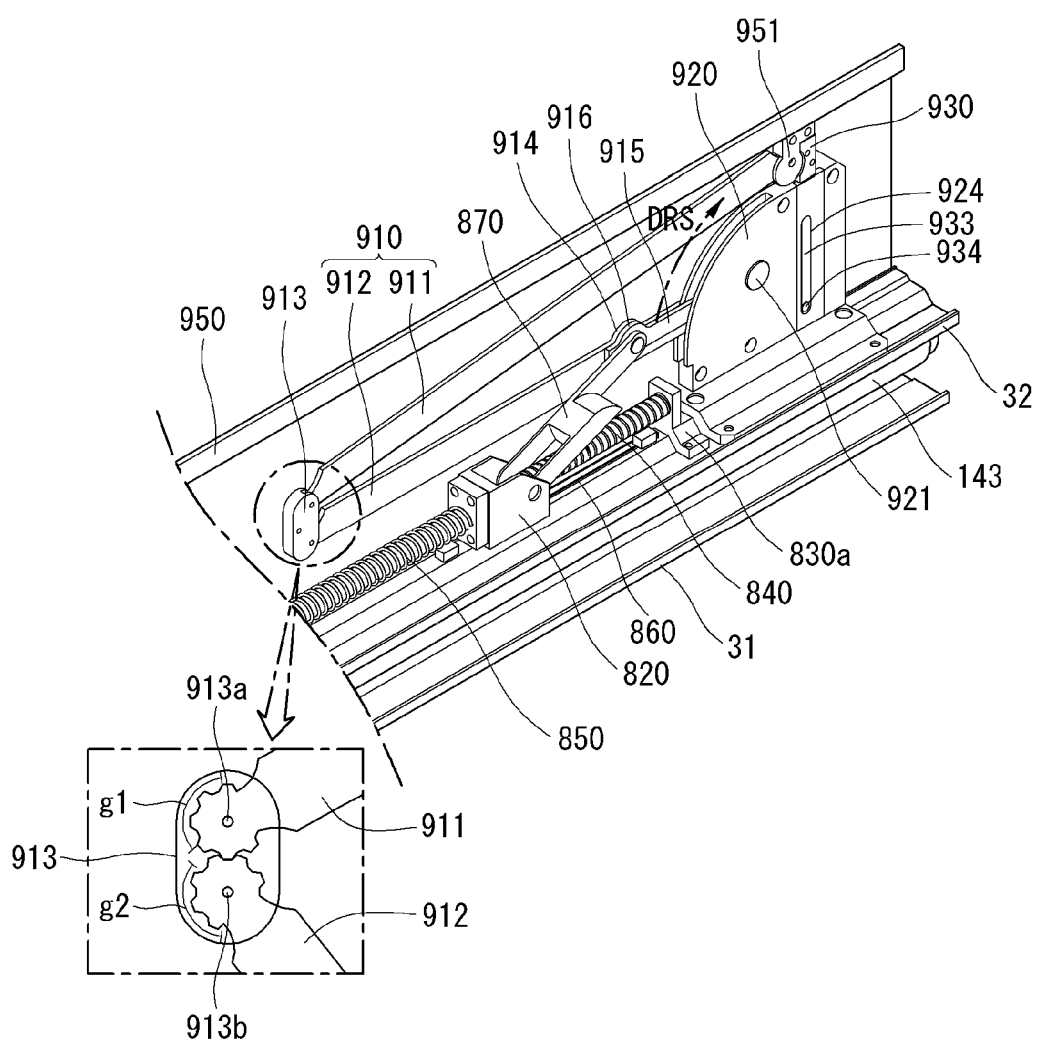

Referring to FIGS. 27 and 28, a link mount 920 may be mounted on the second base 32. One side of a second arm 912 may be pivotally connected to the link mount 920. The other side of the second arm 912 may be pivotally connected to a joint 913. The other side of the second arm 912 may be pivotally connected to a second shaft 913b of the joint 913. One side of a rod 870 may be pivotally connected to the slide 820. The other side of the rod 870 may be pivotally connected to the second arm 912 or a third arm 915. One side of the third arm 915 may be pivotally connected to the link mount 920. The other side of the third arm 915 may be pivotally connected to the other side of the rod 870. The link mount 920 may include a shaft 921. The second arm 912 or the third arm 915 may be pivotally connected to the shaft 921 of the link mount 920.

A link bracket 951 may be referred to as a link cap. The link bracket 951 may be coupled to a top case 950. The top case 950 may be referred to as a case top, an upper bar, a top, or a bar. The top case 950 may be positioned at the top of the display unit 20. The display unit 20 may be fixed to the top case 950.

One side of a first arm 911 may be pivotally connected to the joint 913. One side of the first arm 911 may be pivotally connected to a first shaft 913a. The other side of the first arm 911 may be pivotally connected to the link bracket 951 or the top case 950.

A gear g1 may be formed on one side of the first arm 911, and a gear g2 may be formed on the other side of the second arm 912. The gear g1 of the first arm 911 and the gear g2 of the second arm 912 may be engaged with each other.

When the slide 820 moves close to the outer bearing 830a, the second arm 912 or the third arm 915 may rise. In this instance, a direction in which the second arm 912 or the third arm 915 rises may be referred to as a rising direction DRS.

The second arm 912 may include a protrusion 914 protruding in the rising direction DRS. The protrusion 914 may be referred to as a connector. The third arm 915 may include a protrusion 916 protruding in the rising direction DRS. The protrusion 916 may be referred to as a connector. The protrusion 914 of the second arm 912 and the protrusion 916 of the third arm 915 may face or contact each other. The other side of the rod 870 may be fastened to the protrusion 914 of the second arm 912 or the protrusion 916 of the third arm 915.

A link 910 may include the first arm 911, the second arm 912, the third arm 915, or the joint 913.

Figure 29:
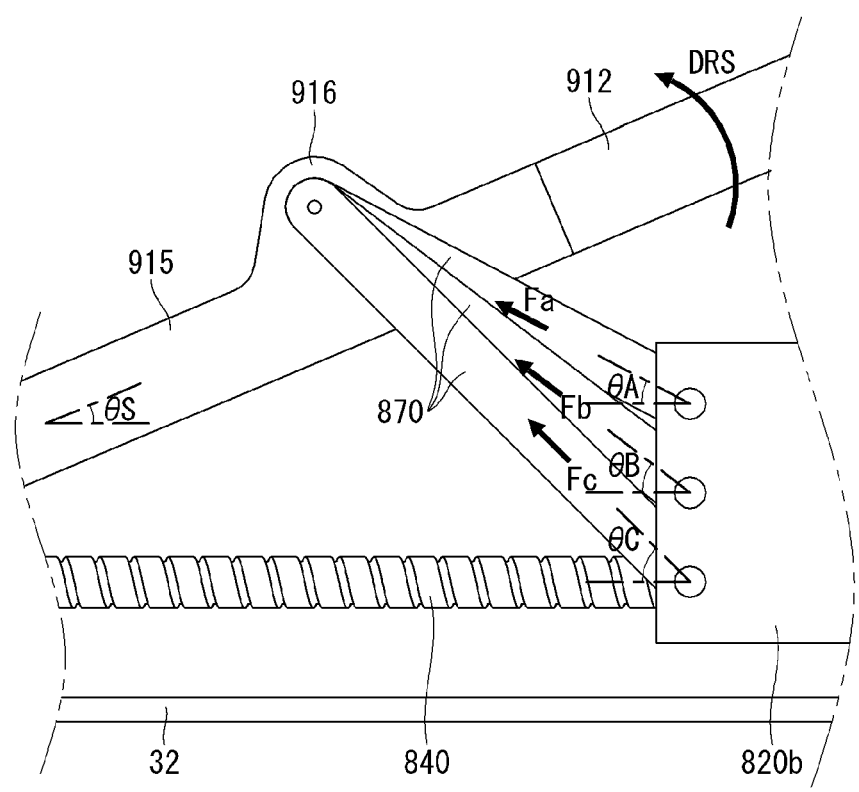
Figure 30:
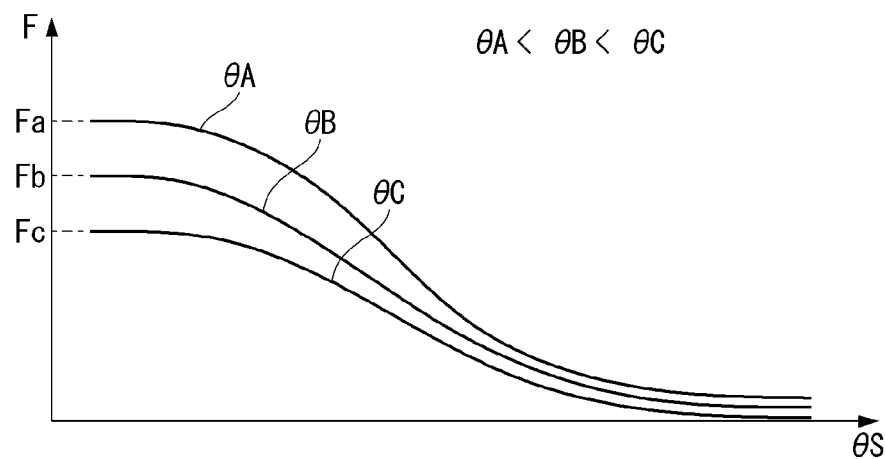

Referring to FIGS. 29 and 30, an angle formed by the second arm 912 or the third arm 915 and the second base 32 may be referred to as θS. When the rod 870 is connected to an upper side of the second part 820b, an angle formed by the rod 870 and the second base 32 may be referred to as θA, and a minimum force of the rod 870 for raising the second arm 912 or the third arm 915 may be referred to as Fa. When the rod 870 is connected to a middle side of the second part 820b, an angle formed by the rod 870 and the second base 32 may be referred to as θB, and a minimum force of the rod 870 for raising the second arm 912 or the third arm 915 may be referred to as Fb. When the rod 870 is connected to a lower side of the second part 820b, an angle formed by the rod 870 and the second base 32 may be referred to as θC, and a minimum force of the rod 870 for raising the second arm 912 or the third arm 915 may be referred to as Fc.

For the same θS, a relationship of θA<θB<θC can be established. Further, for the same θS, a relationship of Fc<Fb<Fa can be established. When the angles θS formed by the second arm 912 or the third arm 915 and the second base 32 are the same, a force required to raise the second arm 912 or the third arm 915 can decrease as the angle formed by the rod 870 and the second base 32 increases. When the rod 870 is connected to the lower side of the second part 820b, a load applied to the motor assembly 810 can decrease.

Figure 31:
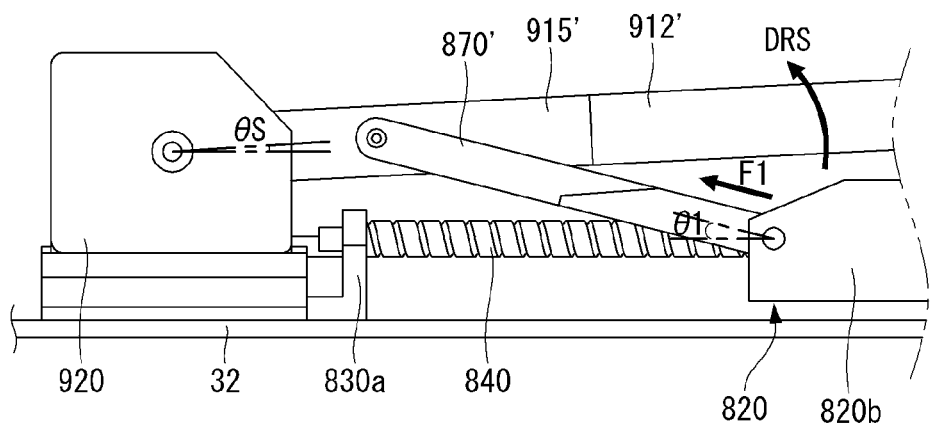

Referring to FIG. 31, a rod 870' may not be connected to a protrusion of a second arm 912' or a protrusion of a third arm 915'. When an angle formed by the second arm 912' or the third arm 915' and the second base 32 is θS, an angle formed by the rod 870' and the second base 32 may be referred to as θ1, and a minimum force of the rod 870' for raising the second arm 912' or the third arm 915' may be referred to as F1.

Figure 32:
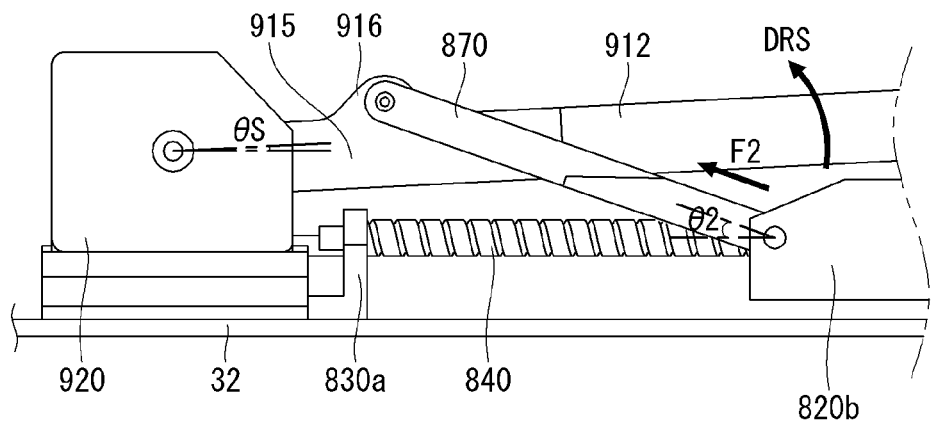

Referring to FIG. 32, the rod 870 may be connected to the protrusion 914 of the second arm 912 or the protrusion 916 of the third arm 915. When an angle formed by the second arm 912 or the third arm 915 and the second base 32 is θS, an angle formed by the rod 870 and the second base 32 may be referred to as θ2, and a minimum force of the rod 870 for raising the second arm 912 or the third arm 915 may be referred to as F2.

Figure 33:
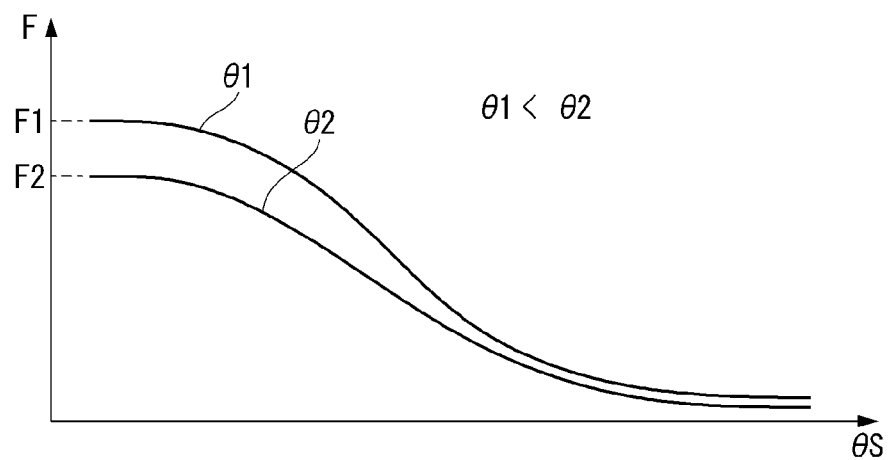

Referring to FIG. 33, when the angles θS are the same, the angle θ2 may be greater than the angle θ1. When the angles θS are the same, the force F1 may be greater than the force F2. When the angles θS formed by the second arms 912 and 912' and the second base 32 are the same, a force required to raise the second arms 912 and 912' can decrease as the angles formed by the rods 870 and 870' and the second base 32 increase. Because the rod 870 is connected to the protrusions 914 and 916, the rod 870 can raise the second arm 912 using the force smaller than the force required when the rod 870' is not connected to the protrusion. Further, because the rod 870 is connected to the protrusions 914 and 916, the rod 870 can reduce a load applied to the motor assembly 810.

Figure 34:
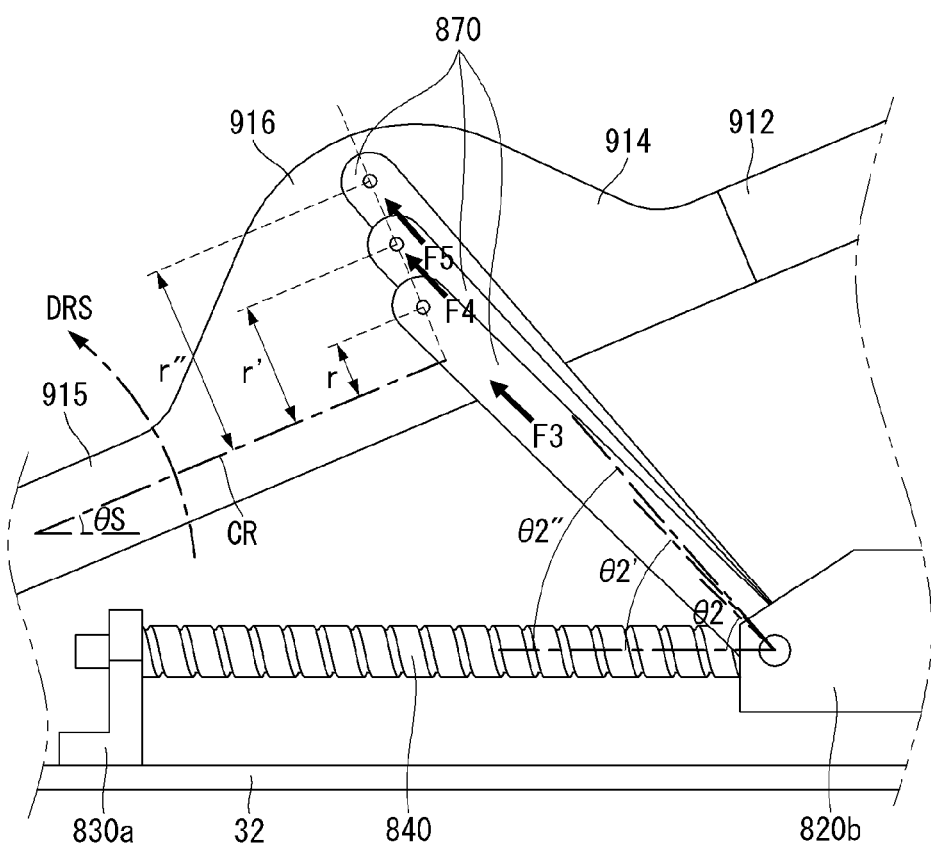

Referring to FIG. 34, the second arm 912 or the third arm 915 may have a central axis CR. When the rod 870 is fastened to the second arm 912 with being spaced from the center axis CR by a distance r, an angle formed by the rod 870 and the second base 32 may be referred to as θ2, and a minimum force of the rod 870 for raising the second arm 912 or the third arm 915 may be referred to as F3. When the rod 870 is fastened to the second arm 912 with being spaced from the center axis CR by a distance r', an angle formed by the rod 870 and the second base 32 may be referred to as θ2', and a minimum force of the rod 870 for raising the second arm 912 or the third arm 915 may be referred to as F4. When the rod 870 is fastened to the second arm 912 with being spaced from the center axis CR by a distance r", an angle formed by the rod 870 and the second base 32 may be referred to as θ2", and a minimum force of the rod 870 for raising the second arm 912 or the third arm 915 may be referred to as F5.

Figure 35:
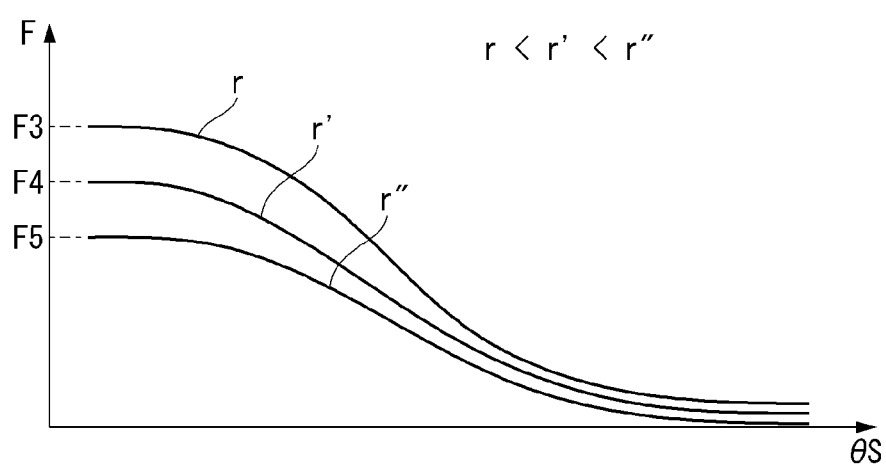

Referring to FIG. 35, when the angles θS are the same, the angle θ2" may be greater than the angle θ2', and the angle θ2' may be greater than the angle θ2. Further, when the angles θS are the same, the force F3 may be greater than the force F4, and the force F4 may be greater than the force F5.

As a distance between the rod 870 and the center axis CR increases when the road 870 is fastened to the second arm 912, a force required to raise the second arm 912 can decrease. Further, when the distance between the rod 870 and the center axis CR increases, a load applied to the motor assembly 810 can decrease.

Figure 36:
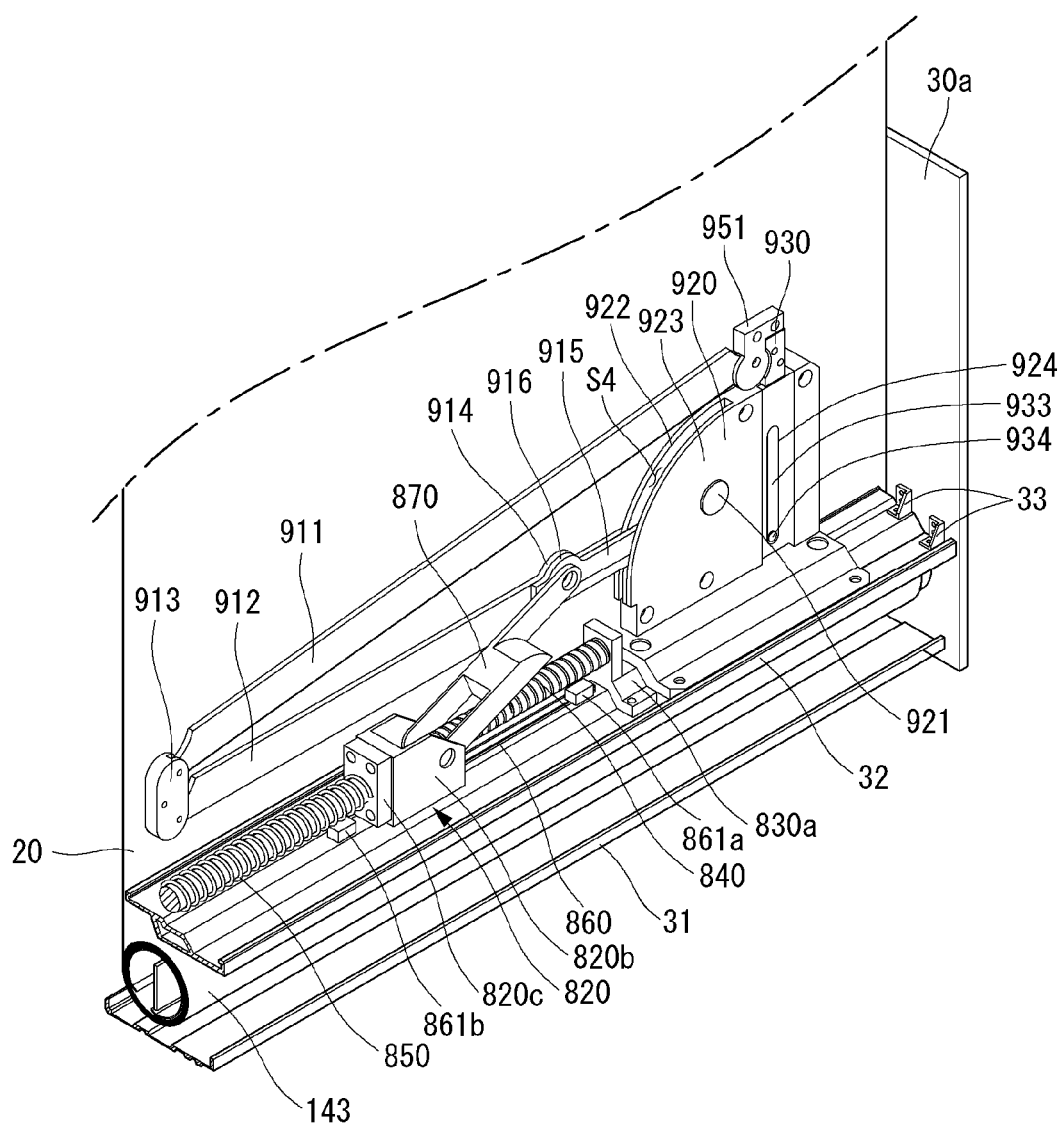

Referring to FIG. 36, the first arm 911 and the second arm 912 may be in contact with or close to the rear surface of the display unit 20. When the first arm 911 and the second arm 912 are in contact with or close to the rear surface of the display unit 20 as described above, the display unit 20 can be stably wound or unwound from the roller. The link mount 920 may include a first part 922 and a second part 923. The first part 922 and the second part 923 may face each other. A space S4 may be formed between the first part 922 and the second part 923. The first part 922 may face the display unit 20. The display unit 20 may be positioned closer to the first part 922 than the second part 923. The second arm 912 may be pivotally connected to a front surface of the first part 922.

A portion of the third arm 915 may be accommodated in the space S4 and may be pivotally connected to the first part 922 or the second part 923.

Figure 37:
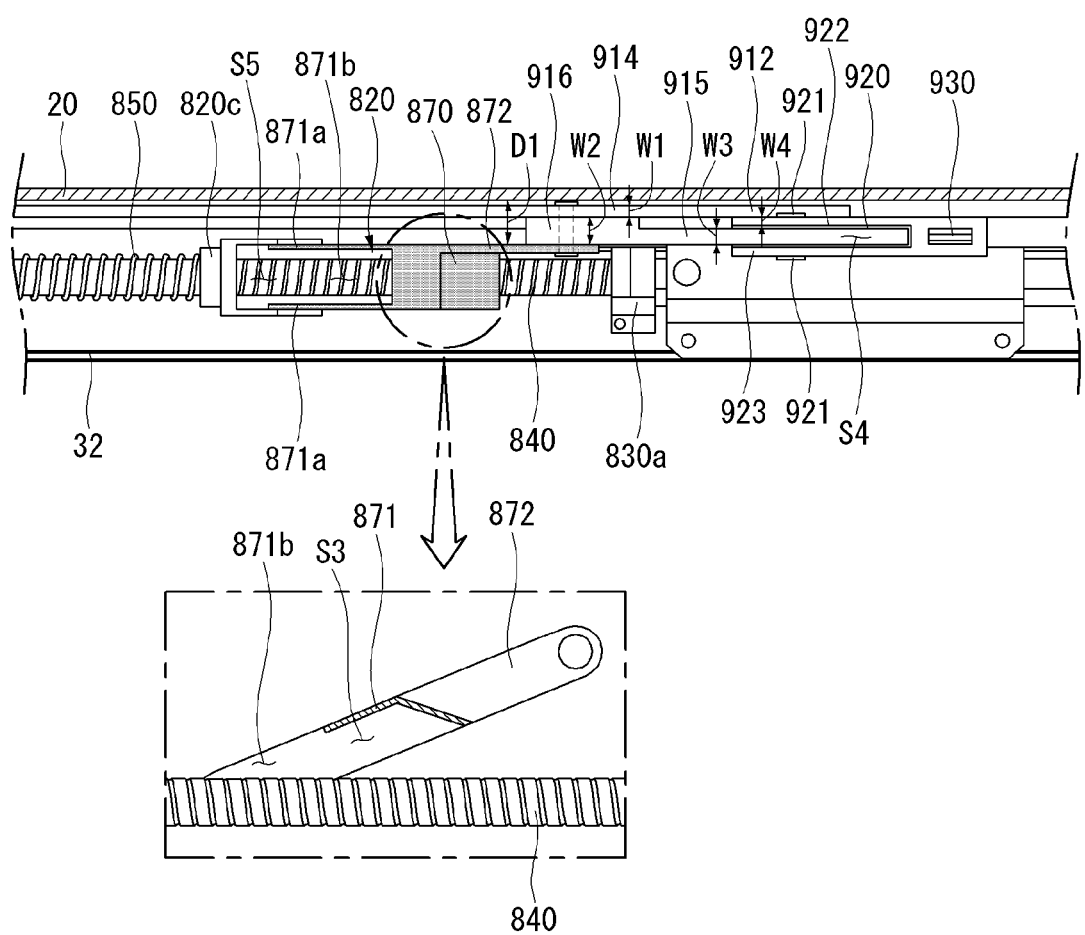

Referring to FIG. 37, the rod 870 may include a first part 871 and a second part 872. The first part 871 may include a connector 871a on one side. The second part 820b of the slide 820 may form a space S5 therein. The connector 871a may be accommodated in the space S5. The connector 871a may be pivotally connected to the second part 820b of the slide 820. The other side of the first part 871 may be connected to one side of the second part 872. The other side of the second part 872 may be pivotally connected to the second arm 912 or the third arm 915. The first part 871 may form a space S3 therein. The first part 871 may include a hole 871b. The lead screw 840 may be accommodated in the hole 871b or the space S3.

A distance between the second part 872 and the display unit 20 may be D. The second arm 912 may have a thickness W1. A portion of the third arm 915 accommodated in the space S4 may have a thickness W3. The thickness W3 may be equal to a distance between the first part 922 and the second part 923. A portion of the third arm 915 that is not accommodated in the space S4 may have a thickness W2. The first part 922 may have a thickness W4. The thickness W2 may be greater than the thickness W3. The thickness W2 may be equal to a sum of the thickness W3 and the thickness W4. The distance D1 may equal a sum of the thickness W1 and the thickness W2.

The second arm 912 may be in contact with or close to the rear surface of the display unit 20, and the third arm 915 may be positioned between the second arm 912 and the second part 872 of the rod 870. The second part 872 can stably transfer power for raising the second arm 912 due to the third arm 915. The second part 872 may be positioned to move forward by a predetermined distance from a symmetrical axis SA of the first part 871, in order to stably raise the second arm 912 or the third arm 915. Hence, a clearance between the second arm 912 and the second part 872 can be minimized.

Figure 38:
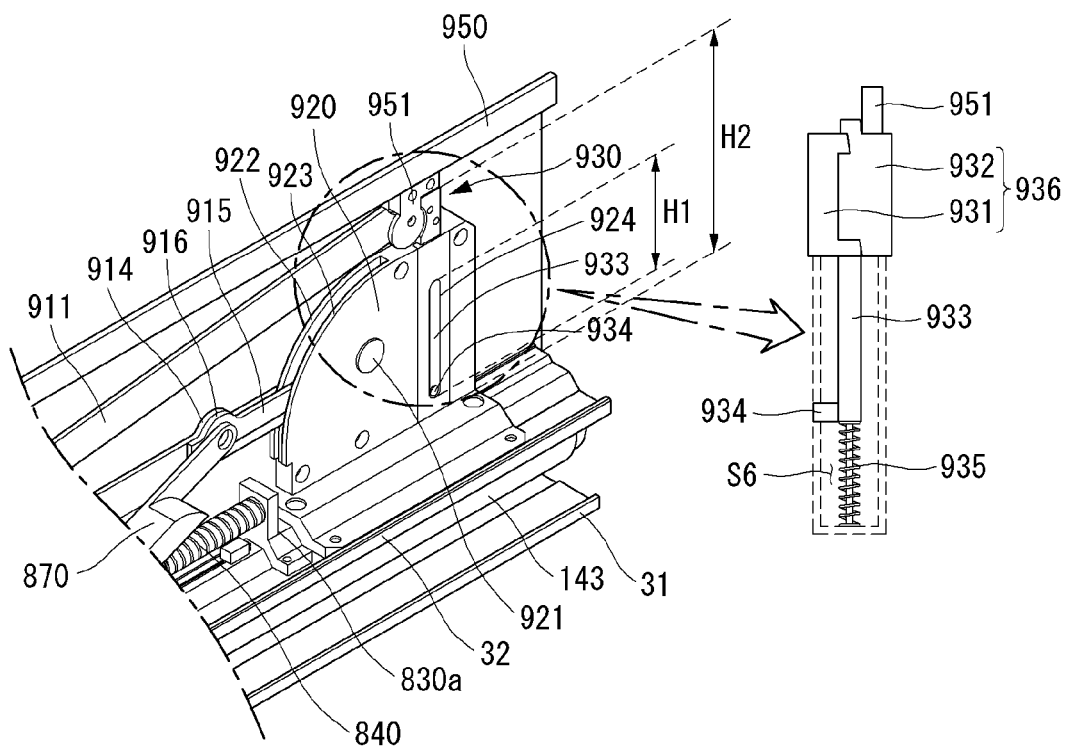

Referring to FIG. 38, a pusher 930 may be mounted on the link mount 920. The pusher 930 may be referred to as a lifter. A first part 931 and a second part 932 may be fastened to each other. The second part 932 may contact the link bracket 951 or may be separated from the link bracket 951. The second part 932 may include a material having high elasticity. The first part 931 may include a material having elasticity less than the elasticity of the second part 932. The first part 931 may include a material having higher rigidity than the second part 932. The first part 931 and the second part 932 may be collectively referred to as a head 936. The head 936 may be positioned on an upper side of the link mount 920.

A third part 933 may be connected to the first part 931. Alternatively, the third part 933 may extend downward from the first part 931. The third part 933 may be referred to as a tail. A fourth part 934 may protrude from the third part 933. The link mount 920 may form a space S6, and the third part 933 may be accommodated in the space S6. The space S6 may be opened upward. The space S6 accommodating the third part 933 may be adjacent to the space S4 accommodating the third arm 915. The second part 932 of the link mount 920 may include a hole 924. The hole 924 may be a hole extended in a vertical direction. A length of the hole 924 may be denoted by H1. The fourth part 934 may be positioned in the hole 924. A spring 935 may be accommodated in the space S6. The spring 935 may be positioned below the third part 933. The spring 935 can provide an elastic force to the third part 933 in the vertical direction.

The space S6 may be referred to as a hole 925. The head 936 may be larger than the hole 925. When the head 936 is caught in the hole 925, a height of the head 936 measured from the second base 32 may be a minimum value. The minimum height of the head 936 may be denoted by H2. When the head 936 has the minimum height, the fourth part 934 may be caught at a lower end of the hole 925. When the head 936 has the minimum height, the spring 935 may be compressed to the maximum. When the head 936 has the minimum height, an elastic force provided by the spring 935 may be a maximum value. When the head 936 has the minimum height, the top case 950 may have a minimum height.

While the pusher 930 is in contact with the link bracket 951, it can provide an elastic force to the link bracket 951. As a result, a load applied to the motor assembly 810 due to the raising of the link 910 can be reduced.

Figure 39:
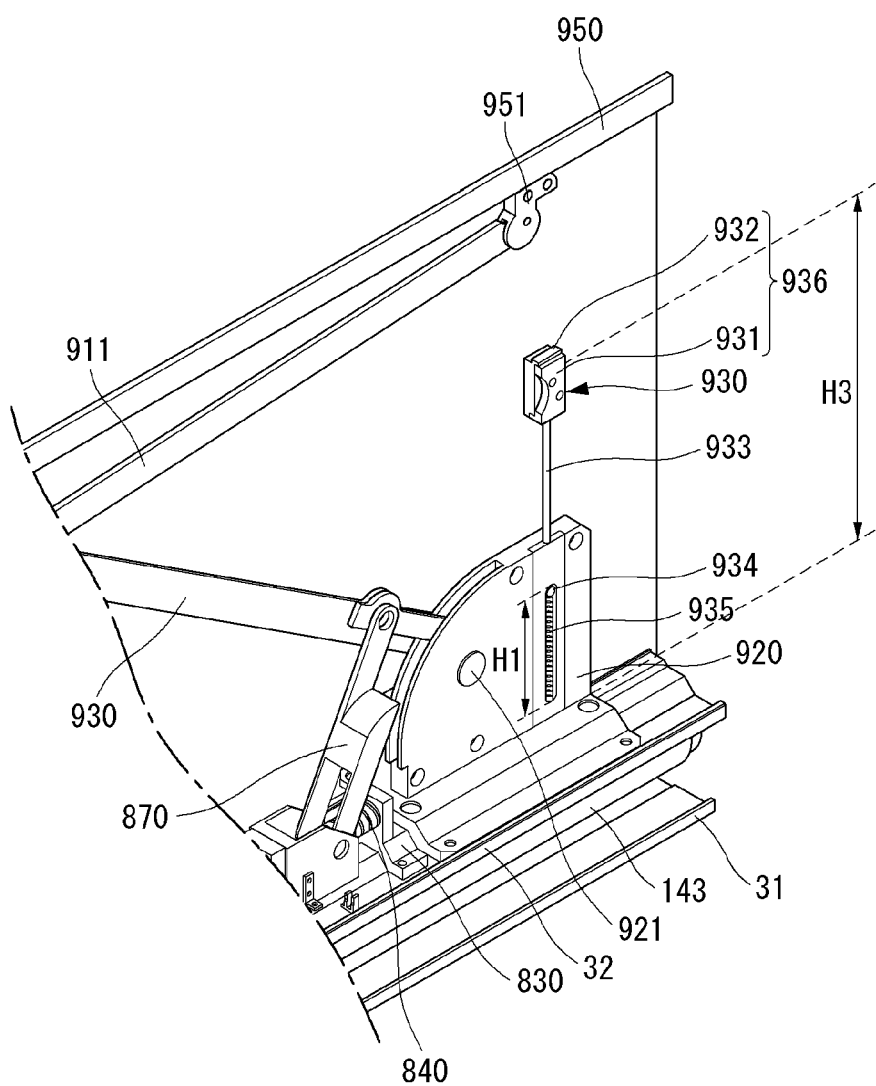
Figure 40:
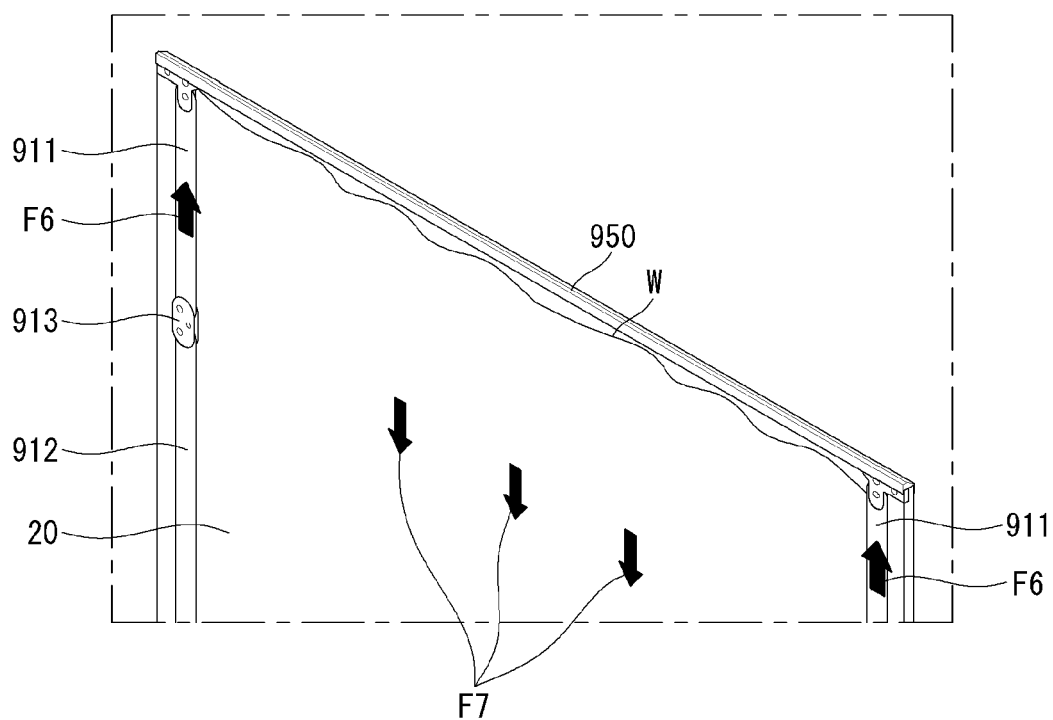
FIGS. 40 to 47 illustrate configuration of an upper structure connected to a display unit according to an embodiment of the disclosure.

Referring to FIG. 39, when the link 910 fully rises, the pusher 930 may be separated from the link bracket 951. When the pusher 930 is separated from the link bracket 951, a height of the head 936 measured from the second base 32 may be a maximum value. The maximum height of the head 936 may be denoted by H3. When the head 936 has the maximum height, the fourth part 934 may be caught at an upper end of the hole 924. When the head 936 has the maximum height, the spring 935 may be extended to the maximum. When the head 936 has the maximum height, the elastic force provided by the spring 935 may be a minimum value. The maximum height H3 of the head 936 may be substantially equal to a sum of the minimum height H2 of the head 936 and the length H1 of the hole 924. Referring to FIG. 40, the display unit 20 may be deployed. The first arm 911, the second arm 912, or the joint 913 may provide a force F6 to the display unit 20 in an upward direction. The display unit 20 between the first arms 911 may receive a repulsive force F7 in a downward direction. Wrinkles W may occur on the display unit 20 due to an imbalance between the forces F6 and F7. The wrinkles W of the display unit 20 may be concentrated on an upper part of the display unit 20.

Figure 41:
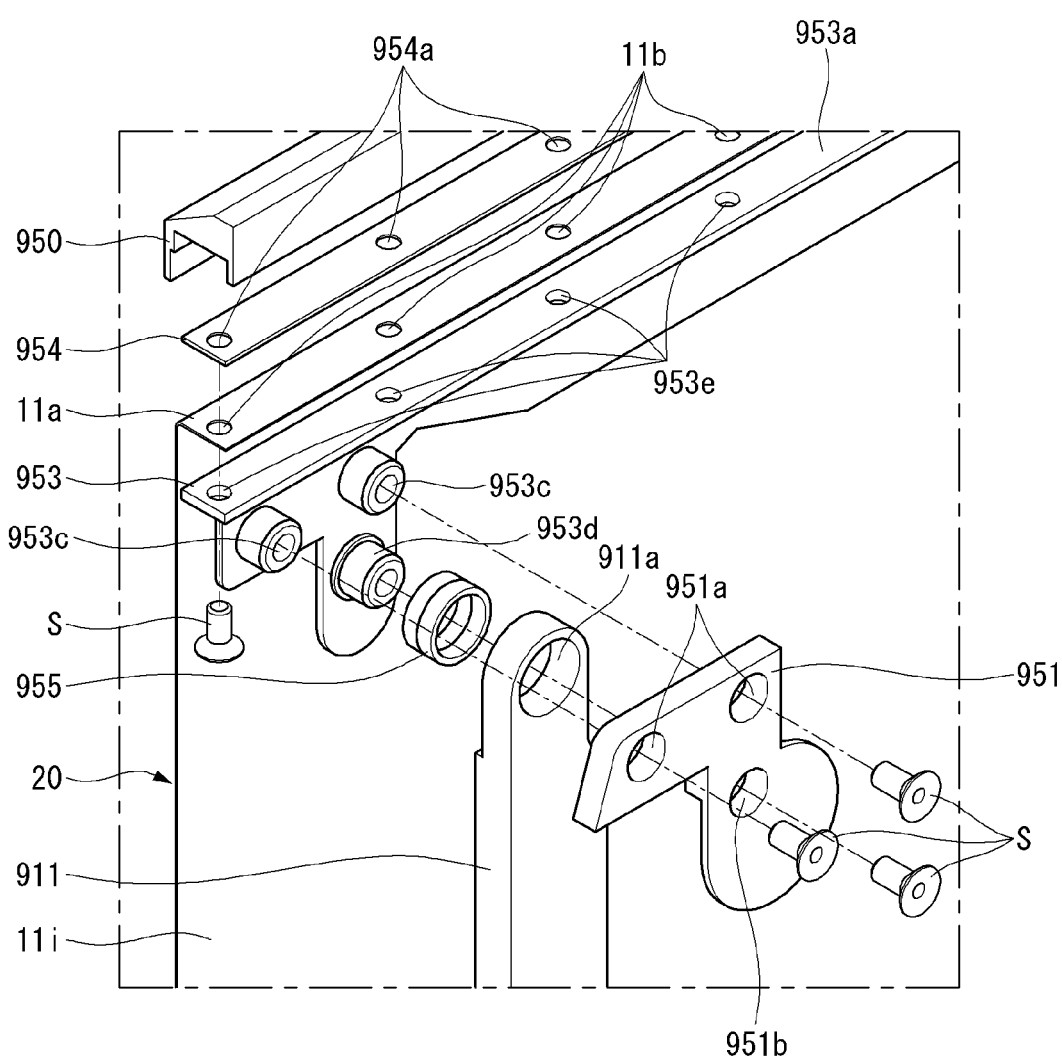

Referring to FIG. 41, the upper part of the display unit 20 may be bent rearward. The upper part of the display unit 20 may be the plate 11 that is not coupled to the display panel 10. An upper part of the plate 11 that is bent rearward may be referred to as a bending portion 11a or a first part 11a. A portion connected to the bending portion 11a may be referred to as a second part 11i. The top case 950 may be positioned on an upper side of the bending portion 11a. A gasket 954 may be positioned between the top case 950 and the bending portion 11a. A lower bar 953 may be positioned below the bending portion 11a. The lower bar 953 may be referred to as a bar. The lower bar 953 may include a horizontal portion 953a and a vertical portion 953b. The gasket 954 may include holes 954a. The bending portion 11a may include holes 11b. The horizontal portion 953a may include holes 953e. The holes 954a of the gasket 954, the holes 11b of the bending portion 11a, and the holes 953e of the horizontal portion 953a may face each other. The screw S may pass through the holes 953e of the horizontal portion 953a, the holes 11b of the bending portion 11a, and the holes 954a of the gasket 954 and may be fastened to the top case 950. The vertical portion 953b may be positioned perpendicular to the horizontal portion 953a. The vertical portion 953b can support the plate 11. The vertical portion 953b may face the link bracket 951. The vertical portion 953b may include a first coupling portion 953c and a second coupling portion 953d that protrude rearward. The second coupling portion 953d may be inserted into a bearing 955. The bearing 955 may be referred to as a ring bearing. The bearing 955 may be inserted into a hole 911a of the first arm 911. The link bracket 951 may include a first hole 951a and a second hole 951b. The screw S may pass through the first hole 951a and may be fastened to the first coupling portion 953c. The screw S may pass through the second hole 951b and may be fastened to the second coupling portion 953d. The link bracket 951 may be fixed to the lower bar 953 by the first hole 951a, the first coupling portion 953c, and the screw S. The first arm 911 may be pivotally connected to the lower bar 953 by the second coupling portion 953d, the bearing 955, the second hole 951b, and the screw S. With this structure, the wrinkles W of the display unit 20 can decrease.

Figure 42:
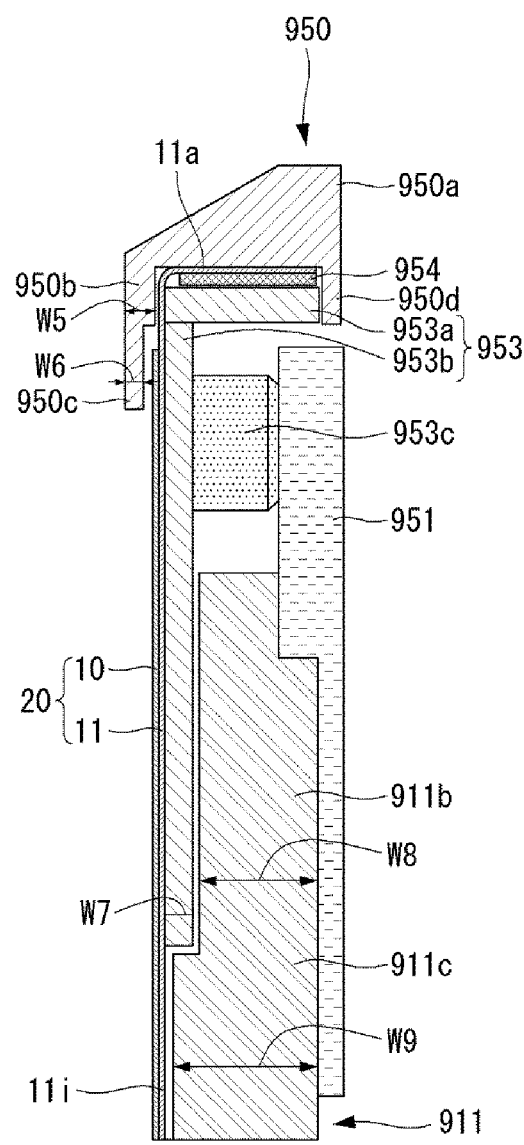

Referring to FIG. 42, a rear wall 950d may be extended to a lower side of a first part 950a. The rear wall 950d may be referred to as a second part. The rear wall 950d may cover the bending portion 11a, the gasket 954, or the horizontal portion 953a. A first front wall 950b may be extended to the lower side of the first part 950a. The first front wall 950b may be referred to as a third part. The first front wall 950b may cover the upper part or the second part 11i of the plate 11. A second front wall 950c may be extended to the lower side of the first front wall 950b. The second front wall 950c may be referred to as a fourth part. The second front wall 950c can cover the upper part of the display panel 10. The second front wall 950c can cover the wrinkles W that may occur on the upper part of the display panel 10. A thickness W5 of the first front wall 950b may be greater than a thickness W6 of the second front wall 950c. The thickness W5 of the first front wall 950b may be substantially equal to a sum of the thickness W6 of the second front wall 950c and the thickness of the display panel 10.

The first arm 911 may include a first part 911b facing the vertical portion 953b and a second part 911c facing the plate 11. A thickness W9 of the second part 911c may be substantially equal to a sum of a thickness W7 of the vertical portion 953b and a thickness W8 of the first part 911b. The second part 911c is in contact with or adjacent to the display unit 20 and thus can stably support the display unit 20.

Figure 43:
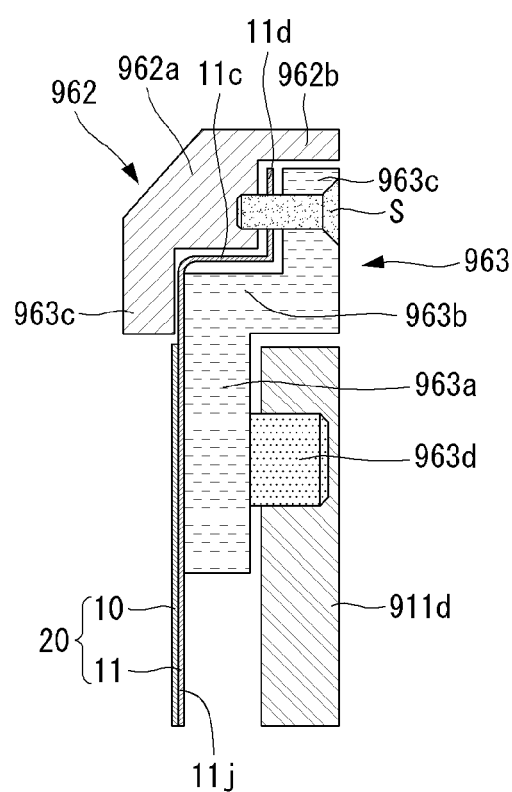

Referring to FIG. 43, a top case 962 may include a first part 962a, a second part 962b extended rearward from the first part 962a, and a third part 962c extended downward from the first part 962a. The third part 962c may be referred to as a front wall. The third part 962c may face the plate 11. A lower bar 963 may include a first part 963a facing the display unit 20, a second part 963b extended rearward from the first part 963a, and a third part 963c extended upward from the second part 963b. The first part 963a may be referred to as a vertical portion. The second part 963b may be referred to as a horizontal portion. The third part 963c may be referred to as a vertical portion. The first part 963a may include a connection portion 963d protruding rearward. A first arm 911d may be pivotally connected to the connection portion 963d. The plate 11 may include a first bending portion 11c between the first part 962a of the top case 962 and the second part 963b of the lower bar 963. The plate 11 may include a second bending portion 11d between the second part 962b of the top case 962 and the third part 963c of the lower bar 963. The first bending portion 11c may be referred to as a first part, and the second bending portion 11d may be referred to as a second part. A third part 11j may be connected to the first part 11c. The screw S may pass through the third part 963c of the lower bar 963 and the second bending portion 11d and may be fastened to the first part 962a of the top case 962. The gasket (not shown) may be positioned between the top case 962 and the lower bar 963.

Figure 44:
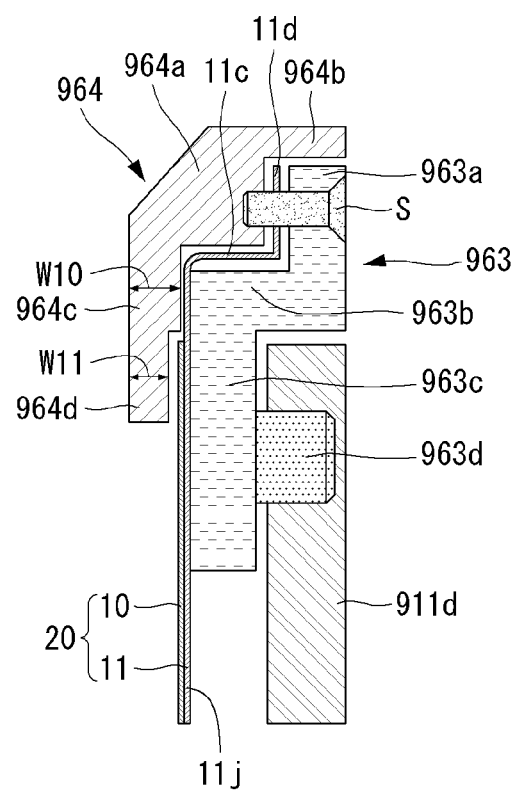

Referring to FIG. 44, a top case 964 may include a first part 964a, a second part 964b extended rearward from the first part 964a, and a third part 964c extended downward from the first part 964a or a fourth part 964d extended downward from the third part 964 c. The third part 964c may be referred to as a first front wall, and the fourth part 964d may be referred to as a second front wall. A thickness W10 of the third part 964c may be substantially equal to a sum of a thickness W11 of the fourth part 964d and the thickness of the display panel 10. The third part 964c may face the plate 11. The fourth part 964d may face the display panel 10. A lower bar 963 may include a first part 963a facing the display unit 20, a second part 963b extended rearward from the first part 963a, and a third part 963c extended upward from the second part 963b. The first part 963a may include a connection portion 963d protruding rearward. The first arm 911d may be pivotally connected to the connection portion 963d. The plate 11 may include a first bending portion 11c between the first part 964a of the top case 964 and the second part 963b of the lower bar 963. The plate 11 may include a second bending portion 11d between the second part 964b of the top case 964 and the third part 963c of the lower bar 963. The screw S may pass through the third part 963c of the lower bar 963 and the second bending portion 11d and may be fastened to the first part 964a of the top case 9642. The gasket (not shown) may be positioned between the top case 964 and the lower bar 963.

Figure 45:
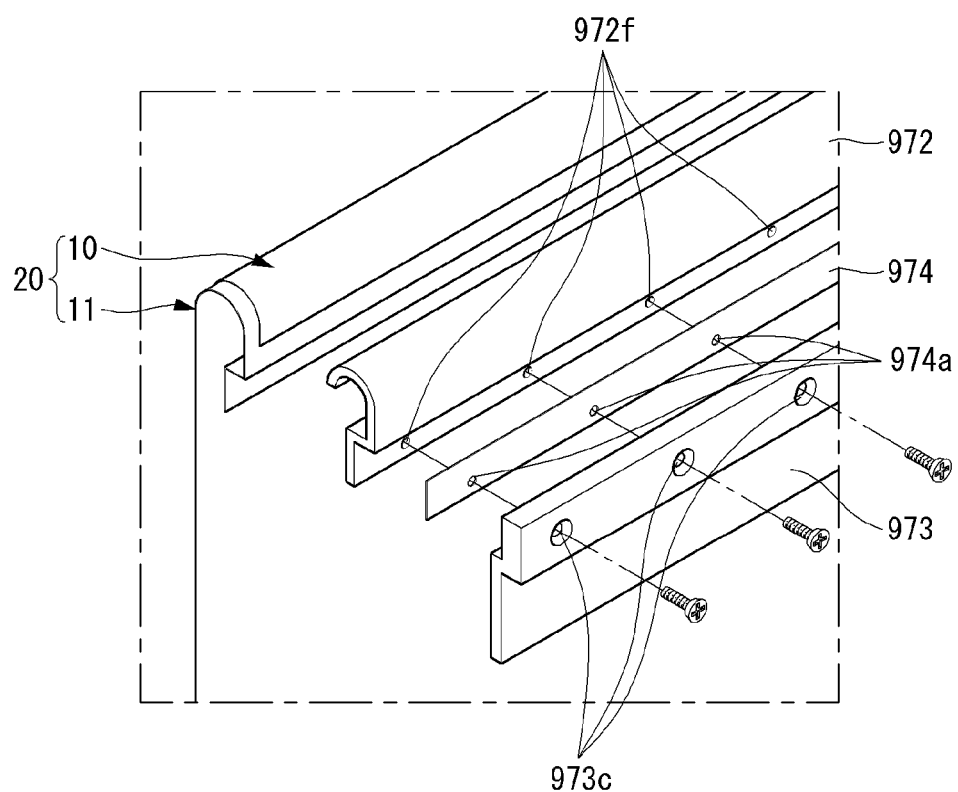

Referring to FIG. 45, the display unit 20 may be bent rearward. The display unit 20 may wrap an upper bar 972. The upper bar 972 may be referred to as a bar, a top bar, or a top. A lower bar 973 may be positioned in the rear of the upper bar 972. The display unit 20 may be positioned between the upper bar 972 and the lower bar 973. A gasket 974 may be positioned between the upper bar 972 and the lower bar 973. The upper bar 972 may include holes 972f. The gasket 974 may include holes 974a. The lower bar 973 may include holes 973c. The screw S may pass through the holes 973c of the lower bar 973 and the holes 974a of the gasket 974 and may be fastened to the holes 972f of the upper bar 972.

Figure 46:
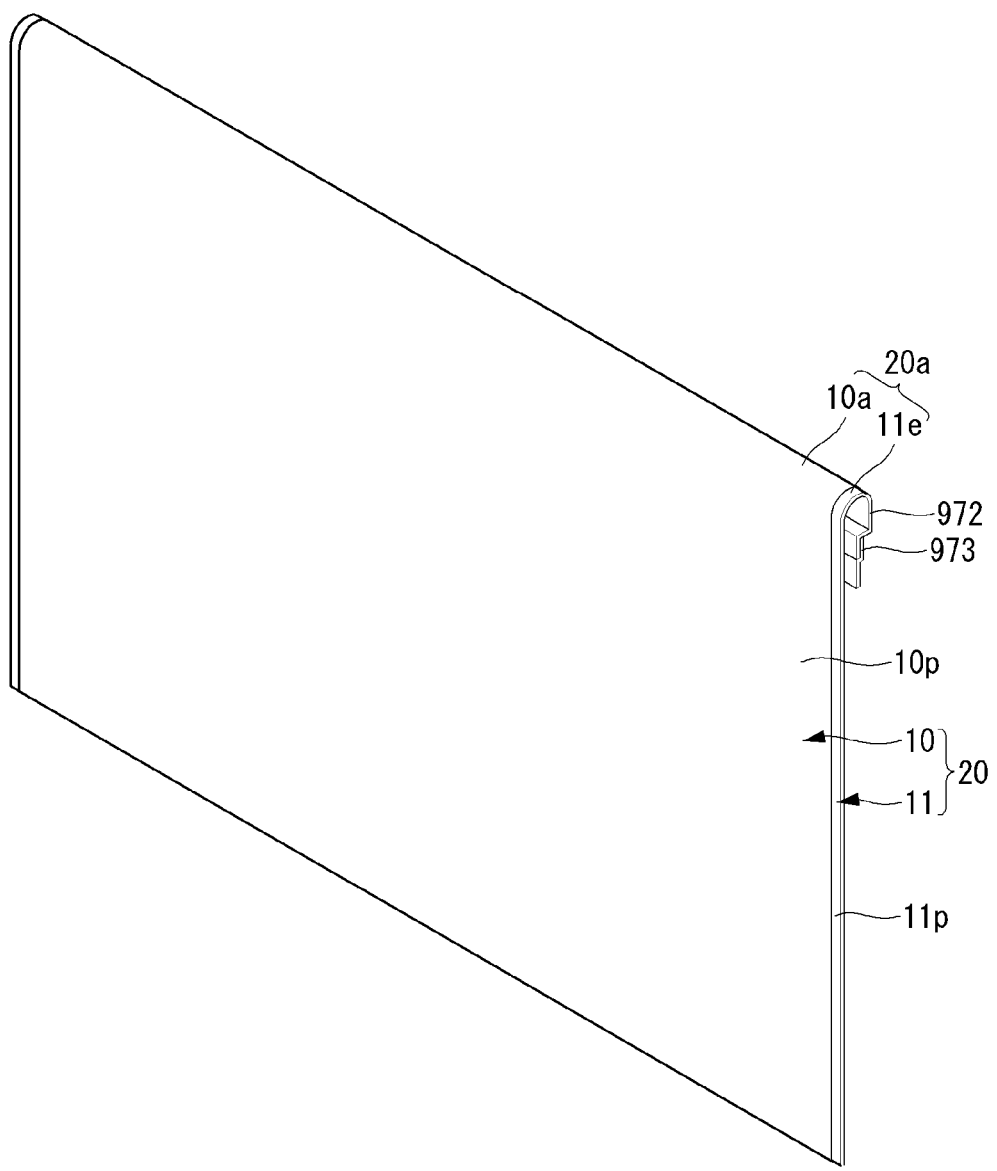

Referring to FIG. 46, the upper end of the display unit 20 may be bent rearward. A portion of the display unit 20 that is rounded along the upper bar 972 may be referred to as a bending portion 20a. The bending portion 20a may include a bending portion 10a of the display panel 10 and a first bending portion 11e of the plate 11. The bending portion 10a may be connected to a first part 10p. The bending portion 10a may be referred to as a second part 10a. The upper bar 972 or the lower bar 973 may be surrounded by the display unit 20 and may not be exposed to the outside.

Figure 47:
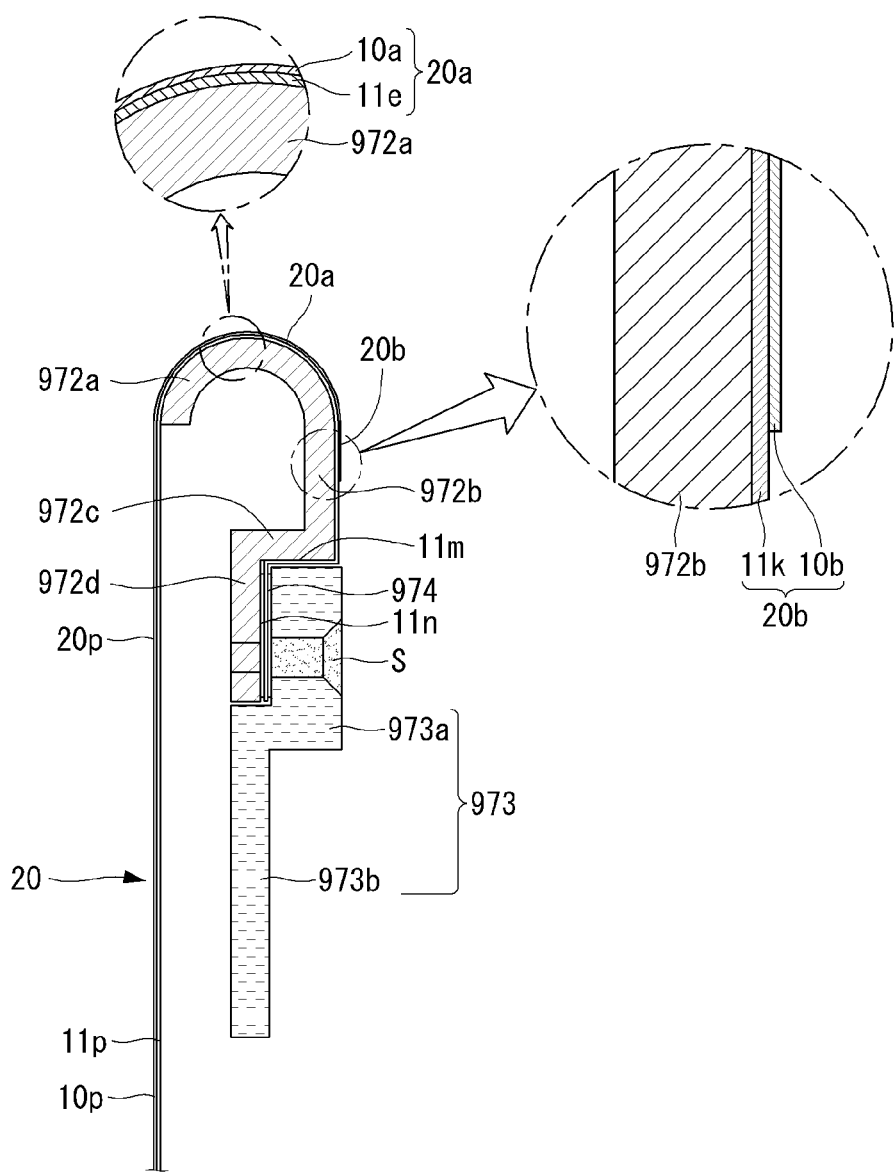

Referring to FIG. 47, the display unit 20 may include a first flat portion 20P, a bending portion 20a which is bent rearward from the first flat portion 20P and is rounded, and a second flat portion 20b facing the first flat portion 20P. A first part 972a may form a curved surface. A second part 972b may be extended from the first part 972a and may face the first flat portion 20P. A third part 972c may be extended forward from the second part 972b. A fourth part 972d may be extended from the third part 972c and may face the first flat portion 20P. The bending portion 20a may be bent along the first part 972a. The second flat portion 20b may be extended along the second part 972b.

A first part 973a of the lower bar 973 may be fastened to the fourth part 972d of the upper bar 972. A second part 973b may be extended from the first part 973a to face the first flat portion 20P and may be positioned below the upper bar 972. The link 910 may be pivotally connected to the front surface or the rear surface of the second part 973b.

The display panel 10 may include a first part 10p facing the front, a bending portion 10a that is connected to the first part 10p and is bent along the first part 972a of the upper bar 972, and a horizontal portion 10b extended along the second part 972b of the upper bar 972. The horizontal part 10b may be referred to as a third part.

The plate 11 may include a first part 11p facing the front, a first bending portion 11e that is connected to the first part 11p and is bent along the first part 972a of the upper bar 972, and a horizontal portion 11k extended along the second part 972b of the upper bar 972. A second bending portion 11m may be bent forward from the horizontal portion 11k and may be positioned between the third part 972c of the upper bar 972 and the first part 973a of the lower bar 973. A third bending portion 11n may be bent downward from the second bending portion 11m and may be positioned between the fourth part 972d of the upper bar 972 and the first part 973a of the lower bar 973. The gasket 974 may be positioned between the third bending portion 11n and the first part 973a of the lower bar 973. The first bending portion 11e may be referred to as a second part. The horizontal portion 11k may be referred to as a third part. The second bending portion 11m may be referred to as a fourth part. The third bending portion 11n may be referred to as a fifth part.

Figure 48:
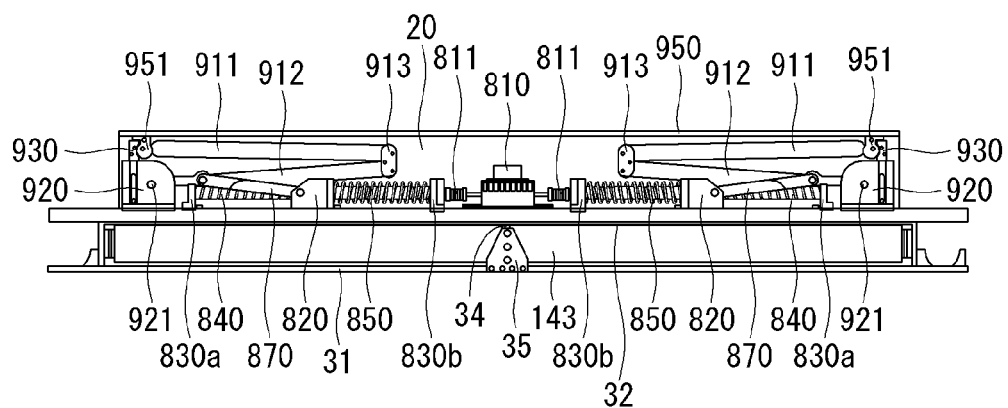
FIGS. 48 to 59 illustrate a display device according to an embodiment of the disclosure.

Referring to FIG. 48, the display unit 20 may be in a state of being fully wound on the roller 143. The display device 100 may be symmetrical to the left and right with respect to the motor assembly 810. A height of the top case 950 may be a minimum value. The slide 820 may be at a position closest to the inner bearing 830b. The slide 820 may be in a state of being caught on the first stopper 861b. The spring 850 may be in a fully compressed state. The pusher 930 may be in contact with the link bracket 951. A height of the pusher 930 may be a minimum value.

Figure 49:
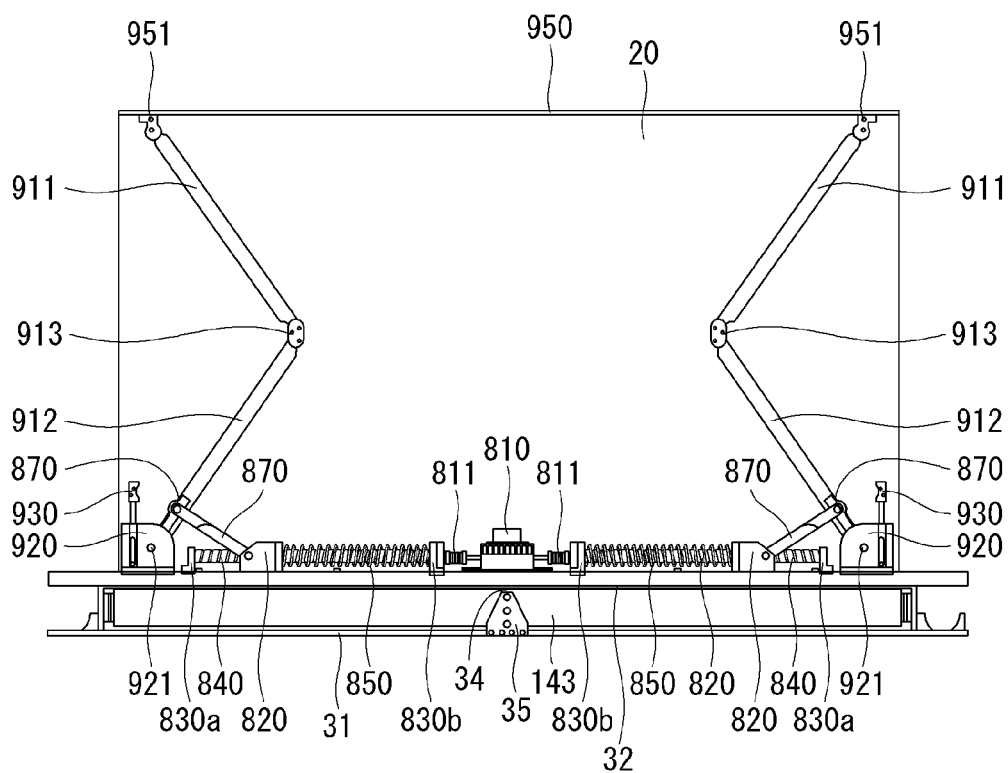

Referring to FIG. 49, the display unit 20 may be in a state in which about half of the display unit 20 is wound on the roller 143. The display device 100 may be symmetrical to the left and right with respect to the motor assembly 810. The display unit 20 may be in a state in which about half of the display unit 20 is unwound from the roller 143. The slide 820 may be positioned between the first stopper 861b and the second stopper 861a. The pusher 930 may be separated from the link bracket 951. A height of the pusher 930 may be a maximum value.

Figure 50:
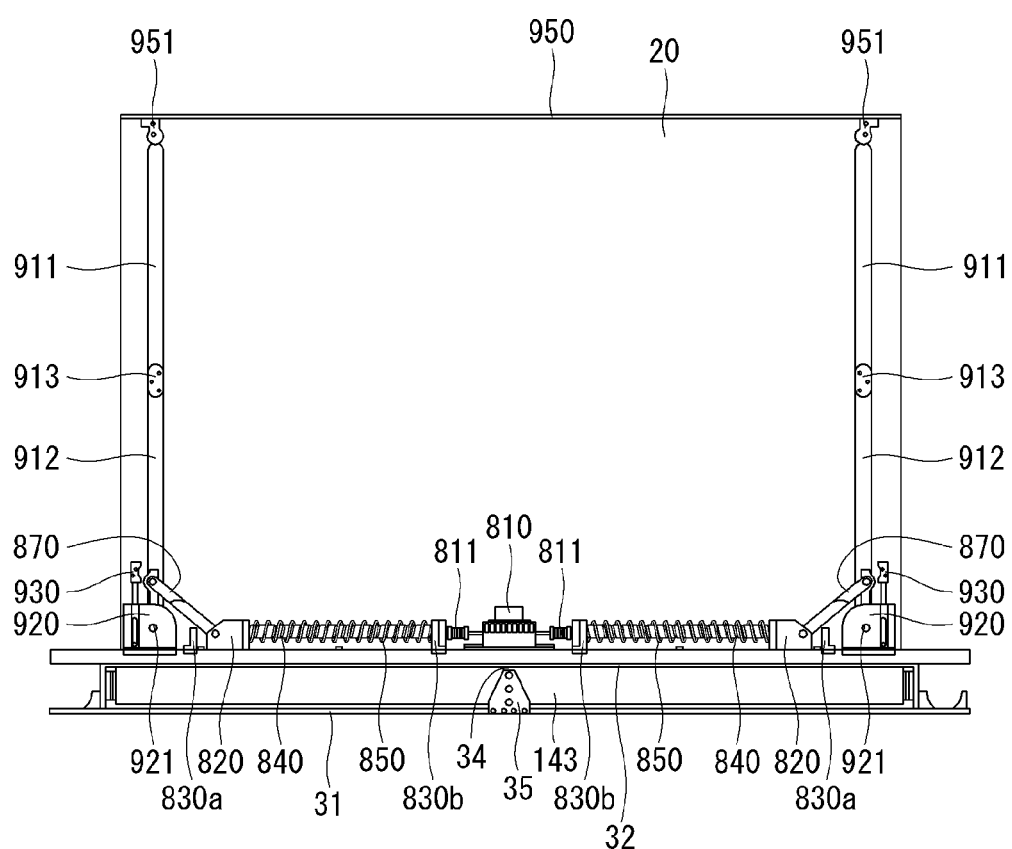

Referring to FIG. 50, the display unit 20 may be in a state of being fully unwound from the roller 143. The display device 100 may be symmetrical to the left and right with respect to the motor assembly 810. A height of the top case 950 may be a maximum value. The slide 820 may be at a position closest to the outer bearing 830a. The slide 820 may be in a state of being caught on the second stopper 861a. The spring 850 may be in a fully extended state. The pusher 930 may be separated from the link bracket 951. A height of the pusher 930 may be a maximum value.

Figure 51:
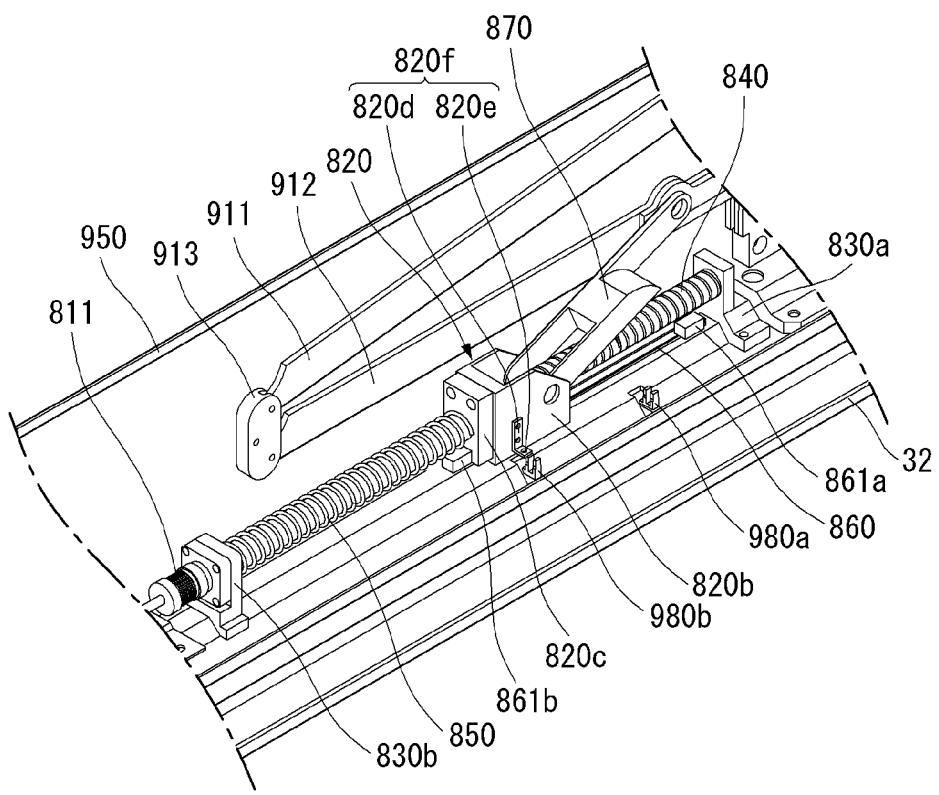
Figure 52:
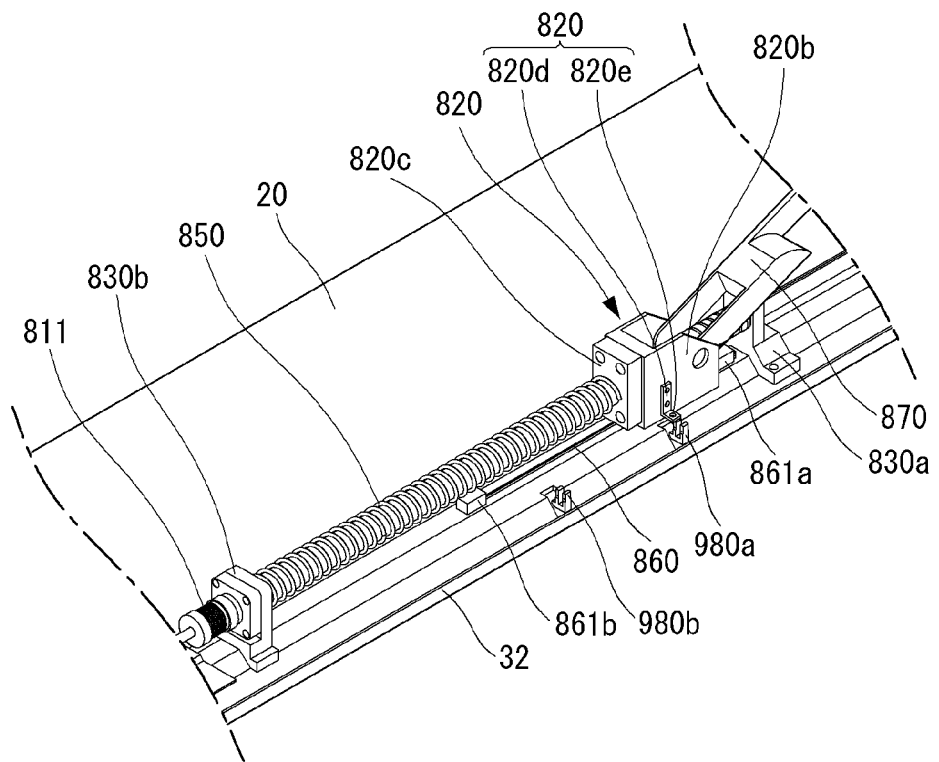

Referring to FIGS. 51 and 52, a first sensor 980b and a second sensor 980a may be mounted on the second base 32. The second part 820b of the slide 820 may include a to-be-sensed portion 820f on a rear surface thereof. When the slide 820 is caught on the first stopper 861b, the first sensor 980b can sense the to-be-sensed portion 820f. When the slide 820 is positioned as close as possible to the inner bearing 830b, the first sensor 980b can sense the to-be-sensed portion 820f. When the spring 850 is fully compressed, the first sensor 980b can sense the to-be-sensed portion 820f. When the slide 820 is caught on the second stopper 861a, the second sensor 980a can sense the to-be-sensed portion 820f. When the slide 820 is positioned as close as possible to the outer bearing 830a, the second sensor 980a can sense the to-be-sensed portion 820f. When the spring 850 is fully extended, the second sensor 980a can sense the to-be-sensed portion 820f. The first sensor 980b may not contact the to-be-sensed portion 820f. The second sensor 980a may not contact the to-be-sensed portion 820f.

The to-be-sensed portion 820f may include a first part 820d fastened to the slide 820 and a second part 820e bent rearward from the first part 820d. The first sensor 980b or the second sensor 980a may sense the second part 820e. As the slide 820 moves, the second part 820e may pass over the first sensor 980b or the second sensor 980a. The first sensor 980b or the second sensor 980a may sense that the second part 820e passes it.

The first sensor 980b or the second sensor 980a may be a limit switch. When the first sensor 980b or the second sensor 980a is the limit switch, the to-be-sensed portion 820f may contact the first sensor 980b or the second sensor 980a.

When the to-be-sensed portion 820f is sensed by the first sensor 980b or the second sensor 980a, the motor assembly 810 may stop the operation.

Figure 53:
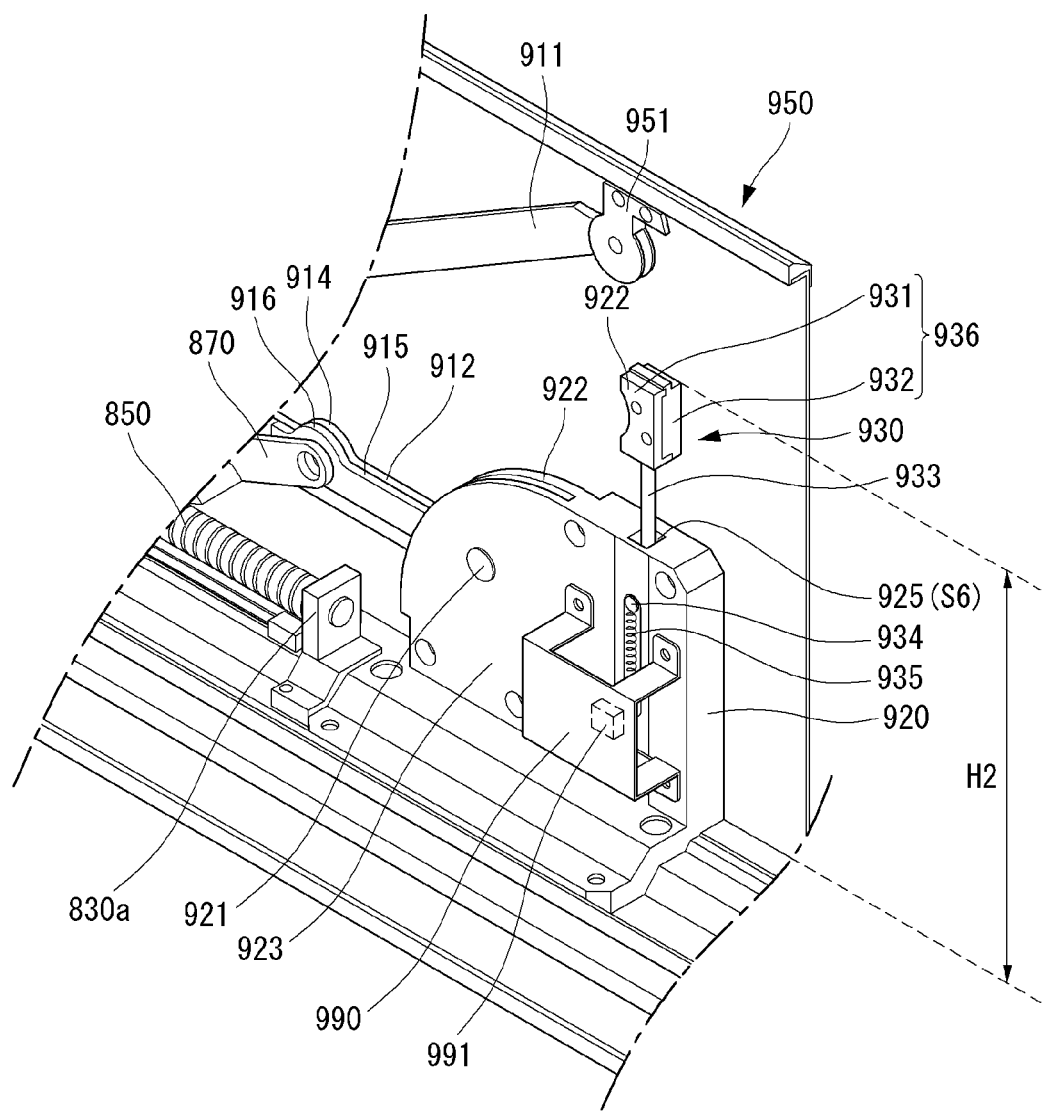

Referring to FIG. 53, when the pusher 930 is separated from the link bracket 951, the head 936 may have a maximum height H3 measured from the second base 32. When the head 936 has the maximum height, the fourth part 934 may be caught on an upper end of the hole 924. The fourth part 934 may be referred to as a to-be-sensed portion or a projection. A bracket 990 may be mounted on the second part 923 of the link mount 950. A sensor 991 may be mounted on the bracket 990. The sensor 991 may face the second part 923. The sensor 991 may be spaced from the second part 923. When the sensor 991 faces the to-be-sensed portion 934, the sensor 991 can sense the to-be-sensed portion 934. The sensor 991 may not contact the to-be-sensed portion 934.

Alternatively, at least a portion of the sensor 991 may be inserted into the hole 924. The sensor 991 may be a limit switch. When the sensor 991 is the limit switch, the sensor 991 may contact the to-be-sensed portion 934. When the sensor 991 contacts the to-be-sensed portion 934, the sensor 991 can sense the to-be-sensed portion 934. When the to-be-sensed portion 934 is sensed by the sensor 991, the motor assembly 810 may stop the operation.

Figure 54:
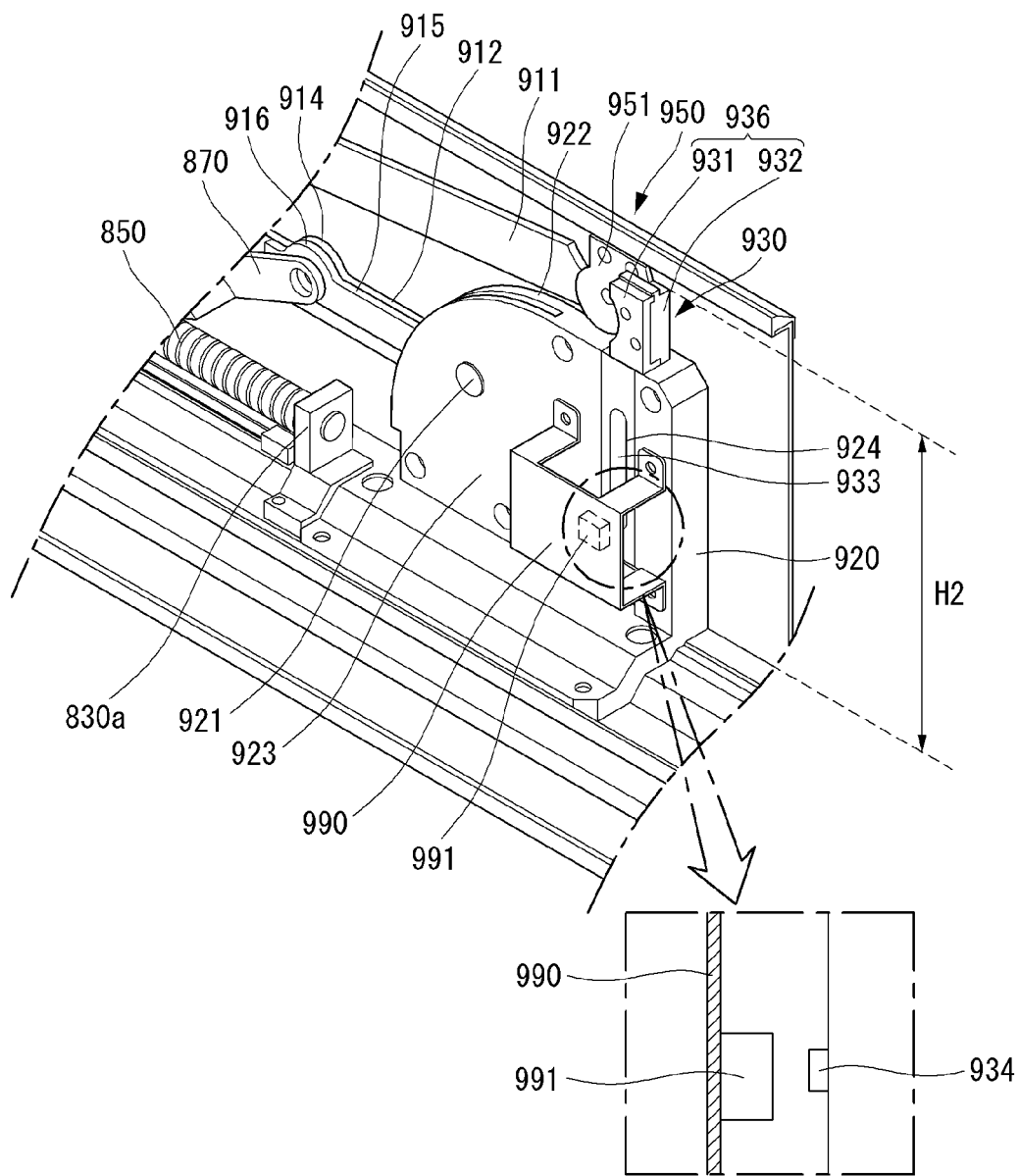

Referring to FIG. 54, when the head 936 is caught in the hole 925, the head 936 may have a minimum height H2 from the second base 32. When the head 936 has the minimum height, the to-be-sensed portion 934 may be caught on a lower end of the hole 924. When the to-be-sensed portion 934 is caught on the lower end of the hole 924, the sensor 991 can face or contact the to-be-sensed portion 934 and can sense the to-be-sensed portion 934. When the to-be-sensed portion 934 is sensed by the sensor 991, the motor assembly 810 may stop the operation.

Figure 55:
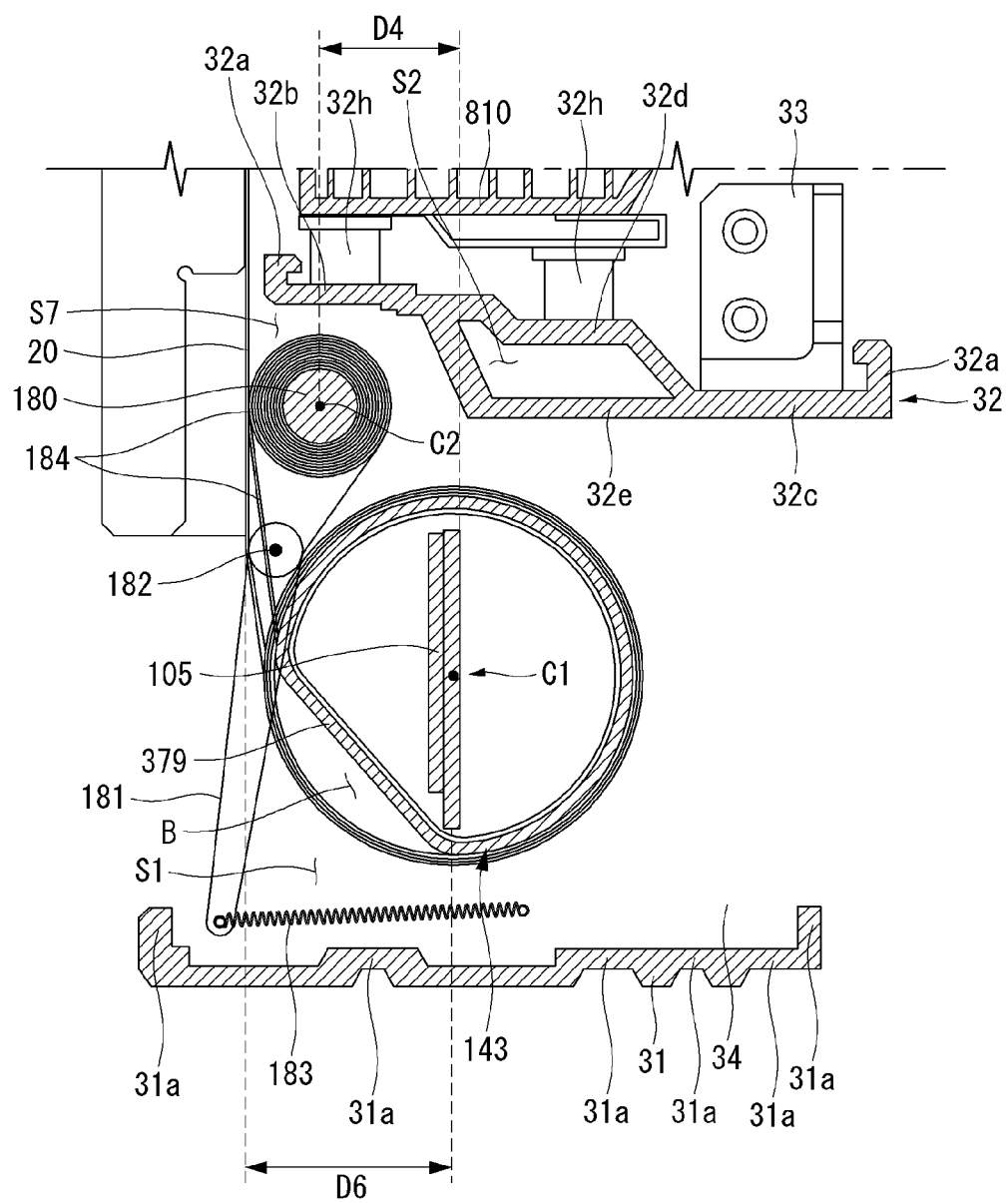

Referring to FIG. 55, a first auxiliary roller 180 may be positioned between the second base 32 and the roller 143. The first auxiliary roller 180 may be referred to as a roller. The first auxiliary roller 180 may be positioned in the rear of the display unit 20. A space S7 may be formed below the first part 32b of the second base 32. The first auxiliary roller 180 may be positioned in the space S7. The first auxiliary roller 180 may be coupled to an arm 181. The arm 181 may rotate about a pin bolt 182. A lower end of the arm 181 may be connected to one side of the spring 183. The other side of the spring 183 may be fixed to the inside of the housing 30.

A protective sheet 184 may be connected to the first auxiliary roller 180 and the roller 143. The protective sheet 184 may be wound or unwound from the first auxiliary roller 180. The protective sheet 184 may be wound or unwound from the roller 143. The protective sheet 184 may be made of a material such as cloth, woven fabric, or nonwoven fabric. The first auxiliary roller 180 may rotate in a direction opposite to a rotation direction of the roller 143. When the display unit 20 is unwound from the roller 143, the protective sheet 184 can be wound on the first auxiliary roller 180. When the display unit 20 is wound on the roller 143, the protective sheet 184 can be unwound from the first auxiliary roller 180. The protective sheet 184 can be wound on the roller 143 together with the display unit 20. The protective sheet 184 may be positioned between the display unit 20 wound on the roller 143. The protective sheet 184 can prevent the display unit 20 from being damaged by a friction. The protective sheet 184 can prevent the display panel 10 from being damaged by a friction between the display panel 10 and the plate 11. The display unit 20 may be deployed upward or downward at a position spaced from a center C1 of the roller 143 by a distance D6. When the display unit 20 is fully unwound from the roller 143, the display unit 20 may be deployed downward at the position spaced from the center C1 of the roller 143 by the distance D6. The first auxiliary roller 180 on which the protective sheet 184 is wound may contact the display unit 20. The spring 183 can adjust a position of the arm 181 so that the first auxiliary roller 180 on which the protective sheet 184 is wound contacts the display unit 20. The center C1 of the roller 143 and a center C2 of the first auxiliary roller 180 may be spaced from each other by a distance D4 when viewed in the vertical direction.

Figure 56:
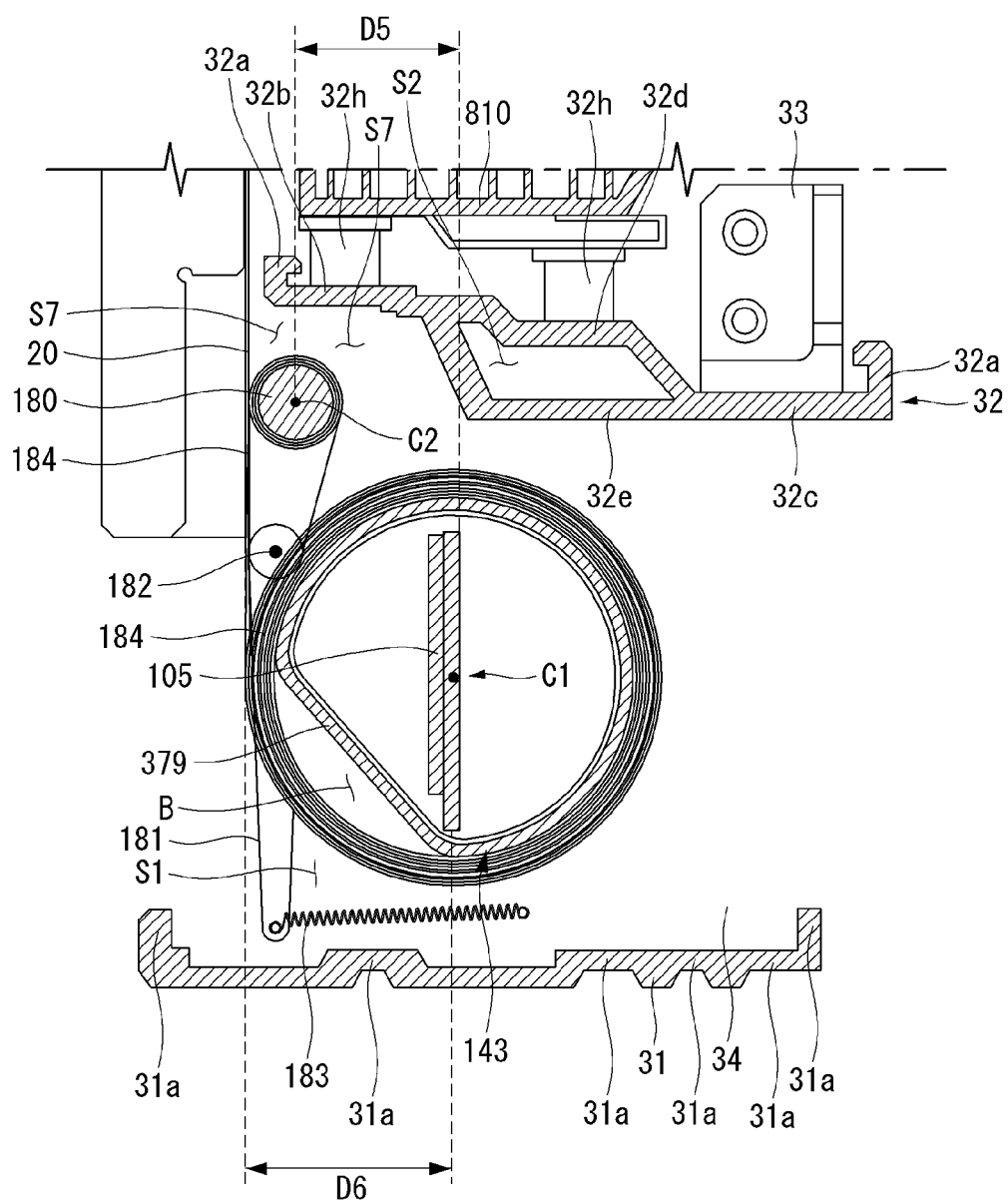

Referring to FIG. 56, when the display unit 20 is fully wound on the roller 143, the display unit 20 may be deployed upward at the position spaced from the center C1 of the roller 143 by the distance D6. The first auxiliary roller 180 from which the protective sheet 184 is fully unwound may contact the display unit 20. The spring 183 can adjust a position of the arm 181 so that the first auxiliary roller 180 from which the protective sheet 184 is unwound contacts the display unit 20. The center C1 of the roller 143 and the center C2 of the first auxiliary roller 180 may be spaced from each other by a distance D5 when viewed in the vertical direction. The distance D5 may be greater than the distance D4.

Figure 57:
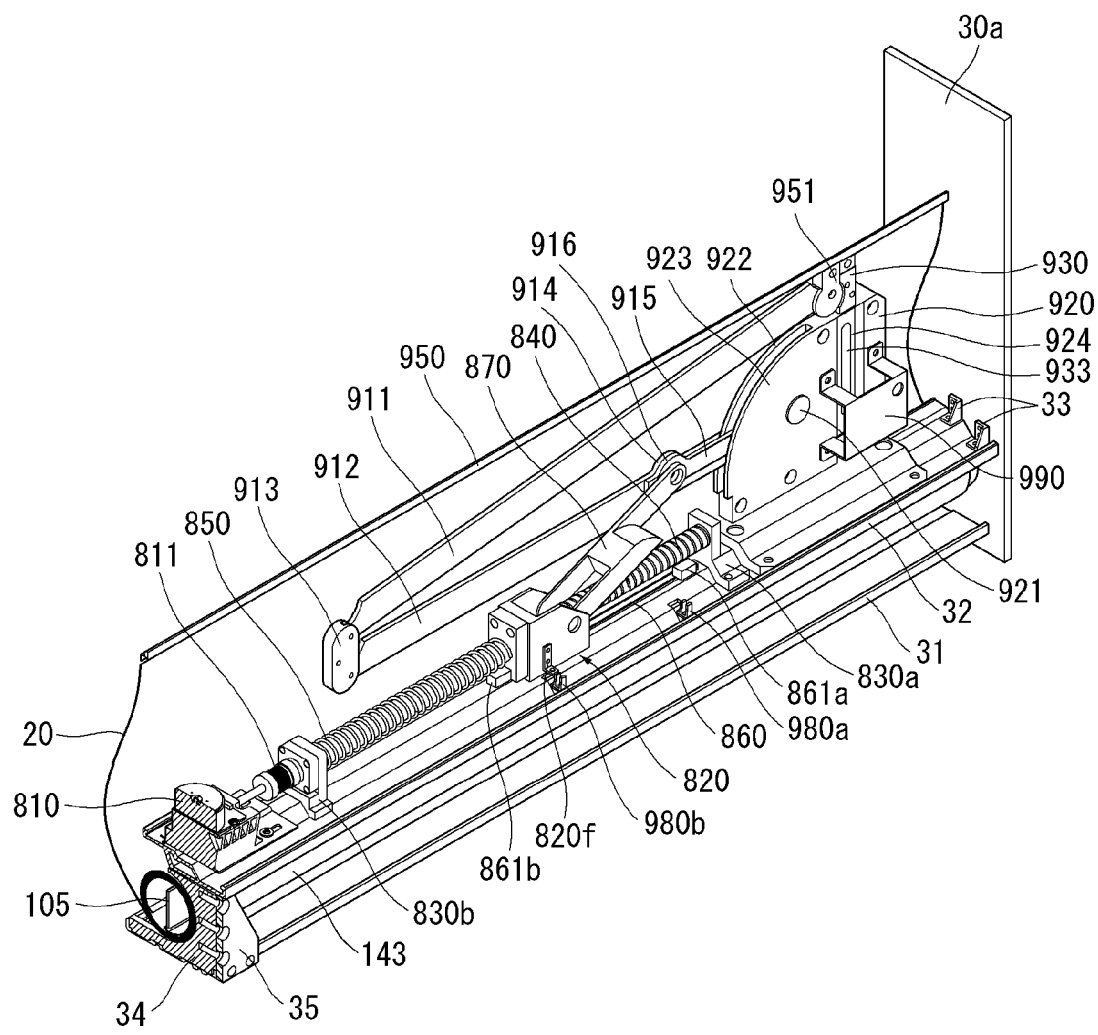

Referring to FIG. 57, the display unit 20 may be bent by the weight of the display unit 20 or the weight of the top case 950. In particular, when the display unit 20 is wound on the roller 143, the display unit 20 may be bent forward.

Figure 58:
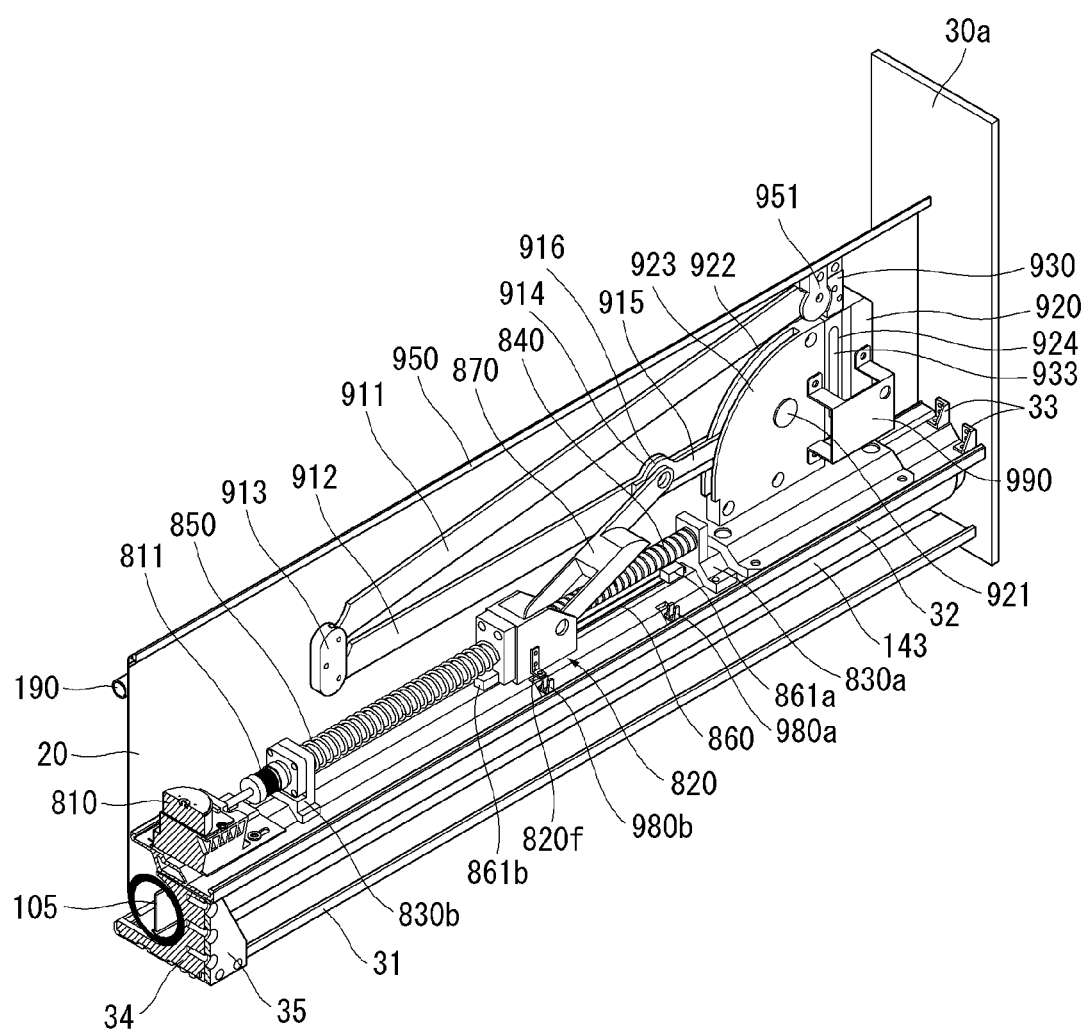

Referring to FIG. 58, a second auxiliary roller 190 may be positioned in front of the display unit 20. The second auxiliary roller 190 may be referred to as a roller. The second auxiliary roller 190 may contact the display unit 20. The second auxiliary roller 190 may contact the display unit 20 when the display unit 20 is wound or unwound from the roller 143. The second auxiliary roller 190 can rotate due to a friction between the second auxiliary roller 190 and the display unit 20. The second auxiliary roller 190 can prevent the display unit 20 from being bent forward. The display unit 20 is not bent owing to the second auxiliary roller 190 and thus can be flat wound or unwound from the roller 143.

Figure 59:
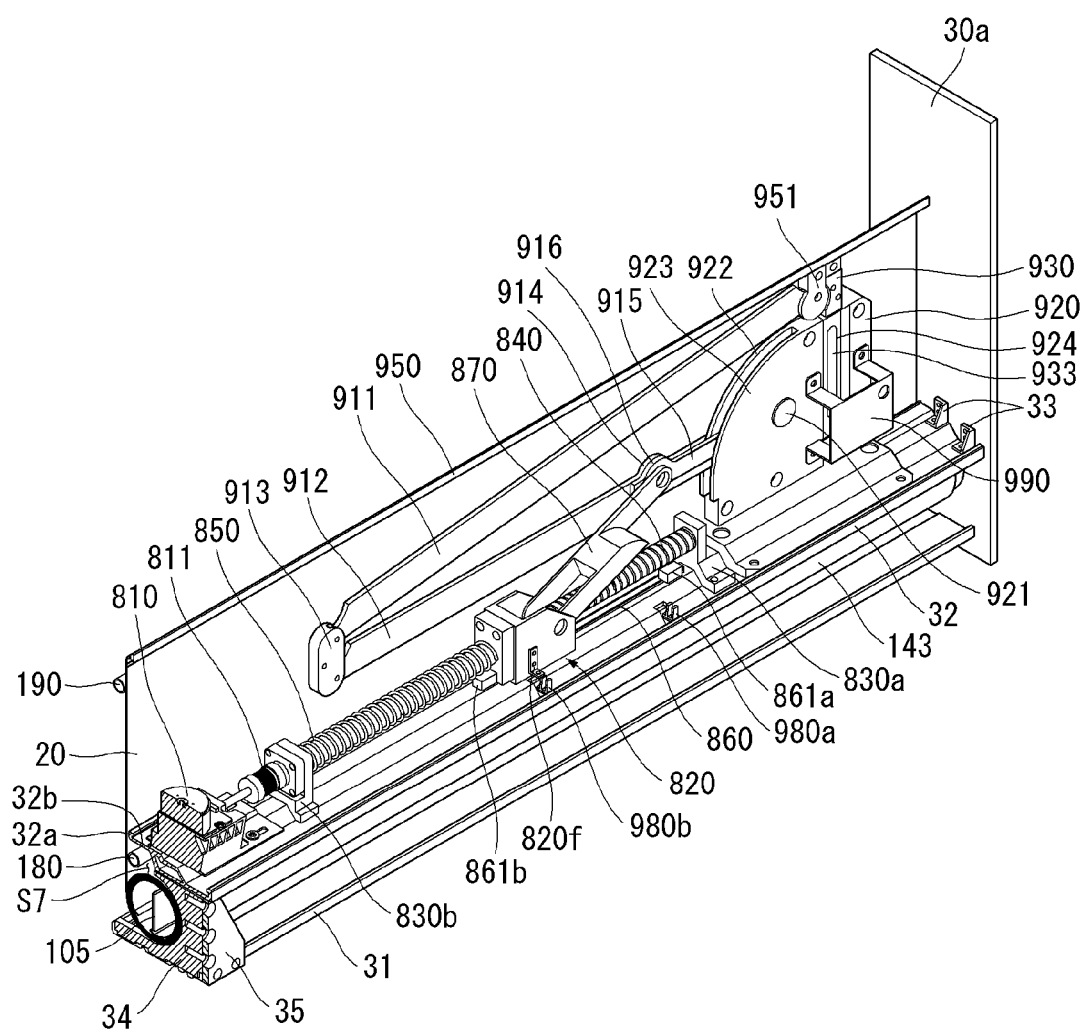

Referring to FIG. 59, the second auxiliary roller 190 may be positioned in front of the display unit 20. The first auxiliary roller 180 may be positioned between the second base 32 and the roller 143. The first auxiliary roller 180 may be positioned in the rear of the display unit 20. A space S7 may be formed below the first part 32b of the second base 32. The first auxiliary roller 180 may be positioned in the space S7.

Figure 60:
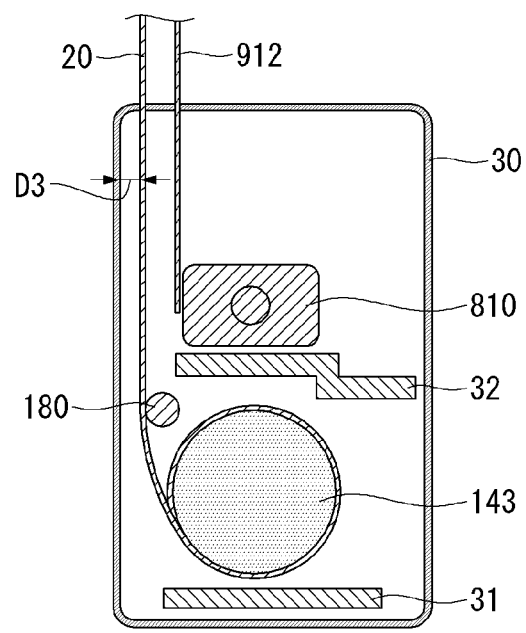
FIGS. 60 to 70 illustrate a display device according to another embodiment of the disclosure.

Referring to FIG. 60, the display unit 20 may be wound or unwound from the roller 143 while being spaced from the front surface of the housing 30 by a distance D3.

Figure 61:
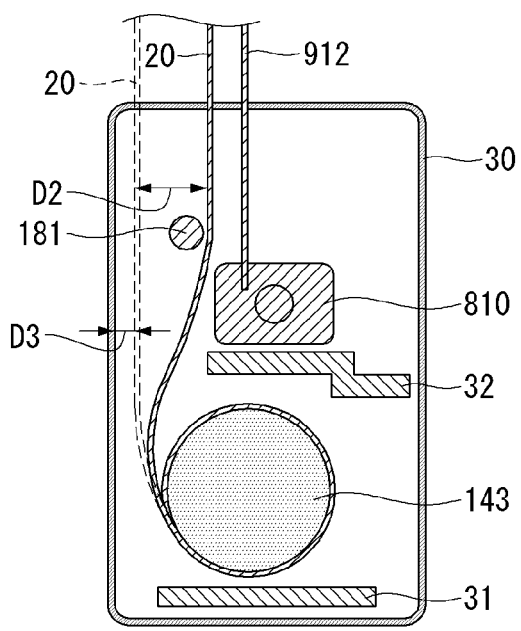

Referring to FIG. 61, an auxiliary roller 181 may be positioned in front of the display unit 20. The auxiliary roller 181 may be referred to as a roller. The auxiliary roller 181 can adjust a distance between the front surface of the housing 30 and the display unit 20. The display unit 20 can move backward by the distance D2 due to the auxiliary roller 181. The distance between the front surface of the housing 30 and the display unit 20 may equal a sum of the distances D2 and D3.

Figure 62:
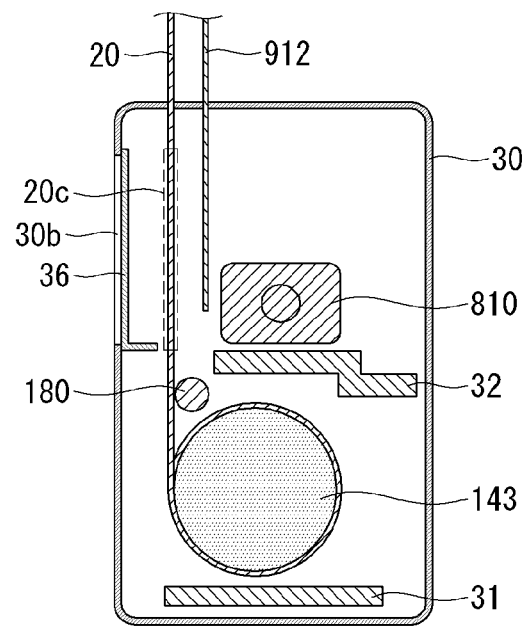

Referring to FIG. 62, a hole 30b may be formed in the front surface of the housing 30. The hole 30b may be covered with a light transmitting material. The light transmitting material may be glass or resin. A cover 36 may cover the hole 30b. The cover 36 may be referred to as a shutter. A display area 20c may correspond to the hole 30b or the cover 36. The display area 20c may face the cover 36. When the cover 36 covers the hole 30b, the display area 20c may not display an image.

Figure 63:
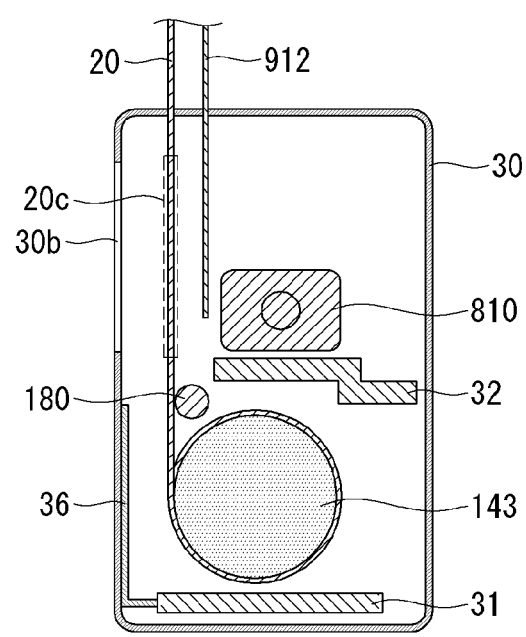

Referring to FIG. 63, the cover 36 may move downward. The display area 20c may be exposed to the outside through the hole 30b. The display area 20c can display an image.

Figure 64:
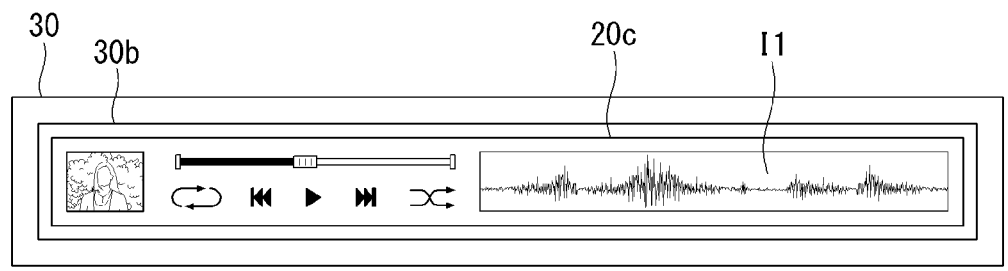

Referring to FIG. 64, when the display unit 20 is fully wound on the roller 143, the top case 950 may not be exposed to the outside of the housing 30. The display area 20c can display an image I1. A user can see the image I1 through the hole 30b. A remaining portion excluding the display area 20c from the display unit 20 may not display an image.

Figure 65:
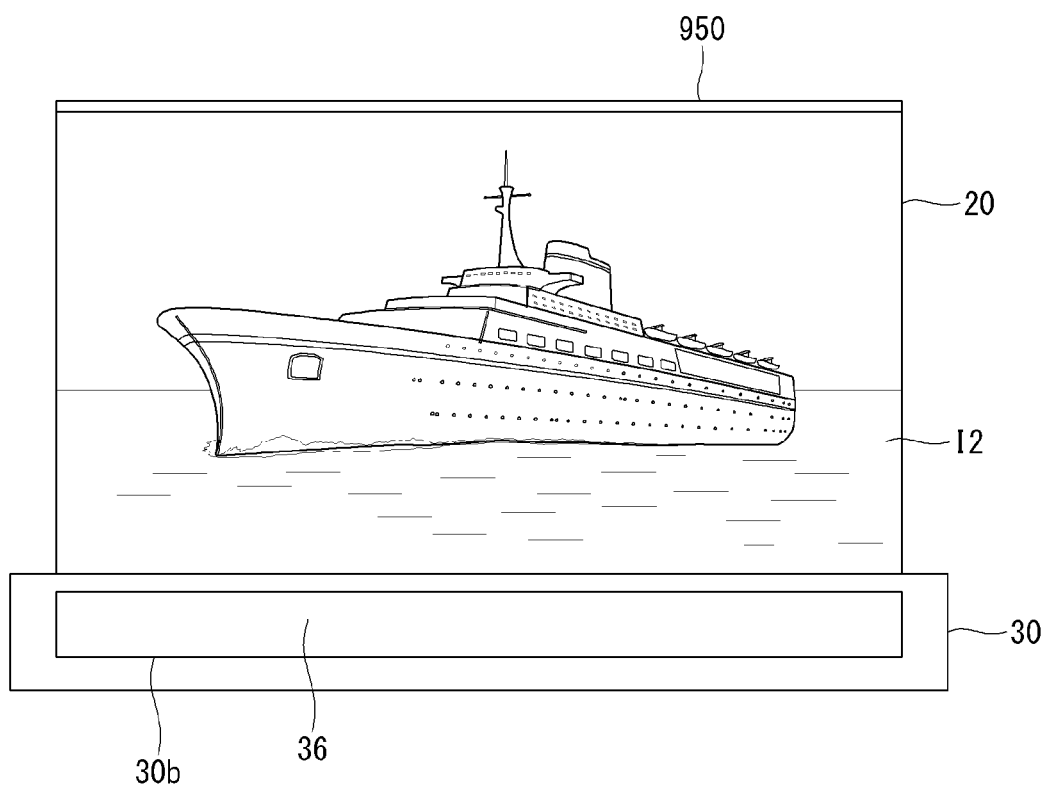

Referring to FIG. 65, the display unit 20 may be deployed outside the housing 30. The display unit 20 can display a first image 12. The cover 36 can cover the hole 30b.

Figure 66:
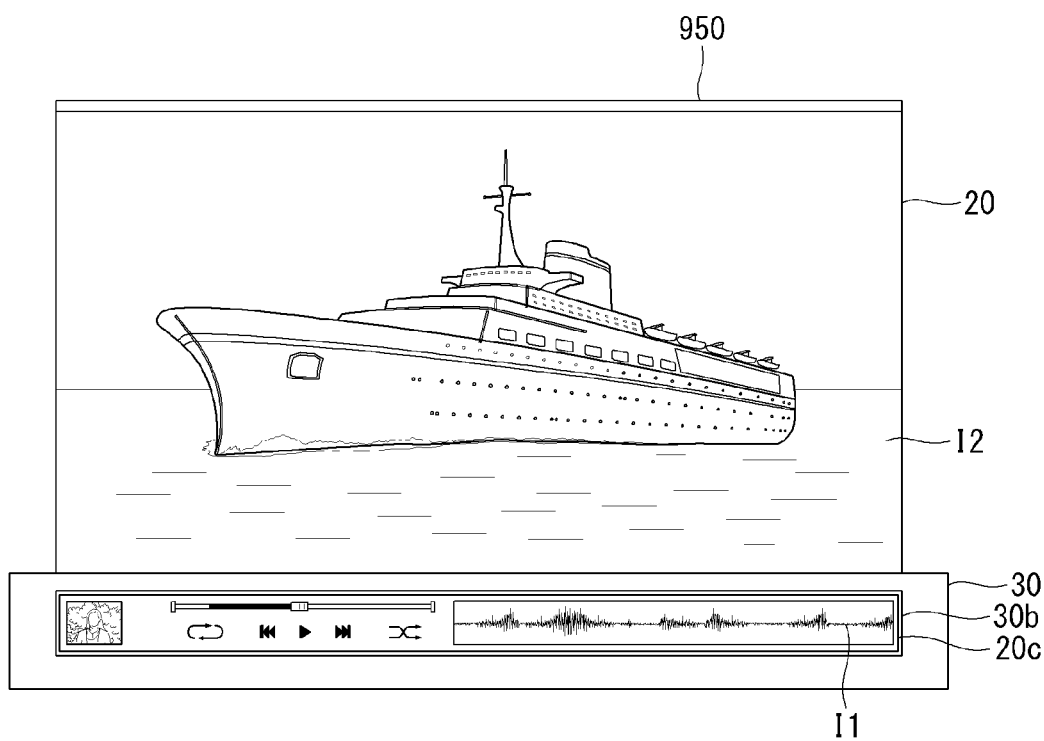

Referring to FIG. 66, the display area 20c may be exposed to the outside through the hole 30b. The display area 20c can display a second image I1. The first image 12 and the second image I1 may be independent images that are not related.

Figure 67:
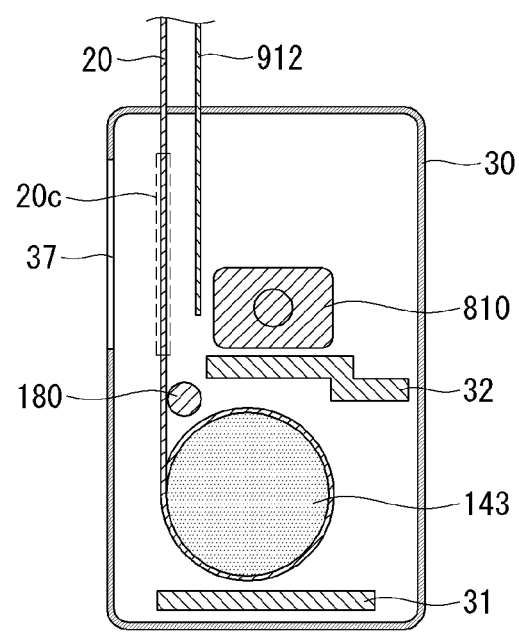

Referring to FIG. 67, a window 37 may be formed on the front surface of the housing 30. The window 37 may include a light transmitting material. The light transmitting material may be glass or resin. The display area 20c may face the window 37.

The window 37 may include a material capable of adjusting a light transmittance. Thus, when the display area 20c displays an image, the light transmittance of the window 37 can increase. When the display area 20c does not display an image, the light transmittance of the window 37 can be reduced.

Figure 68:
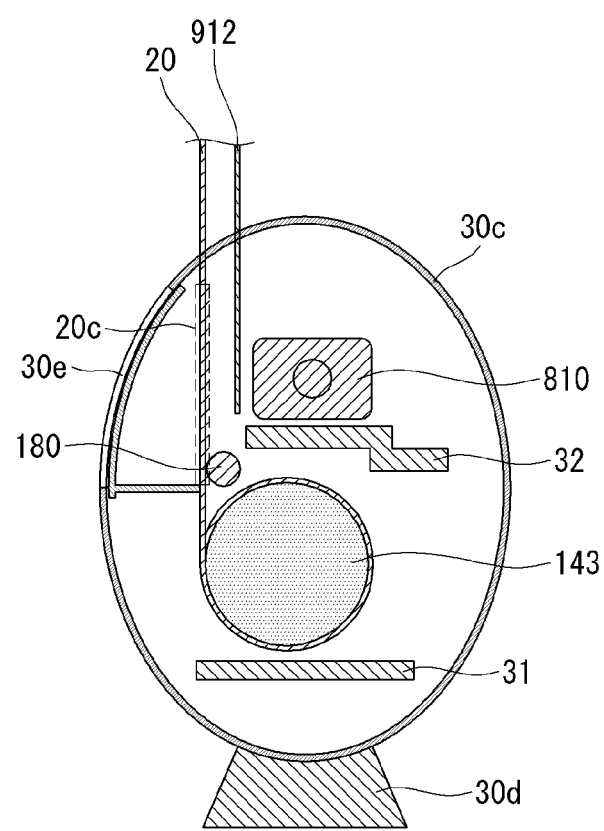

Referring to FIG. 68, the housing 30c may have a cylindrical shape. The housing 30c may have a circular cross section or an oval cross section. A hole 30e may be formed in front of the display unit 20. The hole 30e may be covered with a light transmitting material. The light transmitting material may be glass or resin. A cover 36a can cover the hole 30e. The cover 36a may have a curved surface corresponding to the curved surface of the housing 30c. The display area 20c may face the cover 36a. When the cover 36a covers the hole 30e, the display area 20c may not display an image. A stand 30d may be coupled to the lower side of the housing 30c. The stand 30d can support the housing 30c.

Figure 69:
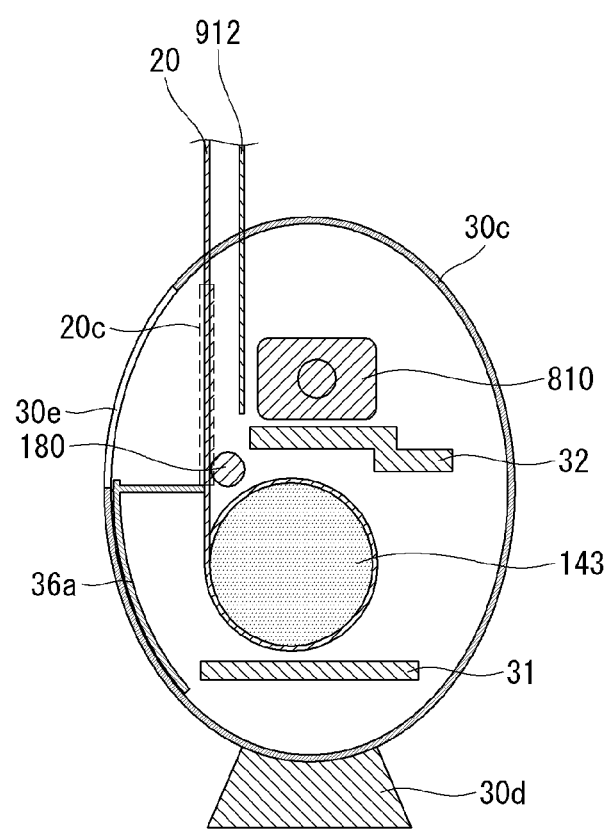

Referring to FIG. 69, the cover 36a may move downward. The display area 20c may be exposed to the outside through the hole 30e. The display area 20c can display an image.

Figure 70:
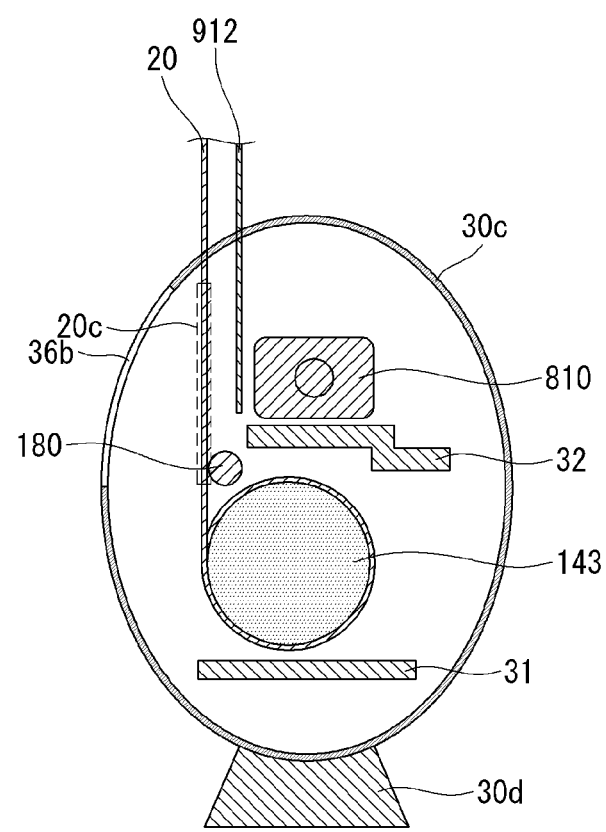

Referring to FIG. 70, a window 36b may be formed in front of the display unit 20. The window 36b may include a light transmitting material. The light transmitting material may be glass or resin. The display area 20c may face the window 36b.

The window 36b may include a material capable of adjusting a light transmittance. Thus, when the display area 20c displays an image, the light transmittance of the window 36b can increase. When the display area 20c does not display an image, the light transmittance of the window 36b can be reduced.

The foregoing embodiments are merely examples and are not to be considered as limiting the present disclosure. The present teachings can be readily applied to other types of methods and apparatuses. The features, structures, methods, and other characteristics of the embodiments described herein may be combined in various ways to obtain additional and/or alternative embodiments.

Certain embodiments or other embodiments of the disclosure described above are not mutually exclusive or distinct from each other. Any or all elements of embodiments of the disclosure described above may be combined or combined with each other in configuration or function.

For example, a configuration "A" described in one embodiment of the disclosure and the drawings and a configuration "B" described in another embodiment of the disclosure and the drawings may be combined with each other. Namely, although the combination between the configurations is not directly described, the combination is possible except in the case where it is described that the combination is impossible.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:
1. A display device comprising:
 a housing;
 a roller installed inside the housing;
 a plate including a first plate region wound or unwound from the roller and a second plate region extended from the first plate region and having an angled portion that is angled rearward, wherein the first plate region and the second plate region form a continuous piece;
 wherein the first plate region moves in a first direction by the roller, and
 wherein the second plate region is positioned opposite the roller, and is not wound or unwound from the roller; and
 a display panel disposed at the first plate region.
2. The display device of claim 1, wherein the plate further comprises a third plate region extending upward from the second plate region.

3. The display device of claim 2, wherein a first end of the second plate region is connected to the first plate region, and a second end of the second plate region is connected to the third plate region.

4. The display device of claim 1, wherein a first end of the plate is connected to the roller, and a second end of the plate is angled rearward.

5. The display device of claim 1, further comprising a first bar wherein the second plate region is secured on the first bar, and
wherein the first bar is formed to correspond to a shape of the second plate region.

6. The display device of claim 5, further comprising a second bar, wherein the second plate region is secured between the first bar and the second bar, and
wherein the first bar and the second bar are formed to correspond to the shape of the second plate region.

7. The display device of claim 2, further comprising a first bar, wherein the second plate region and the third plate region is secured on the first bar, and
wherein the first bar is formed to correspond to a shape of the second plate region and the third plate region.

8. The display device of claim 7, further comprising a second bar, wherein the second plate region and the third plate region are secured between the first bar and the second bar, and
wherein the first bar and the second bar are formed to correspond to the shape of the second plate region and the third plate region.

9. The display device of claim 5, wherein the first bar further comprises:
a horizontal portion positioned adjacent to the second plate region; and
a vertical portion extending downward from the horizontal portion and configured to support the first plate region.

10. The display device of claim 6, wherein the first bar further comprises:
a horizontal portion positioned adjacent to the second plate region; and
a vertical portion extending downward from the horizontal portion and configured to support the first plate region, and
wherein the second bar further comprises:
a first part disposed opposite to the horizontal portion of the first bar; and
a rear wall extending downward from the first part and configured to cover the second plate region and the horizontal portion of the first bar.

11. The display device of claim 10, wherein the second bar further comprises a first front wall extending downward from a front end of the first part and configured to cover the first plate region.

12. The display device of claim 11, wherein the second bar further comprises a second front wall extending downward from the first front wall,
wherein a thickness of the first front wall is greater than a thickness of the second front wall,
wherein the second front wall faces the display panel.

13. The display device of claim 9, wherein a screw penetrates the horizontal portion and the second plate region and is fastened to the second plate region.

14. The display device of claim 6, wherein the second bar further comprises:
a curved surface; and
a rear extension part extending from a rear end of the curved surface,
wherein the second plate region extends along the curved surface and the rear extension part.

15. The display device of claim 14, wherein the display panel is extended along the curved surface and the rear extension part.

16. The display device of claim 15 wherein the second bar further comprises:
a rear horizontal part extending forward from a lower end of the rear extension part; and
a rear vertical part extending downward from a front end of the rear horizontal part,
wherein the rear vertical part faces the first plate region,
wherein the second plate region extends along the rear horizontal part and the rear vertical part,
wherein the first bar is fastened to the rear vertical part,
wherein the second plate region is secured between the rear vertical part and the first bar.

17. The display device of claim 16, wherein a screw penetrates the second plate region and the first bar and is fastened to the rear vertical part.

18. The display device of claim 17, wherein the first bar comprises:
an upper portion fastened to the rear vertical part of the second bar; and
a lower portion extended downward from the upper portion and behind at a rear of the first plate region.

* * * * *